US012813111B2

(12) United States Patent
Kim et al.

(10) Patent No.: US 12,813,111 B2

(45) Date of Patent: Nov. 24, 2026

(54) DISPLAY DEVICE AND MANUFACTURING METHOD THEREOF

(71) Applicant: Samsung Display Co., Ltd., Yongin-Si (KR)

(72) Inventors: Hwi Kim, Yongin-si (KR); Hye Jin Gwark, Yongin-si (KR); Jae Ik Kim, Yongin-si (KR); Jung Sun Park, Yongin-si (KR); Seung Yong Song, Yongin-si (KR); Duck Jung Lee, Yongin-si (KR); Yeon Hwa Lee, Yongin-si (KR); Joon Gu Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 297 days.

(21) Appl. No.: 18/778,547

(22) Filed: Jul. 19, 2024

(65) Prior Publication Data

US 2025/0040374 A1 Jan. 30, 2025

(30) Foreign Application Priority Data

Jul. 24, 2023 (KR) ........................ 10-2023-0096367

(51) Int. Cl.

| | |
|---|---|
| ***H10K 59/131*** | (2023.01) |
| ***H10K 59/12*** | (2023.01) |
| ***H10K 59/88*** | (2023.01) |

(52) U.S. Cl.

CPC ....... *H10K 59/131* (2023.02); *H10K 59/1201* (2023.02); *H10K 59/88* (2023.02)

(58) Field of Classification Search

CPC ... H10K 59/131; H10K 59/1201; H10K 59/88

See application file for complete search history.

(56) References Cited

U.S. PATENT DOCUMENTS

| | | | | |
|---|---|---|---|---|
| 7,427,783 | B2 | 9/2008 | Lee et al. | |
| 9,947,733 | B2 | 4/2018 | Jang et al. | |
| 10,032,843 | B2 | 7/2018 | Lee et al. | |
| 11,563,074 | B2 | 1/2023 | Cho et al. | |
| 2019/0229160 | A1* | 7/2019 | Lee | H10K 59/88 |
| 2021/0376283 | A1 | 12/2021 | Shin et al. | |
| 2022/0399431 | A1* | 12/2022 | Kim | H10D 86/00 |

FOREIGN PATENT DOCUMENTS

| | | | |
|---|---|---|---|
| KR | 10-0590259 | B1 | 6/2006 |
| KR | 10-2016-0031406 | A | 3/2016 |
| KR | 10-2021-0086869 | A | 7/2021 |
| KR | 10-2021-0145907 | A | 12/2021 |
| KR | 10-2506532 | B1 | 3/2023 |

* cited by examiner

*Primary Examiner* — Richard A Booth

(74) *Attorney, Agent, or Firm* — Innovation Counsel LLP

(57) ABSTRACT

The display device includes a connection pattern and a dummy pattern spaced apart from each other on a substrate; a via layer on the substrate; a pixel electrode on the via layer and electrically connected to the connection pattern; a light emitting layer on the pixel electrode; a control layer on the light emitting layer; and a common electrode on the control layer. The dummy pattern may include a first dummy pattern and a second dummy pattern disposed on the first dummy pattern. The first dummy pattern may include a first layer, a second layer, and a third layer each of which is made of a conductive material and is sequentially stacked. The second dummy pattern may include an organic pattern including a first portion and a second portion having different areas in a plan view.

20 Claims, 31 Drawing Sheets

DISPLAY DEVICE AND MANUFACTURING METHOD THEREOF

CROSS-REFERENCE TO RELATED APPLICATION

This application claims priority to and the benefit of Korean Patent Application No. 10-2023-0096367 filed in the Korean Intellectual Property Office on Jul. 24, 2023, the entire contents of which are incorporated herein by reference.

BACKGROUND

1. Field

The present inventive concept relates a display device and a manufacturing method thereof.

2. Description of the Related Art

Recently, as interest in information display is increasing, research and development on display devices are continuously made.

SUMMARY

The present inventive concept can provide a display device with improved reliability and a manufacturing method thereof.

A display device according to an embodiment includes a connection pattern and a dummy pattern spaced apart from each other on a substrate; a via layer disposed on the substrate and including a contact portion exposing the connection pattern and a via hole exposing the dummy pattern; a pixel electrode disposed on the via layer and electrically connected to the connection pattern through the contact portion; a light emitting layer disposed on the pixel electrode; a control layer disposed on the light emitting layer; and a common electrode disposed on the control layer. The dummy pattern may include a first dummy pattern and a second dummy pattern disposed on the first dummy pattern. The first dummy pattern may include a first layer, a second layer, and a third layer each of which is made of a conductive material and is sequentially stacked. The second dummy pattern may include an organic pattern including a first portion and a second portion having different areas in a plan view.

In an embodiment, the second dummy pattern may include a negative photosensitive material. The control layer may be disconnected on the first portion.

In an embodiment, the first portion is disposed on the first dummy pattern and the second portion is disposed on the first portion. The first portion may have a smaller area than that of the second portion. The second portion may have a reverse tapered shape in which a width becomes narrower from an upper surface toward a lower surface.

In an embodiment, an inclination angle of a side surface connected to the lower surface in the second portion may be from 90° to 130°. A side surface of the first portion may be disposed inside than a side surface of the second portion in a plan view.

In an embodiment, the first portion may have an undercut portion which is recessed from the side surface of the second portion.

In an embodiment, the first layer and the third layer may include titanium (Ti) and the second layer may include aluminum (Al) having a greater thickness than the first and third layers.

In an embodiment, the control layer may be disposed on each of a upper surface of the second portion, the side surface of the second portion, a portion of an upper surface of the third layer, a portion of a side surface of the second layer, and a side surface of the first layer. The common electrode may be disposed on each of the control layer, the side surface of the first portion, the upper surface and side surface of the third layer, and the side surface of the second layer.

In an embodiment, the common electrode may be disconnected on the side surface of the first portion.

In an embodiment, the common electrode disposed on the second dummy pattern and the common electrode disposed on the first dummy pattern may be disconnected from each other.

In an embodiment, the common electrode disposed on the second dummy pattern and the common electrode disposed on the first dummy pattern may be connected to each other.

In an embodiment, the common electrode may fill an undercut portion surrounded by a lower surface of the second portion, the side surface of the first portion, and the upper surface of the third layer.

In an embodiment, the third layer may include an opening exposing a portion of the second layer. The common electrode may be disposed on the second layer exposed by the opening.

In an embodiment, the third layer may include a protrusion protruding in a direction toward the second dummy pattern.

In an embodiment, the display device may further include a conductive pattern disposed on the first dummy pattern and the second dummy pattern. The conductive pattern may include the same material as the pixel electrode.

In an embodiment, the second dummy pattern includes a plurality of second dummy patterns which may be disposed on the first dummy pattern.

In an embodiment, the connection pattern may include a first metal layer, a second metal layer disposed on the first metal layer, and a third metal layer disposed on the second metal layer. The first metal layer may include the same material as the first layer and may be disposed on the same layer as the first layer. The second metal layer may include the same material as the second layer and may be disposed on the same layer as the first layer. The third metal layer may include the same material as the third layer and may be disposed on the same layer as the first layer.

In an embodiment, the display device may further include at least one transistor disposed between the substrate and the connection pattern and electrically connected to the pixel electrode through the connection pattern.

In an embodiment, the first dummy pattern may be electrically connected to the common electrode to receive a low potential voltage.

In an embodiment, the display device may further include a pixel definition layer exposing one region of the pixel electrode and a third dummy pattern disposed on the pixel definition layer.

A manufacturing method of a display device according to an embodiment includes forming a connection pattern and a dummy pattern spaced apart from each other on a substrate; forming a via layer including a contact portion exposing the connection pattern and a via hole exposing the dummy pattern, the via layer being disposed on the connection pattern; forming a pixel electrode electrically connected to the connection pattern through the contact portion on the via layer; forming a light emitting layer on the pixel electrode; forming a control layer on the light emitting layer; and forming a common electrode on the control layer. The dummy pattern may include a first dummy pattern and a second dummy pattern disposed on the first dummy pattern. The first dummy pattern may include a first layer, a second layer, and a third layer each of which is made of a conductive material and is sequentially stacked. The second dummy pattern may include an organic pattern including a first portion and a second portion having different areas in a plan view.

According to the embodiment, a second dummy pattern (or organic pattern) having a reverse tapered structure may be formed on a first dummy pattern (or electrode layer) electrically connected to a common electrode (or cathode electrode), thereby reducing an area in which a control layer is deposited on both side surfaces of the first dummy pattern.

According to the embodiment, a display device having improved reliability and a manufacturing method thereof may be provided by further securing a contact area between a common electrode and a first dummy pattern to prevent a voltage drop of the common electrode.

Effects according to embodiments are not limited by contents exemplified above, and more various effects are included in the present specification.

DETAILED DESCRIPTION OF THE EMBODIMENTS

Figure 1:
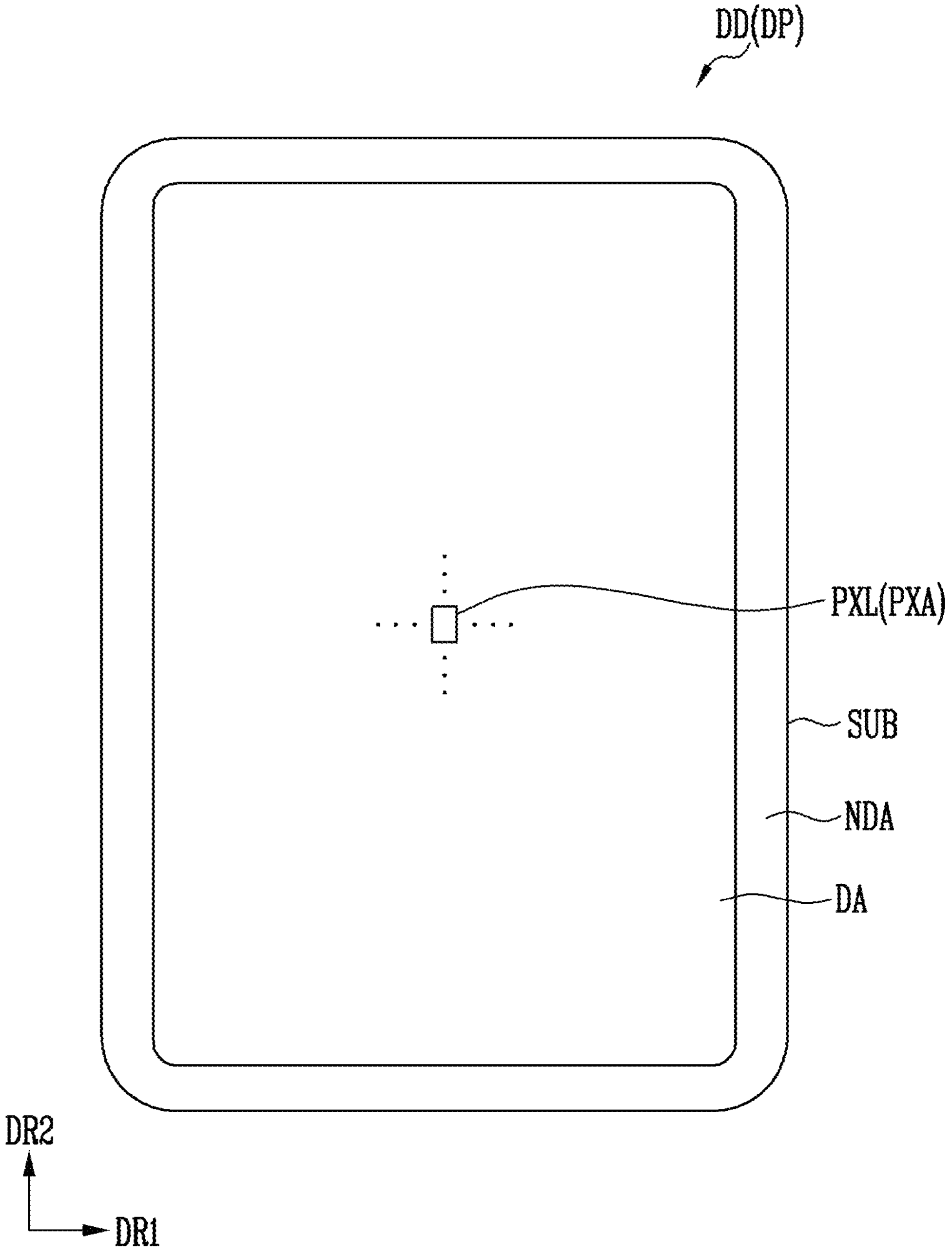
FIG. 1 is a schematic plan view illustrating a display device according to an embodiment.

It will be apparent to those skilled in the art that various modifications and variations can be made in the present disclosure without departing from the spirit or scope of the disclosure, and specific embodiments are exemplified in the drawings and explained in the detailed description. However, it should be understood that this is not intended to limit the present inventive concept to a specific disclosed form, and includes all modifications, equivalents, and substitutes included in the technical scope of the present inventive concept.

Like reference numerals designate like elements throughout the specification. In the accompanying drawings, dimensions of structures are exaggerated for clarity. The terms, 'first', 'second' and the like may be simply used for description of various constituent elements, but those meanings may not be limited to the restricted meanings. The above terms are used only for distinguishing one constituent element from other constituent elements. For example, a first constituent element may be referred to as a second constituent element and similarly, the second constituent element may be referred to as the first constituent element within the scope of the appended claims.

In the specification, the word "comprise" or "has" is used to specify existence of a feature, a numbers, a process, an operation, a constituent element, a part, or a combination thereof, and it will be understood that existence or additional possibility of one or more other features or numbers, processes, operations, constituent elements, parts, or combinations thereof are not excluded in advance. In addition, it will be understood that when an element such as a layer, film, area, or substrate is referred to as being "on" another element, it can be directly on the other element or intervening elements may also be present. In the specification, it will be understood that when an element such as a layer, film, region, or substrate is referred to as being disposed "on" another element, the disposed direction is not limited to an upper direction and include a side direction or a lower direction. In contrast, It will be understood that when an element such as a layer, film, area, or substrate is referred to as being "beneath" another element, it can be directly beneath the other element or intervening elements may also be present.

In the present application, in case that one component (for example, 'first component') is referred to as being "(operatively or communicatively) coupled with/to" or "connected to" another component (for example, 'second component'), it should be understood that the one component may be directly connected to another component, or may be connected through another component (for example, 'third component'). On the other hand, in case that one component (for example, 'first component') is referred to as being "directly coupled" or "directly connected" to another component (for example, 'second component'), it may be understood that no other component (for example, 'third component') exists between the one component and another component.

Hereinafter, with reference to accompanying drawings, a preferred embodiment of the present inventive concept and others required for those skilled in the art to understand the contents of the present inventive concept will be described in more detail. The terms of a singular form may include plural forms unless referred to the contrary.

Figure 2:
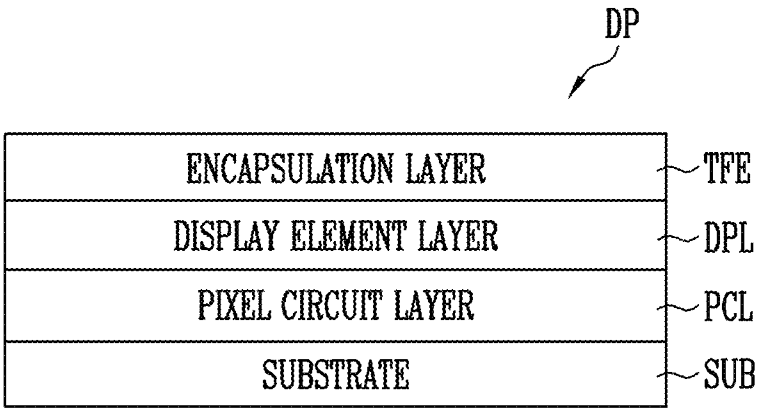
FIG. 2 is a schematic cross-sectional view illustrating the display panel of FIG. 1.

FIG. 1 is a schematic plan view illustrating a display device DD according to an embodiment, and FIG. 2 is a schematic cross-sectional view illustrating the display panel DP of FIG. 1.

In FIGS. 1 and 2, for convenience, a structure of a display device DD, for example, a display panel DP provided in the display device DD, is briefly shown focused on the display area DA displaying an image.

Referring to FIGS. 1 and 2, the display panel DP (or display device DD) according to an embodiment may be provided in various shapes. For example, the display panel DP may be provided in a shape of a rectangular plate having two pairs of parallel sides. However, the embodiments are not limited thereto. In case that the display panel DP is provided in the shape of the rectangular plate, one pair of sides of the two pairs of sides may be provided longer than the other pair of sides.

At least a portion of the display panel DP may have flexibility, may be folded at a portion with the flexibility, but is not limited thereto.

The display panel DP may display an image. The display panel DP may include a display panel capable of self-emission such as an organic light emitting display panel (OLED panel) using an organic light emitting diode as a light-emitting element, an ultra-small light emitting diode display panel (micro-LED or nano LED display panel) using an ultra-small light emitting diode as a light emitting element, and a quantum dot organic light emitting display panel (QD OLED panel) using a quantum dot and an organic light emitting diode. In addition, the display panel DP may include non-light emitting display panel such as a liquid crystal display panel (LCD panel), an electro-phoretic display panel (EPD panel), and an electro-wetting display panel (EWD panel). In case that a non-light emitting display panel is used as the display panel DP, the display device DD may include a backlight unit that supplies light to the display panel DP. In an embodiment, the display panel DP may be an organic light emitting display panel.

The display panel DP may include a substrate SUB and pixels PXL provided on the substrate SUB.

The substrate SUB may include a transparent insulating material and transmit light but is not limited thereto. The substrate SUB may be a rigid substrate or a flexible substrate.

The rigid substrate may be, for example, one of a glass substrate, a quartz substrate, a glass ceramic substrate, and a crystalline glass substrate.

The flexible substrate may be one of a film substrate including a polymeric organic material and a plastic substrate. For example, the flexible substrate may include at least one selected from the group consisting of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

One area on the substrate SUB may be a display area DA so that the pixels PXL may be disposed thereon, and the remaining area on the substrate SUB may be a non-display area NDA. For example, the substrate SUB may include a display area DA including pixel areas PXA in which each pixel PXL is disposed, and a non-display area NDA disposed around the display area DA (or adjacent to the display area DA).

The non-display area NDA may be disposed adjacent to the display area DA. The non-display area NDA may be provided on at least one side of the display area DA. For example, the non-display area NDA may surround a periphery (or edge) of the display area DA. A wiring unit electrically connected to each pixel PXL and a driving unit electrically connected to the wiring unit and for driving the pixel PXL may be provided in the non-display area NDA.

Each of the pixels PXL may be provided in the display area DA of the substrate SUB. The pixels PXL may include a light emitting element emitting white light and/or color light and a pixel circuit for driving the light emitting element. The pixel circuit may include at least one transistor electrically connected to the light emitting element. Each pixel PXL may emit light of one color among red, green, and blue, but is not limited thereto. Each pixel PXL may emit light of one color among cyan, magenta, yellow, and white.

The pixels PXL may be provided in plurality and arranged in a matrix form along pixel rows extending in a first direction DR1 and pixel columns extending in a second direction DR2 crossing the first direction DR1. An arrangement of the pixels PXL is not particularly limited, and the pixels PXL may be arranged in various forms. According to embodiments, a plurality of pixels PXL may have different areas (or sizes). For example, in the case of pixels PXL having different colors of emitted light, the pixels PXL may have different areas (or sizes) or in different shapes from each color.

The driver may control driving of the pixel PXL by providing a predetermined signal and a predetermined voltage to each pixel PXL through the wiring unit.

The display panel DP (or each of the pixels PXL) may include a pixel circuit layer PCL, a display element layer DPL, and an encapsulation layer TFE disposed on the substrate SUB.

The pixel circuit layer PCL may be provided on the substrate SUB and may include a transistor and signal lines connected to the transistor. For example, the transistor may have an active pattern (or semiconductor pattern), a gate electrode, a source electrode, and a drain electrode which are sequentially stacked on the substrate SUB with an insulating layer interposed therebetween. The semiconductor pattern may include amorphous silicon, poly silicon, low temperature poly silicon, an organic semiconductor, and/or an oxide semiconductor. The gate electrode, the source electrode, and the drain electrode may include one of aluminum (Al), copper (Cu), titanium (Ti), and molybdenum (Mo), but are not limited thereto. Also, the pixel circuit layer PCL may include at least one insulating layer.

The display element layer DPL may be disposed on the pixel circuit layer PCL. The display element layer DPL may include a light-emitting element that emits light. The light emitting element may be, for example, an organic light emitting diode, but is not limited thereto. According to embodiments, the light emitting element may be an inorganic light emitting element including an inorganic light emitting material or a light emitting element that emits light by changing a wavelength of emitted light using quantum dots.

An encapsulation layer TFE may be disposed on the display element layer DPL. The encapsulation layer TFE may include an encapsulation substrate or a encapsulation film of a multiple layer. In case that the encapsulation layer TFE is in the form of the encapsulation film, it may include an inorganic layer and/or an organic layer. For example, the encapsulation layer TFE may include an inorganic layer, an organic layer, and an inorganic layer which are sequentially stacked on the display element layer DPL. The encapsulation layer TFE may prevent a penetration of external air and moisture into the display element layer DPL and the pixel circuit layer PCL.

Figure 3:
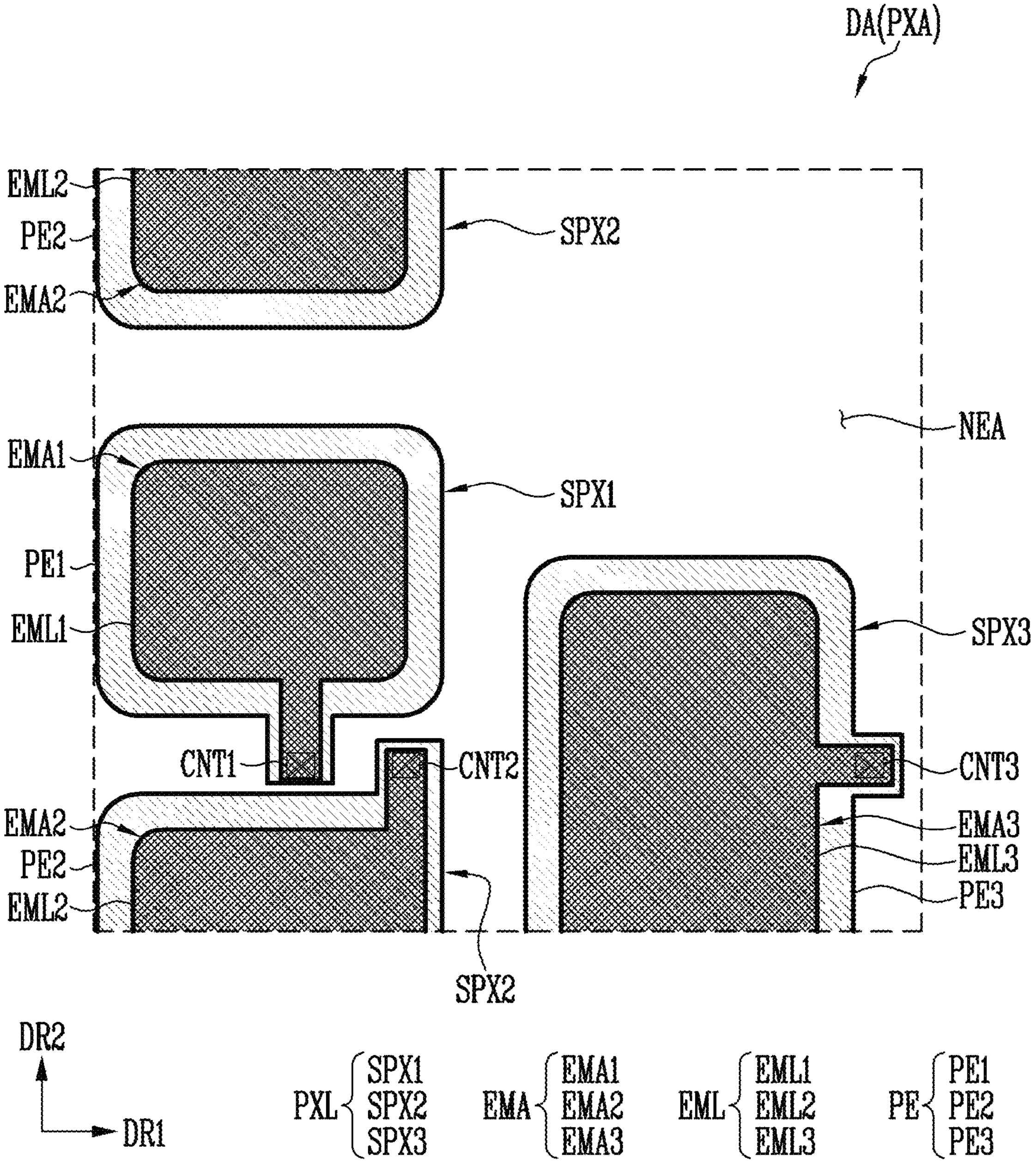
FIG. 3 is a schematic plan view illustrating an example of a display area of the display panel of FIG. 1.

FIG. 3 is a schematic plan view illustrating an example of a display area DA of the display panel of FIG. 1.

Referring to FIGS. 1 to 3, a pixel PXL may be disposed in the display area DA. The pixel PXL may be disposed in the pixel area PXA provided in the display area DA. The pixel area PXA may include a emission area EMA and a non-emission area NEA.

The pixel PXL may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the light of the first color may be light of a red wavelength band, the light of the second color may be light of a green wavelength band, and the light of the third color may be light of a blue wavelength band. However, it is not limited to the above example.

The first sub-pixel SPX1 may include a first emission area EMA1 and a non-emission area NEA disposed adjacent to (or surrounding at least one side of) the first emission area EMA1. The second sub-pixel SPX2 may include a second emission area EMA2 and a non-emission area NEA disposed adjacent to (or surrounding at least one side of) the second emission area EMA2. The third sub-pixel SPX3 may include a third emission area EMA3 and a non-emission area NEA disposed adjacent to (or surrounding at least one side of) the third emission area EMA3. The first emission area EMA1, the second emission area EMA2, and the third emission area EMA3 may constitute the emission area EMA of the pixel PXL.

Each of the first, second, and third sub-pixels SPX1, SPX2, and SPX3 may include a light emitting element (refer to "LD" in FIG. 4) emitting light and circuit elements for driving the light emitting element LD. The first emission area EMA1 may be an area where light is emitted from the light emitting element LD driven by the circuit elements of the first sub-pixel SPX1. The second emission area EMA2 may be an area where light is emitted from the light emitting element LD driven by the circuit elements of the second sub-pixel SPX2. The third emission area EMA3 may be an area where light is emitted from the light emitting element LD driven by the circuit elements of the third sub-pixel SPX3.

The light emitting element LD disposed in the first sub-pixel SPX1 may include a first pixel electrode PE1, a first light emitting layer EML1 disposed on the first pixel electrode PE1, and a common electrode (refer to "CE" in FIG. 9) disposed on the first light emitting layer EML1. The light emitting element LD disposed in the second sub-pixel SPX2 may include a second pixel electrode PE2, a second light emitting layer EML2 disposed on the second pixel electrode PE2, and the common electrode CE disposed on the second light emitting layer EML2. The light emitting element LD disposed in the third sub-pixel SPX3 may include a third pixel electrode PE3, a third light emitting layer EML3 disposed on the third pixel electrode PE3, and the common electrode CE disposed on the third light emitting layer EML3. The first pixel electrode PE1, the second pixel electrode PE2, and the third pixel electrode PE3 may constitute the pixel electrode PE of the pixel PXL.

In an embodiment, the first pixel electrode PE1 may be electrically connected to a circuit element disposed on the pixel circuit layer PCL of the first sub-pixel SPX1 through a first contact portion CNT1, and the second pixel electrode PE2 may be electrically connected to a circuit element disposed on the pixel circuit layer PCL of the second sub-pixel SPX2 through a second contact portion CNT2, and the third pixel electrode PE3 may be electrically connected to a circuit element disposed on the pixel circuit layer PCL of the third sub-pixel SPX3 through a third contact portion CNT3.

Figure 4:
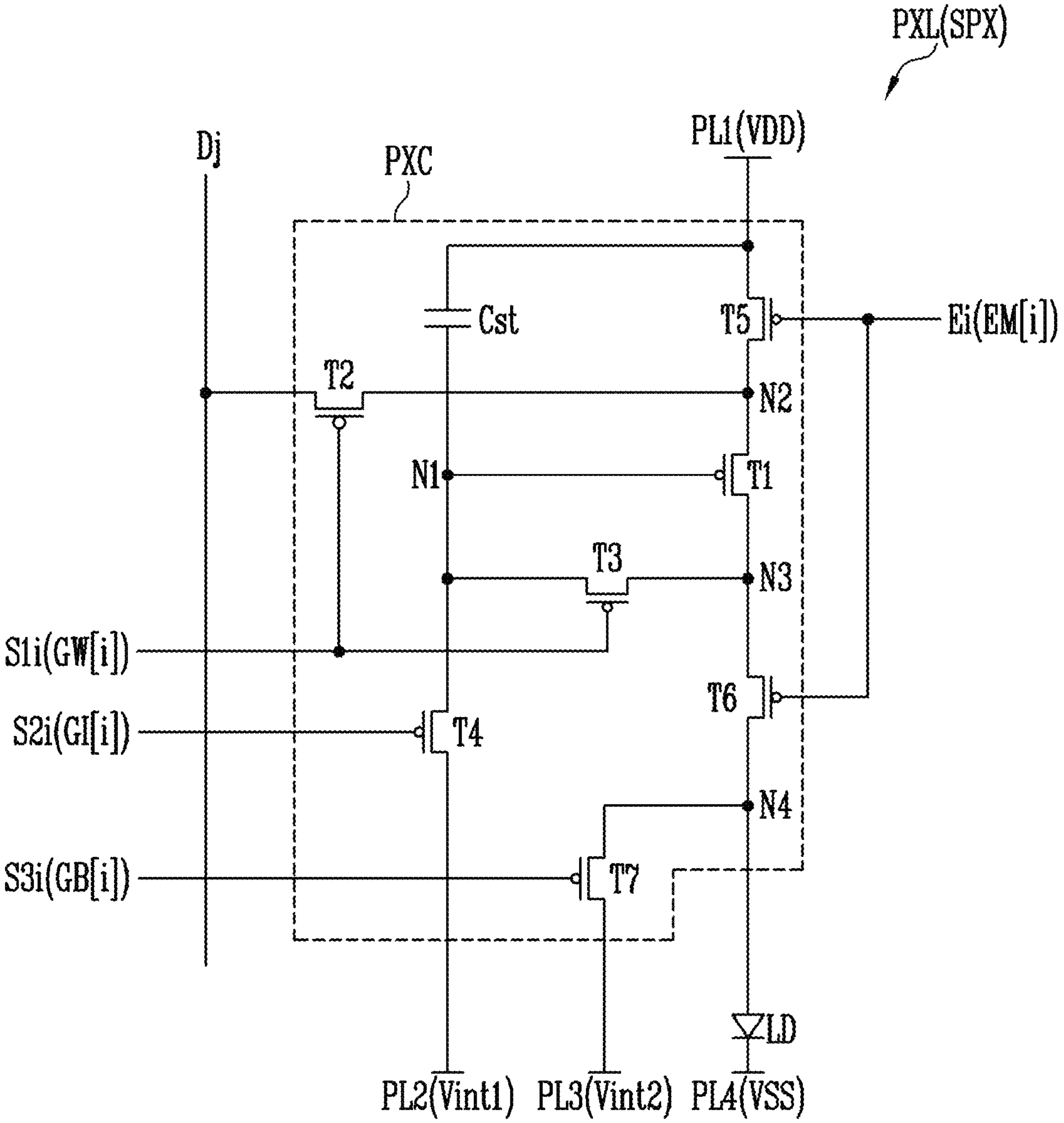
FIG. 4 is a schematic circuit diagram illustrating electrical connection relationships of constituent elements included in each of the pixels shown in FIG. 1.

FIG. 4 is a schematic circuit diagram illustrating an electrical connection relationship of constituent elements included in each of the pixels PXL shown in FIG. 1. In FIG. 4, for convenience of description, a pixel PXL (or sub-pixel SPX) disposed on an i-th horizontal line (or i-th pixel row) and connected to a j-th data line Dj is illustrated.

Referring to FIGS. 1 to 4, a pixel PXL (or sub-pixel SPX) may include a pixel circuit PXC and a light emitting element LD. The pixel circuit PXC may include first, second, third, fourth, fifth, sixth, and seventh transistors T1, T2, T3, T4, T5, T6, and T7 and a storage capacitor Cst.

A first electrode (or pixel electrode) of the light emitting element LD may be connected to a fourth node N4, and a second electrode (or common electrode) of the light emitting element LD may be connected to a fourth power line PL4. The light emitting element LD may generate light with a predetermined luminance in response to an amount of current (or driving current) supplied from the first transistor T1. In an embodiment, the light emitting element LD may be an organic light emitting diode including an organic light emitting layer. However, it is not limited thereto, and according to embodiments, the light emitting element LD may be an inorganic light emitting element made of an inorganic material or a light emitting element composed of a combination of an inorganic material and an organic material.

The first transistor T1 (or driving transistor) may be electrically connected between the first power line PL1 and the first electrode of the light emitting element LD. The first transistor T1 may include a gate electrode electrically connected to the first node N1. The first transistor T1 may control the amount of current (or driving current) flowing from the first power line PL1 to the fourth power line PL4 via the light emitting element LD based on the voltage of the first node N1. The first power voltage VDD may be provided from the first power line PL1, the second power voltage VSS may be provided from the fourth power line PL4, and the first power voltage VDD may be higher than the second power voltage VSS.

The second transistor T2 may be electrically connected between the j-th data line Dj and the second node N2. A gate electrode of the second transistor T2 may be connected to the 1*i*-th scan line S1*i* (or first scan line). The second transistor T2 may be turned on in response to the first scan signal GW[i] (e.g., low-level first scan signal) supplied from the 1*i*-th scan line S1*i* to electrically connect the j-th data line Dj and the second node N2. In case that the first transistor T1 is in a turn-on state, the second transistor T2 may transfer a data signal of the j-th data line Dj to the second node N2 in response to the first scan signal GW[i].

The third transistor T3 may be electrically connected between the first node N1 and the third node N3. A gate electrode of the third transistor T3 may be electrically connected to the 1*i*-th scan line S1*i*. The third transistor T3 may be turned on in response to the first scan signal GW[i] which is supplied from the 1*i*-th scan line S1*i*. In case that the third transistor T3 is turned on, the first transistor T1 may have a diode-connected form.

The fourth transistor T4 may be electrically connected between the first node N1 and the second power line PL2. A gate electrode of the fourth transistor T4 may be electrically connected to the 2*i*-th scan line S2*i* (or second scan line). A first initialization power voltage Vint1 may be applied from the second power line PL2. The fourth transistor T4 may be turned on in response to the second scan signal GI[i] supplied from the 2*i*-th scan line S2*i*. In case that the fourth transistor T4 is turned on, the first initialization power voltage Vint1 may be supplied to the first node N1 (i.e., gate electrode of the first transistor T1).

The fifth transistor T5 may be electrically connected between the first power line PL1 and the second node N2. A gate electrode of the fifth transistor T5 may be electrically connected to the i-th emission control line Ei (or emission control line). The sixth transistor T6 may be electrically connected between the third node N3 and the light emitting element LD (or fourth node N4). A gate electrode of the sixth transistor T6 may be electrically connected to the i-th emission control line Ei. The fifth transistor T5 and the sixth transistor T6 may be turned off in response to the i-th emission control signal EM[i] (e.g., high level emission control signal EM[i]) which is supplied from the i-th emission control line Ei and may be turned on in other cases.

The seventh transistor T7 may be electrically connected between the first electrode (i.e., fourth node N4) of the light emitting element LD and the third power line PL3. A gate electrode of the seventh transistor T7 may be electrically connected to the 3*i*-th scan line S3*i*. A second initialization power voltage Vint2 may be provided from the third power line PL3. According to embodiments, the second initialization power voltage Vint2 may be the same as or different from the first initialization power voltage Vint1. The seventh transistor T7 may be turned on in response to the third scan signal GB[i] supplied from the 3*i*-th scan line S3*i* to supply the second initialization power voltage Vint2 to the first electrode of the light emitting element LD.

The storage capacitor Cst may be connected or formed between the first power line PL1 and the first node N1.

According to an embodiment, the pixel circuit PXC may further include an additional capacitor connected or formed between the first power line PL1 and the fourth transistor T4 (or third transistor T3).

Figure 5:
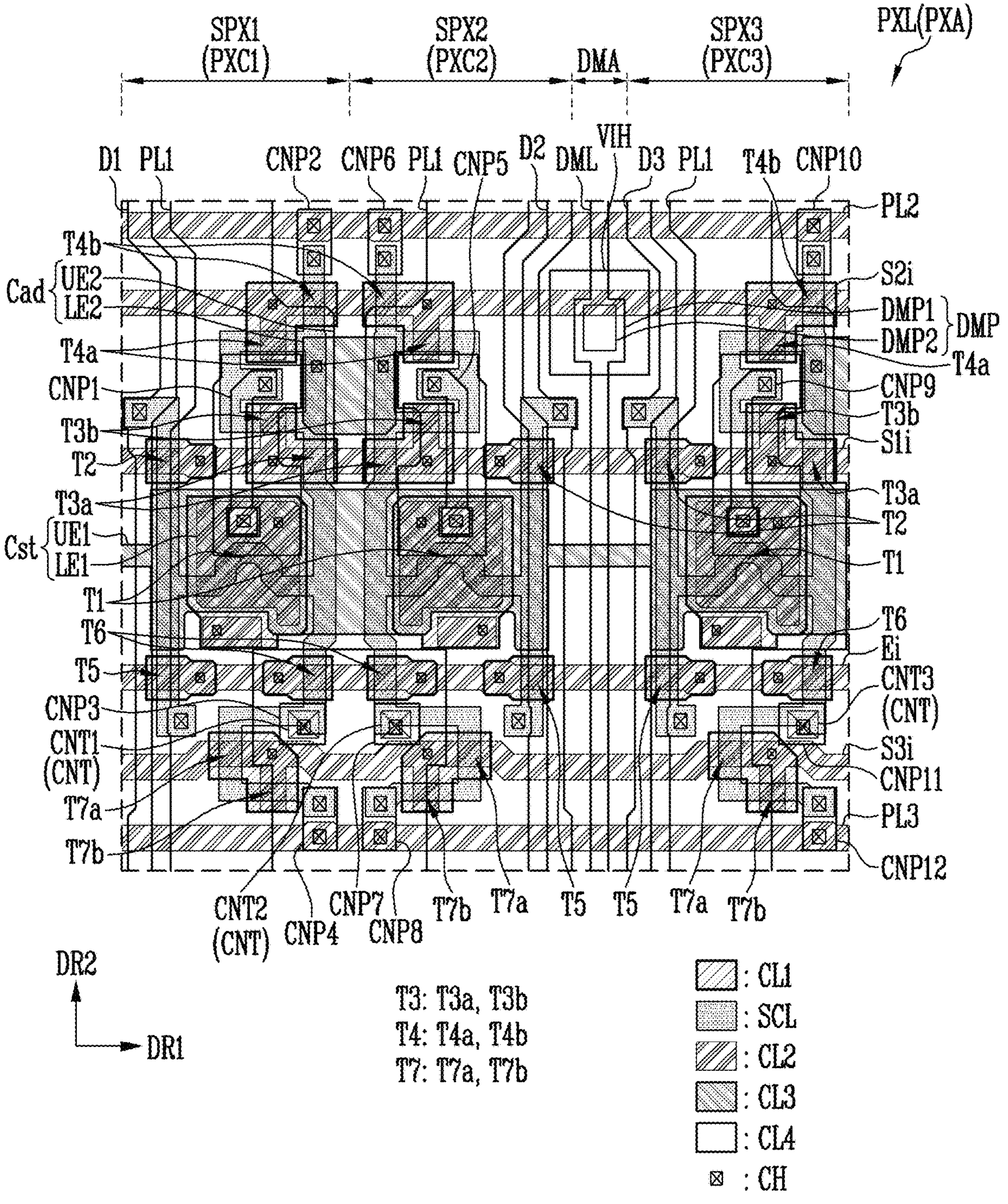
FIGS. 5 and 6 are schematic plan views illustrating a pixel according to an embodiment.
Figure 6:
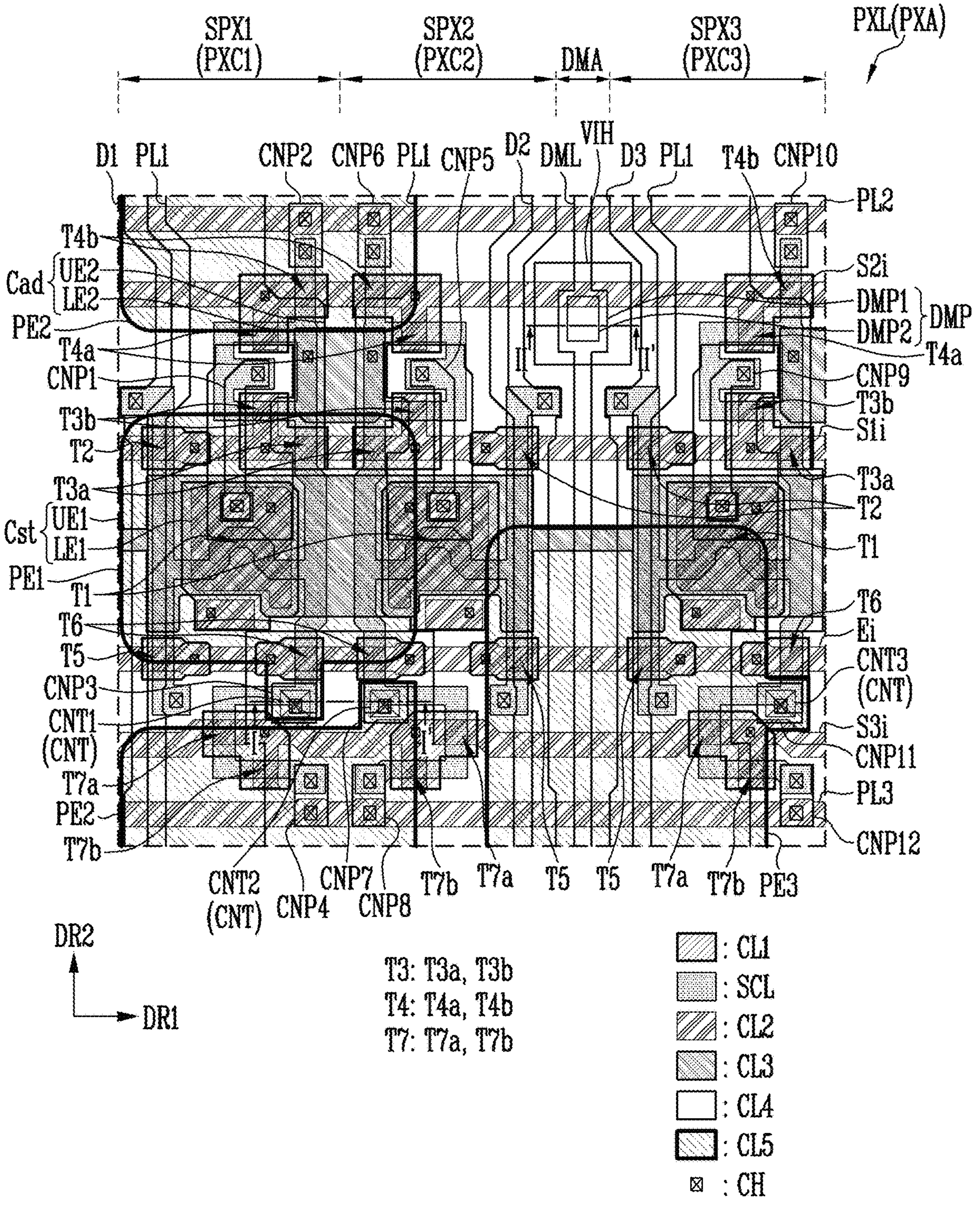
Figure 7:
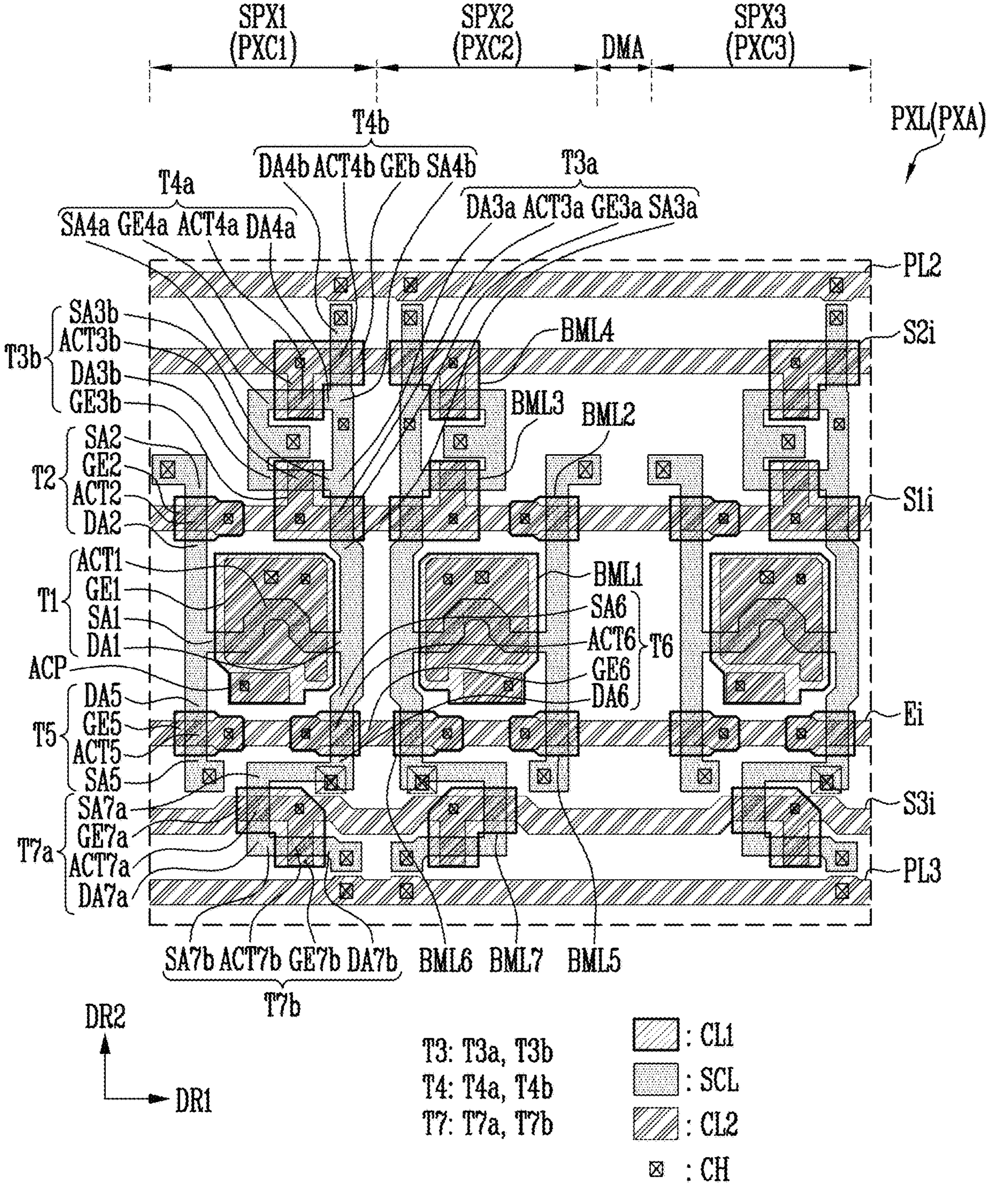
FIG. 7 is a schematic plan view illustrating only constituent elements included in transistors, a first conductive layer, and a second conductive layer in the pixel of FIG. 5.
Figure 8:
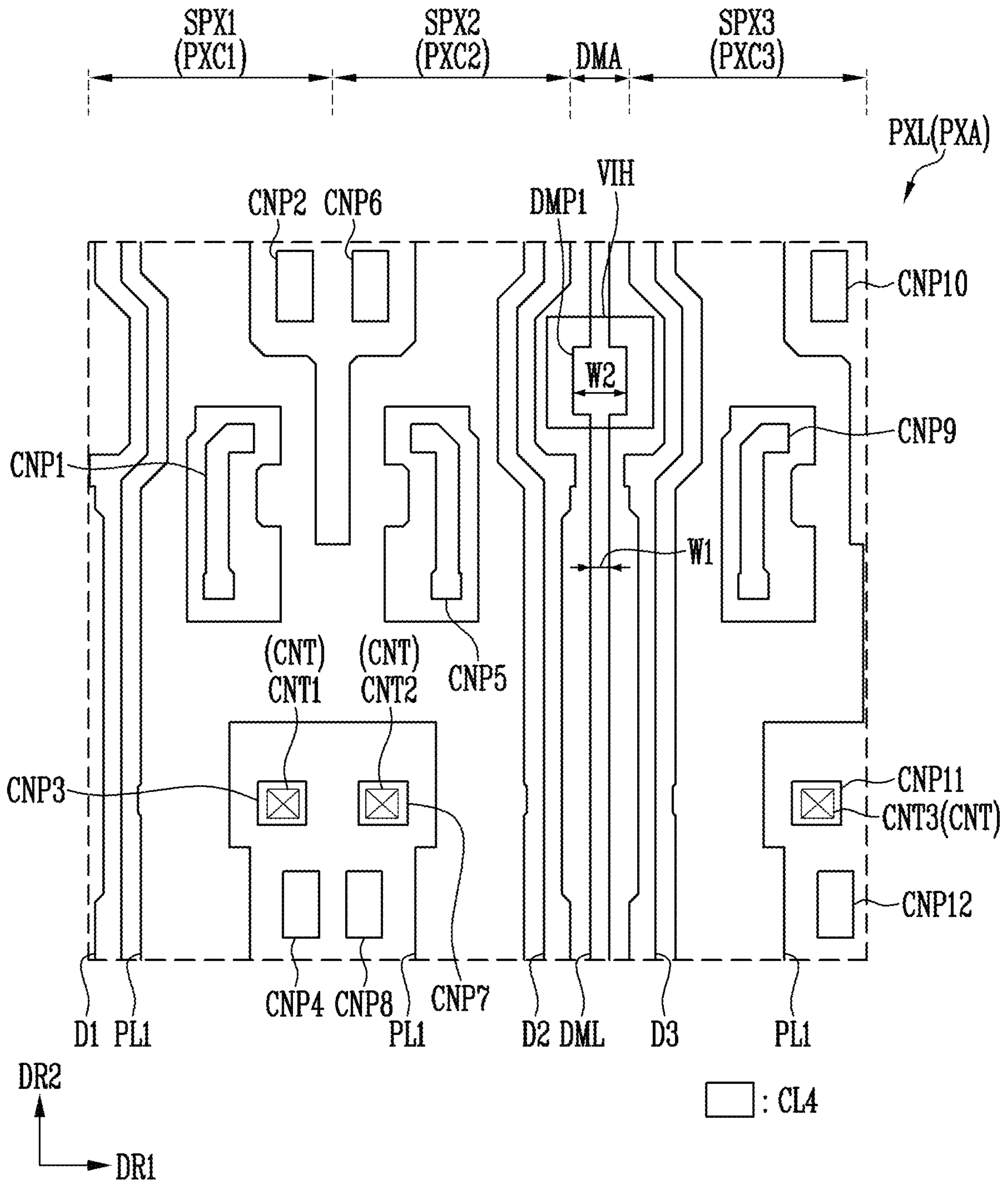
FIG. 8 is a schematic plan view illustrating only constituent elements included in a fourth conductive layer in the pixel of FIG. 5.

FIGS. 5 and 6 are schematic plan views illustrating a pixel PXL according to an embodiment, FIG. 7 is a schematic plan view illustrating only constituent elements included transistors T1 to T7, a first conductive layer CL1, and a second conductive layer CL2 in the pixel of FIG. 5, and FIG. 8 is a schematic plan view illustrating only constituent elements included in a fourth conductive layer CL4 in the pixel of FIG. 5. FIGS. 5 to 8, for convenience of description, illustrate the first sub-pixel SPX1 disposed on the i-th horizontal line (or i-th pixel row) and connected to the first data line D1, a second sub-pixel SPX2 disposed on the i-th horizontal line and connected to the second data line D2, and a third sub-pixel SPX3 disposed on the i-th horizontal line and connected to the third data line D3.

The pixel PXL shown in FIG. 6 further includes the first pixel electrode PE1 of the first sub-pixel SPX1, the second pixel electrode PE2 of the second sub-pixel SPX2, and the third pixel electrode PE3 of the third sub-pixel SPX3 compared the pixel PXL shown in FIG. 5.

In FIGS. 5 and 6, the light emitting element electrically connected to the transistors T1 to T7 is omitted for convenience of description.

Referring to FIGS. 1 to 8, the pixel PXL may be disposed in the pixel area PXA. The pixel PXL may include a first sub-pixel SPX1, a second sub-pixel SPX2, and a third sub-pixel SPX3.

The first sub-pixel SPX1 may include a first pixel circuit PXC1 and a light emitting element driven by the first pixel circuit PXC1 (refer to "LD" in FIG. 4). The second sub-pixel SPX2 may include a second pixel circuit PXC2 and a light emitting element LD driven by the second pixel circuit PXC2. The third sub-pixel SPX3 may include a third pixel circuit PXC3 and a light emitting element LD driven by the third pixel circuit PXC3.

Signal lines electrically connected to the first to third sub-pixels SPX1, SPX2, and SPX3 may be disposed in the pixel area PXA. For example, scan lines, an emission control line Ei, data lines D1, D2, and D3, and power lines PL1, PL2, and PL3 may be disposed in the pixel area PXA.

The scan lines may extend in the first direction DR1 and may include the first scan line S1*i*, the second scan line S2*i*, and the third scan line S3*i* that are spaced apart from each other.

The first, second, and third scan lines S1*i*, S2*i*, and S3*i* may include the second conductive layer CL2. The second conductive layer CL2 may be formed as a single layer or multiple layers that includes molybdenum (Mo), copper (Cu), aluminum (Al), chromium (Cr), gold (Au), silver (Ag), titanium (Ti), nickel (Ni), neodymium (Nd), indium (In), tin (Sn), and oxides or alloys thereof.

The first scan line S1*i* may be integrally formed with the second gate electrode GE2 of the second transistor T2 of each of the first, second, and third pixel circuits PXC1, PXC2, and PXC3. In this case, a portion of the first scan line S1*i* may be the second gate electrode GE2.

In addition, the first scan line S1*i* may be integrally formed with the 3*a*-th gate electrode GE3*a* of the 3*a*-th transistor T3*a* of each of the first, second and third pixel circuits PXC1, PXC2 and PXC3. In this case, another portion of the first scan line S1*i* may be the 3*a*-th gate electrode GE3*a*.

Additionally, the first scan line S1*i* may be integrally formed with the 3*b*-th gate electrode GE3*b* of the 3*b*-th transistor T3*b* of each of the first, second, and third pixel circuits PXC1, PXC2, and PXC3. In this case, another portion of the first scan line S1*i* may be the 3*b*-th gate electrode GE3*b*.

The second scan line S2*i* may be integrally formed with the 4*a*-th gate electrode GE4*a* of the 4*a*-th transistor T4*a* of each of the first, second, and third pixel circuits PXC1, PXC2, and PXC3. In this case, a portion of the second scan line S2*i* may be the 4*a*-th gate electrode GE4*a*.

In addition, the second scan line S2*i* may be integrally formed with the 4*b*-th gate electrode GE4*b* of the 4*b*-th transistor T4*b* of each of the first, second, and third pixel circuits PXC1, PXC2, and PXC3. In this case, another portion of the second scan line S2*i* may be the 4*b*-th gate electrode GE4*b*.

The third scan line S3*i* may be integrally formed with the 7*a*-th gate electrode GE7*a* of the 7*a*-th transistor T7*a* of each of the first, second, and third pixel circuits PXC1, PXC2, and PXC3. In this case, a portion of the third scan line S3*i* may be the 7*a*-th gate electrode GE7*a*.

In addition, the third scan line S3*i* may be integrally formed with the 7*b*-th gate electrode GE7*b* of the 7*b*-th transistor T7*b* of each of the first, second and third pixel circuits PXC1, PXC2 and PXC3. In this case, another portion of the third scan line S3*i* may be the 7*b*-th gate electrode GE7*b*.

The emission control line Ei may extend in the first direction DR1 and may be spaced apart from the first, second, and third scan lines S1*i*, S2*i*, and S3*i*. The emission control line Ei may include the second conductive layer CL2.

The emission control line Ei may be integrally formed with the fifth gate electrode GE5 of the fifth transistor T5 of each of the first, second, and third pixel circuits PXC1, PXC2, and PXC3. In this case, a part of the emission control line Ei may be the fifth gate electrode GE5.

In addition, the emission control line Ei may be integrally formed with the sixth gate electrode GE6 of the sixth transistor T6 of each of the first, second, and third pixel circuits PXC1, PXC2, and PXC3. In this case, another portion of the emission control line Ei may be the sixth gate electrode GE6.

The data lines may extend in the second direction DR2 and may include a first data line D1, a second data line D2, and a third data line D3 spaced apart from each other. Each of the first to third data lines D1, D2, and D3 may receive a data signal.

The first data line DI may be electrically connected to the second transistor T2 of the first pixel circuit PXC1, the second data line D2 may be electrically connected to the second transistor T2 of the second pixel circuit PXC2, and the third data line D3 may be electrically connected to the second transistor T2 of the third pixel circuit PXC3. Each of the first to third data lines D1, D2, and D3 may include a fourth conductive layer CL4. The fourth conductive layer CL4 may include the same material as the above-described second conductive layer CL2 or may include one or more materials suitable (or selected) from materials exemplified as constituent materials of the second conductive layer CL2, but is not limited thereto. According to an embodiment, the fourth conductive layer CL4 may be formed of a triple layer.

The power lines PL1, PL2, and PL3 may include a first power line PL1 extending in the second direction DR2 and second and third power lines PL2 and PL3 extending in the first direction DR1.

The first power line PL1 may receive the first power voltage VDD. The first power line PL1 may be spaced apart from the data line in each sub-pixel. For example, the first power line PL1 in the first sub-pixel SPX1 may be disposed to be spaced apart from the first data line D1, the first power line PL1 in the second sub-pixel SPX2 may be disposed to be spaced apart from the second data line D2, and the first power line PL1 in the third sub-pixel SPX3 may be disposed to be spaced apart from the third data line D3. In an embodiment, the first power line PL1 may include the fourth conductive layer CL4 and may be formed through the same process and on the same plane as the first, second, and third data lines D1, D2, and D3.

The first power line PL1 may be electrically connected to an additional conductive pattern ACP through a corresponding contact hole CH. The additional conductive pattern ACP may include the second conductive layer CL2 and may overlap the first power line PL1. The first power line PL1 may be electrically connected to the additional conductive pattern ACP disposed on a different layer through the corresponding contact hole CH to implement a double layer structure. Accordingly, a line resistance of the first power line PL1 may be reduced.

The first sub-pixel SPX1 and the second sub-pixel SPX2 may share the first power line PL1, but are not limited thereto.

In each of the first to third sub-pixels SPX1, SPX2, and SPX3, the first power line PL1 may be electrically connected to the fifth transistor T5 through the corresponding contact hole CH.

The second power line PL2 may receive the first initialization power voltage Vint1. The second power line PL2 may be disposed to be spaced apart from the second scan line S2*i* in the second direction DR2. The second power line PL2 may include the second conductive layer CL2. The second power line PL2 may be a common line commonly provided to the first to third sub-pixels SPX1, SPX2, and SPX3.

In the first sub-pixel SPX1, the second power line PL2 may be electrically connected to the fourth transistor T4 through the second connection pattern CNP2.

The second connection pattern CNP2 may include the fourth conductive layer CL4. One end of the second connection pattern CNP2 may be electrically connected to the second power line PL2 through the corresponding contact hole CH. The other end of the second connection pattern CNP2 may be electrically connected to the 4*b*-th transistor T4*b* of the fourth transistor T4 through the corresponding contact hole CH. The second connection pattern CNP2 may electrically connect the second power line PL2 and the 4*b*-th transistor T4*b* of the first sub-pixel SPX1 (or first pixel circuit PXC1).

In the second sub-pixel SPX2, the second power line PL2 may be electrically connected to the fourth transistor T4 through the sixth connection pattern CNP6.

The sixth connection pattern CNP6 may include the fourth conductive layer CL4. One end of the sixth connection pattern CNP6 may be electrically connected to the second power line PL2 through the corresponding contact hole CH. The other end of the sixth connection pattern CNP6 may be electrically connected to the 4*b*-th transistor T4*b* of the fourth transistor T4 through the corresponding contact hole CH. The sixth connection pattern CNP6 may electrically connect the second power line PL2 and the 4*b*-th transistor T4*b* of the second sub-pixel SPX2 (or second pixel circuit PXC2).

In the third sub-pixel SPX3, the second power line PL2 may be electrically connected to the fourth transistor T4 through the tenth connection pattern CNP10.

The tenth connection pattern CNP10 may include the fourth conductive layer CL4. One end of the tenth connection pattern CNP10 may be electrically connected to the second power line PL2 through the corresponding contact hole CH. The other end of the tenth connection pattern CNP10 may be electrically connected to the 4*b* transistor T4*b* of the fourth transistor T4 through the corresponding contact hole CH. The tenth connection pattern CNP10 may electrically connect the second power line PL2 and the 4*b*-th transistor T4*b* of the third sub-pixel SPX3 (or third pixel circuit PXC3).

The third power line PL3 may receive the second initialization power voltage Vint2. The third power line PL3 may be spaced apart from the third scan line S3*i* in the second direction DR2. The third power line PL3 may include the second conductive layer CL2. The third power line PL2 may be a common line commonly provided to the first to third sub-pixels SPX1, SPX2, and SPX3.

In the first sub-pixel SPX1, the third power line PL3 may be electrically connected to the seventh transistor T7 through the fourth connection pattern CNP4.

The fourth connection pattern CNP4 may include the fourth conductive layer CL4. One end of the fourth connection pattern CNP4 may be electrically connected to the third power line PL3 through the corresponding contact hole CH. The other end of the fourth connection pattern CNP4 may be electrically connected to the 7*b*-th transistor T7*b* of the first sub-pixel SPX1 through the corresponding contact hole CH. The fourth connection pattern CNP4 may electrically connect the third power line PL3 and the 7*b*-th transistor T7*b* of the first sub-pixel SPX1 (or first pixel circuit PXC1).

In the second sub-pixel SPX2, the third power line PL3 may be electrically connected to the seventh transistor T7 through the eighth connection pattern CNP8.

The eighth connection pattern CNP8 may include the fourth conductive layer CL4. One end of the eighth connection pattern CNP8 may be electrically connected to the third power line PL3 through the corresponding contact hole CH. The other end of the eighth connection pattern CNP8 may be electrically connected to the 7*b*-th transistor T7*b* of the second sub-pixel SPX2 through the corresponding contact hole CH. The eighth connection pattern CNP8 may electrically connect the third power line PL3 and the 7*b*-th transistor T7*b* of the second sub-pixel SPX2 (or second pixel circuit PXC2).

In the third sub-pixel SPX3, the third power line PL3 may be electrically connected to the seventh transistor T7 through the twelfth connection pattern CNP12.

The twelfth connection pattern CNP12 may include the fourth conductive layer CL4. One end of the twelfth connection pattern CNP12 may be electrically connected to the third power line PL3 through the corresponding contact hole CH. The other end of the twelfth connection pattern CNP12 may be electrically connected to the 7*b*-th transistor T7*b* of the third sub-pixel SPX3 through the corresponding contact hole CH. The twelfth connection pattern CNP12 may electrically connect the third power line PL3 and the 7*b*-th transistor T7*b* of the third sub-pixel SPX3 (or third pixel circuit PXC3).

The first pixel circuit PXC1, the second pixel circuit PXC2, and the third pixel circuit PXC3 may have substantially similar or identical structures. Hereinafter, the first pixel circuit PXC1 will be mainly described, and the second pixel circuit PXC2 and the third pixel circuit PXC3 will be briefly described.

The first pixel circuit PXC1 may include first to seventh transistors T1, T2, T3, T4, T5, T6, and T7 and a storage capacitor Cst.

The first transistor T1 may include a first active pattern ACT1, a first gate electrode GE1, a first source region SA1, and a first drain region DA1.

The first active pattern ACT1 may be a region of the semiconductor layer SCL overlapped with the first gate electrode GE1. The first active pattern ACT1 may constitutes a channel region of the first transistor T1 and may be a semiconductor pattern not doped with impurities. The first active pattern ACT1 may have a shape bent at least once.

The first source region SA1 may be connected to one end of the first active pattern ACT1 and may be a semiconductor pattern doped with impurities. The first source region SA1 may be connected to the second drain region DA2 of the second transistor T2 and the fifth drain area DA5 of the fifth transistor T5.

The first drain region DA1 may be connected to the other end of the first active pattern ACT1 and may be a semiconductor pattern doped with impurities. The first drain region DA1 may be connected to the 3*a*-th source region SA3*a* of the 3*a*-th transistor T3*a* and the sixth source region SA6 of the sixth transistor T6.

The first gate electrode GE1 may be disposed on the first active pattern ACT1 and may overlap the first active pattern ACT1 in a plan view. The first gate electrode GE1 may have an island-shaped conductive pattern. The first gate electrode GE1 may include the second conductive layer CL2. The first gate electrode GE1 may be electrically connected to the third and fourth transistors T3 and T4 through the first connection pattern CNP1.

The first connection pattern CNP1 may include the fourth conductive layer CL4. One end of the first connection pattern CNP1 may be electrically connected to the first gate electrode GE1 through the corresponding contact hole CH. The other end of the first connection pattern CNP1 may be electrically connected to a portion of the semiconductor layer SCL shared by the 3*b*-th transistor T3*b* and 4*a*-th transistor T4*a* through the corresponding contact hole CH. For example, a portion of the semiconductor layer SCL may include the 3*b*-th drain region DA3*b* of the 3*b*-th transistor T3*b* and the 4*a*-th source region SA4*a* of the 4*a*-th transistor T4*a*. In an embodiment, the first connection pattern CNP1 may electrically connect the first gate electrode GE1, the 3*b*-th drain region DA3*b* of the 3*b*-th transistor T3*b*, and the 4*a*-th source region SA4*a* of the 4*a*-th transistor T4*a*.

The first gate electrode GE1 may overlap a first lower metal pattern BML1. The first lower metal pattern BML1 may shield the first gate electrode GE1 and the first active pattern ACT1 from the lower side. The first lower metal pattern BML1 may include the first conductive layer CL1. The first conductive layer CL1 may include copper (Cu), molybdenum (Mo), tungsten (W), aluminum neodymium (AlNd), titanium (Ti), aluminum (Al), silver (Ag), and alloys thereof. The first lower metal pattern BML1 may be provided in an island shape. The first lower metal pattern BML1 may be electrically connected to the first gate electrode GE1 through the corresponding contact hole CH, but is not limited thereto.

The second transistor T2 may include a second active pattern ACT2, a second source region SA2, a second drain region DA2, and a second gate electrode GE2.

The second active pattern ACT2 may be a region of the semiconductor layer SCL overlapped with the second gate electrode GE2. The second active pattern ACT2 may constitute a channel region of the second transistor T2 and may be a semiconductor pattern not doped with impurities.

The second source region SA2 may be connected to one end of the second active pattern ACT2 and may be a semiconductor pattern doped with impurities. The second source region SA2 may be electrically connected to the first data line D1 through the corresponding contact hole CH.

The second drain region DA2 may be connected to the other end of the second active pattern ACT2 and may be a semiconductor pattern doped with impurities. The second drain region DA2 may be connected to the first source region SA1.

The second gate electrode GE2 may overlap the second active pattern ACT2 in a plan view. The second gate electrode GE2 may be a portion of the first scan line S1*i*.

The second gate electrode GE2 may overlap a second lower metal pattern BML2. The second lower metal pattern BML2 may shield the second gate electrode GE2 and the second active pattern ACT2 from the lower side. The second lower metal pattern BML2 may include the first conductive layer CL1. The second lower metal pattern BML2 may be provided in an island shape. The second lower metal pattern BML2 may be electrically connected to the second gate electrode GE2 (or first scan line S1*i*) through the corresponding contact hole CH, but is not limited thereto. The second lower metal pattern BML2 may be disposed to be spaced apart from the first lower metal pattern BML1.

The third transistor T3 may have a dual gate structure in which sub-transistors are connected in series to prevent leakage current. In this case, the third transistor T3 may include the 3*a*-th transistor T3*a* and the 3*b*-th transistor T3*b*.

The 3*a*-th transistor T3*a* may include a 3*a*-th active pattern ACT3*a*, a 3*a*-th source region SA3*a*, a 3*a*-th drain region DA3*a*, and a 3*a*-th gate electrode GE3*a*.

The 3*a*-th active pattern ACT3*a* may be a region of the semiconductor layer SCL overlapped with the 3*a*-th gate electrode GE3*a*. The 3*a*-th active pattern ACT3*a* may constitute a channel region of the 3*a*-th transistor T3*a* and may be a semiconductor pattern not doped with impurities.

The 3*a*-th source region SA3*a* may be connected to one end of the 3*a*-th active pattern ACT3*a* and may be a semiconductor pattern doped with impurities. The 3*a*-th source region SA3*a* may be electrically connected to the first drain region DA1.

The 3*a*-th drain region DA3*a* may be connected to the other end of the 3*a*-th active pattern ACT3*a* and may be a semiconductor pattern doped with impurities. The 3*a*-th drain region DA3*a* may be connected to the 3*b*-th source region SA3*b* of the 3*b*-th transistor T3*b*.

The 3*a*-th gate electrode GE3*a* may overlap the 3*a*-th active pattern ACT3*a* in a plan view. The 3*a*-th gate electrode GE3*a* may be a portion of the first scan line S1*i*.

The 3*b*-th transistor T3*b* may include a 3*b*-th active pattern ACT3*b*, a 3*b*-th source region SA3*b*, a 3*b*-th drain region DA3*b*, and a 3*b*-th gate electrode GE3*b*.

The 3*b*-th active pattern ACT3*b* may be a region of the semiconductor layer SCL overlapped with the 3*b*-th gate electrode GE3*b*. The 3*b*-th active pattern ACT3*b* may constitute a channel region of the 3*b*-th transistor T3*b* and may be a semiconductor pattern not doped with impurities.

The 3*b*-th source region SA3*b* may be connected to one end of the 3*b*-th active pattern ACT3*b* and may be a semiconductor pattern doped with impurities. The 3*b*-th source region SA3*b* may be electrically connected to the 3*a*-th drain region DA3*a*.

The 3*b*-th drain region DA3*b* may be connected to the other end of the 3*b*-th active pattern ACT3*b* and may be a semiconductor pattern doped with impurities. The 3*b*-th drain region DA3*b* may be connected to the 4*a*-th source region SA4*a* of the 4*a*-th transistor T4*a*.

The 3*b*-th gate electrode GE3*b* may overlap the 3*b*-th active pattern ACT3*b* in a plan view. The 3*b*-th gate electrode GE3*b* may be a portion of the first scan line S1*i*.

In an embodiment, the 3*a*-th gate electrode GE3*a* and the 3*b*-th gate electrode GE3*b* may overlap the third lower metal pattern BML3. The third lower metal pattern BML3 may shield the 3*a*-th gate electrode GE3*a*, the 3*a*-th active pattern ACT3*a*, the 3*b*-th gate electrode GE3*b*, and the 3*b*-th active pattern ACT3*b* from the lower side. The third lower metal pattern BML3 may include the first conductive layer CL1. The third lower metal pattern BML3 may be provided in an island shape. The third lower metal pattern BML3 may be electrically connected to the first scan line S1*i* through the corresponding contact hole CH, but is not limited thereto. The third lower metal pattern BML3 may be spaced apart from the first and second lower metal patterns BML1 and BML2.

The fourth transistor T4 may have a dual gate structure in which sub-transistors are connected in series to prevent leakage current. In this case, the fourth transistor T4 may include the 4*a*-th transistor T4*a* and the 4*b*-th transistor T4*b*.

The 4*a*-th transistor T4*a* may include a 4*a*-th active pattern ACT4*a*, a 4*a*-th source area SA4*a*, a 4*a*-th drain area DA4*a*, and a 4*a*-th gate electrode GE4*a*.

The 4*a*-th active pattern ACT4*a* may be a region of the semiconductor layer SCL overlapped with the 4*a*-th gate electrode GE4*a*. The 4*a*-th active pattern ACT4*a* may constitute a channel region of the 4*a*-th transistor T4*a* and may be a semiconductor pattern not doped with impurities.

The 4*a*-th source region SA4*a* may be connected to one end of the 4*a*-th active pattern ACT4*a* and may be a semiconductor pattern doped with impurities. The 4*a*-th source region SA4*a* may be connected to the 3*b*-th drain area DA3*b*.

The 4*a*-th drain region DA4*a* may be connected to the other end of the 4*a*-th active pattern ACT4*a* and may be a semiconductor pattern doped with impurities. The 4*a*-th drain region DA4*a* may be connected to the 4*b*-th source region SA4*b* of the 4*b*-th transistor T4*b*.

The 4*a*-th gate electrode GE4*a* may overlap the 4*a*-th active pattern ACT4*a*. The 4*a*-th gate electrode GE4*a* may be a portion of the second scan line S2*i*.

The 4*b*-th transistor T4*b* may include the 4*b*-th active pattern ACT4*b*, the 4*b*-th source region SA4*b*, the 4*b*-th drain region DA4*b*, and the 4*b*-th gate electrode GE4*b*.

The 4*b*-th active pattern ACT4*b* may be a region of the semiconductor layer SCL overlapped with the 4*b*-th gate electrode GE4*b*. The 4*b*-th active pattern ACT4*b* may constitute a channel region of the 4*b*-th transistor T4*b* and may be a semiconductor pattern not doped with impurities.

The 4*b*-th source region SA4*b* may be connected to one end of the 4*b*-th active pattern ACT4*b* and may be a semiconductor pattern doped with impurities. The 4*b*-th source region SA4*b* may be connected to the 4*a*-th drain region DA4*a*.

The 4*b*-th drain region DA4*b* may be connected to the other end of the 4*b*-th active pattern ACT4*b* and may be a semiconductor pattern doped with impurities. The 4*b*-th drain region DA4*b* may be electrically connected to the second connection pattern CNP2 through the corresponding contact hole CH.

The 4*b*-th gate electrode GE4*b* may overlap the 4*b*-th active pattern ACT4*b* in a plan view. The 4*b*-th gate electrode GE4*b* may be a portion of the second scan line S2*i*.

In an embodiment, the 4*a*-th gate electrode GE4*a* and the 4*b*-th gate electrode GE4*b* may overlap the fourth lower metal pattern BML4. The fourth lower metal pattern BML4 may shield the 4*a*-th gate electrode GE4*a*, the 4*a*-th active pattern ACT4*a*, the 4*b*-th gate electrode GE4*b*, and the 4*b*-th active pattern ACT4*b* from the lower side. The fourth lower metal pattern BML4 may include the first conductive layer CL1. The fourth lower metal pattern BML4 may be provided in an island shape. The fourth lower metal pattern BML4 may be electrically connected to the second scan line S2*i* through the corresponding contact hole CH, but is not limited thereto. The fourth lower metal pattern BML4 may be spaced apart from the first to third lower metal patterns BML1, BML2, and BML3.

The fifth transistor T5 may include a fifth active pattern ACT5, a fifth source area SA5, a fifth drain area DA5, and a fifth gate electrode GE5.

The fifth active pattern ACT5 may be a region of the semiconductor layer SCL overlapped with the fifth gate electrode GE5. The fifth active pattern ACT5 may constitute a channel region of the fifth transistor T5 and may be a semiconductor pattern not doped with impurities.

The fifth source region SA5 may be connected to one end of the fifth active pattern ACT5 and may be a semiconductor pattern doped with impurities. The fifth source area SA5 may be electrically connected to the first power line PL1 through the corresponding contact hole CH.

The fifth drain region DA5 may be connected to the other end of the fifth active pattern ACT5 and may be a semiconductor pattern doped with impurities. The fifth drain area DA5 may be connected to the first source region SA1.

The fifth gate electrode GE5 may overlap the fifth active pattern ACT5 in a plan view. The fifth gate electrode GE5 may be a portion of the emission control line Ei.

The fifth gate electrode GE5 may overlap the fifth lower metal pattern BML5. The fifth lower metal pattern BML5 may shield the fifth gate electrode GE5 and the fifth active pattern ACT5 from the lower side. The fifth lower metal pattern BML5 may include the first conductive layer CL1. The fifth lower metal pattern BML5 may be provided in an island shape. The fifth lower metal pattern BML5 may be electrically connected to the fifth gate electrode GE5 (or emission control line Ei) through the corresponding contact hole CH, but is not limited thereto. The fifth lower metal pattern BML5 may be spaced apart from the first to fourth lower metal patterns BML1, BML2, BML3, and BML4.

The sixth transistor T6 may include a sixth active pattern ACT6, a sixth source region SA6, a sixth drain region DA6, and a sixth gate electrode GE6.

The sixth active pattern ACT6 may be a region of the semiconductor layer SCL overlapped with the sixth gate electrode GE6. The sixth active pattern ACT6 may constitute a channel region of the sixth transistor T6 and may be a semiconductor pattern not doped with impurities.

The sixth source region SA6 may be connected to one end of the sixth active pattern AC6 and may be a semiconductor pattern doped with impurities. The sixth source area SA6 may be connected to the first drain region DA1.

The sixth drain region DA6 may be connected to the other end of the sixth active pattern ACT6 and may be a semiconductor pattern doped with impurities. The sixth drain region DA6 may be electrically connected to the third connection pattern CNP3 through the corresponding contact hole CH.

The third connection pattern CNP3 may include the fourth conductive layer CL4. The third connection pattern CNP3 may be electrically connected to the sixth drain region DA6 through the corresponding contact hole CH. The third connection pattern CNP3 may be electrically connected to the first pixel electrode PE1 through the first contact portion CNT1. The third connection pattern CNP3 may electrically connect the first pixel electrode PE1 and the sixth transistor T6.

The sixth gate electrode GE6 may overlap the sixth active pattern ACT6. The sixth gate electrode GE6 may be a portion of the emission control line Ei.

The sixth gate electrode GE6 may overlap a sixth lower metal pattern BML6. The sixth lower metal pattern BML6 may shield the sixth gate electrode GE6 and the sixth active pattern ACT6 from the lower side. The sixth lower metal pattern BML6 may include the first conductive layer CL1. The sixth lower metal pattern BML6 may be provided in an island shape. The sixth lower metal pattern BML6 may be electrically connected to the sixth gate electrode GE6 (or emission control line Ei) through the corresponding contact hole CH, but is not limited thereto. The sixth lower metal pattern BML6 may be spaced apart from the first to fifth lower metal patterns BML1, BML2, BML3, BML4, and BML5.

The seventh transistor T7 may have a dual gate structure in which sub-transistors are connected in series to prevent leakage current. In this case, the seventh transistor T7 may include a 7*a*-th transistor T7*a* and a 7*b*-th transistor T7*b*.

The 7*a*-th transistor T7*a* may include a 7*a*-th active pattern ACT7*a*, a 7*a*-th source region SA7*a*, a 7*a*-th drain region DA7*a*, and a 7*a*-th gate electrode GE7*a*.

The 7*a*-th active pattern ACT7*a* may be a region of the semiconductor layer SCL overlapped with the 7*a*-th gate electrode GE7*a*. The 7*a*-th active pattern ACT7*a* may constitute a channel region of the 7*a*-th transistor T7*a* and may be a semiconductor pattern not doped with impurities.

The 7*a*-th source region SA7*a* may be connected to one end of the 7*a*-th active pattern ACT7*a* and may be a semiconductor pattern doped with impurities. The 7*a*-th source region SA7*a* may be connected to the sixth drain region DA6.

The 7*a*-th drain region DA7*a* may be connected to the other end of the 7*a*-th active pattern ACT7*a* and may be a semiconductor pattern doped with impurities. The 7*a*-th drain region DA7*a* may be connected to the 7*b*-th source region SA7*b* of the 7*b*-th transistor T7*b*.

The 7*a*-th gate electrode GE7*a* may overlap the 7*a*-th active pattern ACT7*a*. The 7*a*-th gate electrode GE7*a* may be a portion of the third scan line S3*i*.

The 7*b*-th transistor T7*b* may include a 7*b*-th active pattern ACT7*b*, a 7*b*-th source region SA7*b*, a 7*b*-th drain region DA7*b*, and a 7*b*-th gate electrode GE7*b*.

The 7*b*-th active pattern ACT7*b* may be a region of the semiconductor layer SCL overlapped with the 7*b*-th gate electrode GE7*b*. The 7*b*-th active pattern ACT7*b* may constitute a channel region of the 7*b*-th transistor T7*b* and may be a semiconductor pattern not doped with impurities.

The 7*b*-th source region SA7*b* may be connected to one end of the 7*b*-th active pattern ACT7*b* and may be a semiconductor pattern doped with impurities. The 7*b*-th source region SA7*b* may be electrically connected to the 7*a*-th drain region DA7*a*.

The 7*b*-th drain region DA7*b* may be connected to the other end of the 7*b*-th active pattern ACT7*b* and may be a semiconductor pattern doped with impurities. The 7*b*-th drain region DA7*b* may be electrically connected to the fourth connection pattern CNP4 through the corresponding contact hole CH.

The 7*b*-th gate electrode GE7*b* may overlap the 7*b*-th active pattern ACT7*b*. The 7*b*-th gate electrode GE7*b* may be a portion of the third scan line S3*i*.

In an embodiment, the 7*a*-th gate electrode GE7*a* and the 7*b*-th gate electrode GE7*b* may overlap a seventh lower metal pattern BML7. The seventh lower metal pattern BML7 may shield the 7*a*-th gate electrode GE7*a*, the 7*a*-th active pattern ACT7*a*, the 7*b*-th gate electrode GE7*b*, and the 7*b*-th active pattern ACT7*b* from the lower side. The seventh lower metal pattern BML7 may include the first conductive layer CL1. The seventh lower metal pattern BML7 may be provided in an island shape. The seventh lower metal pattern BML7 may be electrically connected to the third scan line S3*i* through the corresponding contact hole CH, but is not limited thereto. The seventh lower metal pattern BML7 may be disposed to be spaced apart from the first to sixth lower metal patterns BML1, BML2, BML3, BML4, BML5, and BML6.

The storage capacitor Cst may include a first lower electrode LE1 and a first upper electrode UE1. The first lower electrode LE1 may be integrally formed with the first gate electrode GE1 of the first transistor T1. In this case, the first lower electrode LE1 may be the first gate electrode GE1.

The first upper electrode UE1 may overlap the first lower electrode LE1 in a plan view. The capacitance of the storage capacitor Cst may be increased by increasing an overlapping area between the first upper electrode UE1 and the first lower electrode LE1. The first upper electrode UE1 may extend in the first direction DR1. The first upper electrode UE1 may include the third conductive layer CL3. The third conductive layer CL3 may include the same material as the above-described second conductive layer CL2 or may include one or more materials suitable (or selected) from materials exemplified as constituent material of the second conductive layer CL2, but is not limited thereto. The first upper electrode UE1 may be electrically connected to the first power line PL1 through the corresponding contact hole CH. The first upper electrode UE1 may have an opening in a region where a contact hole CH connecting the first gate electrode GE1 and the first connection pattern CNP1 is formed.

The first pixel circuit PXC1 may further include an additional capacitor Cad. The additional capacitor Cad may include a second lower electrode LE2 and a second upper electrode UE2.

The second lower electrode LE2 may include the third conductive layer CL3 and may be provided in an island shape. The second lower electrode LE2 may be connected to the 4*a*-th drain region DA4*a* and the 4*b*-th source region SA4*b* through the corresponding contact hole CH.

The second upper electrode UE2 may overlap the second lower electrode LE2 in a plan view. The second upper electrode UE2 may be integrally formed with the first power line PL1. In this case, the second upper electrode UE2 may be a portion of the first power line PL1.

The second pixel circuit PXC2 may include first to seventh transistors T1, T2, T3, T4, T5, T6, and T7, and a storage capacitor Cst.

A gate electrode of the first transistor T1 may be electrically connected to the third transistor T3 and the fourth transistor T4 through the fifth connection pattern CNP5.

The fifth connection pattern CNP5 may include the fourth conductive layer CL4. One end of the fifth connection pattern CNP5 may be electrically connected to the gate electrode of the first transistor T1 through the corresponding contact hole CH. The other end of the fifth connection pattern CNP5 may be electrically connected to a portion of the semiconductor layer SCL shared by the 3*b*-th transistor T3*b* and 4*a*-th transistor T4*a* through the corresponding contact hole CH.

The sixth transistor T6 may be electrically connected to the seventh connection pattern CNP7 through the corresponding contact hole CH.

The seventh connection pattern CNP7 may include the fourth conductive layer CL4. The seventh connection pattern CNP7 may be electrically connected to the drain region of the sixth transistor T6 through the corresponding contact hole CH. The seventh connection pattern CNP7 may be electrically connected to the second pixel electrode PE2 through the second contact portion CNT2. The seventh connection pattern CNP7 may electrically connect the second pixel electrode PE2 and the sixth transistor T6.

The third pixel circuit PXC3 may include first to seventh transistors T1, T2, T3, T4, T5, T6, and T7, and a storage capacitor Cst.

A gate electrode of the first transistor T1 may be electrically connected to the third transistor T3 and the fourth transistor T4 through the ninth connection pattern CNP9.

The ninth connection pattern CNP9 may include the fourth conductive layer CL4. One end of the ninth connection pattern CNP9 may be electrically connected to the gate electrode through the corresponding contact hole CH. The other end of the ninth connection pattern CNP9 may be electrically connected to a portion of the semiconductor layer SCL shared by the 3*b*-th transistor T3*b* and the 4*a*-th transistor T4*a* through the corresponding contact hole CH.

The sixth transistor T6 may be electrically connected to the eleventh connection pattern CNP11 through the corresponding contact hole CH.

The eleventh connection pattern CNP11 may include the fourth conductive layer CL4. The eleventh connection pattern CNP11 may be electrically connected to the drain region of the sixth transistor T6 through the corresponding contact hole CH. The eleventh connection pattern CNP11 may be electrically connected to the third pixel electrode PE3 through the third contact portion CNT3. The eleventh connection pattern CNP11 may electrically connect the third pixel electrode PE3 and the sixth transistor T6.

Each of the first, second, and third pixel circuits PXC1, PXC2, and PXC3 may be electrically connected to the pixel electrode PE through the corresponding contact portion CNT. For example, the first pixel circuit PXC1 may be electrically connected to the first pixel electrode PE1 through the first contact portion CNT1, the second pixel circuit PXC2 may be electrically connected to the second pixel electrode PE2 through the second contact portion CNT2, and the third pixel circuit PXC3 may be electrically connected to the third pixel electrode PE3 through the third contact portion CNT3.

The first pixel electrode PE1, the second pixel electrode PE2, and the third pixel electrode PE3 may include a fifth conductive layer CL5.

The first pixel electrode PE1 may correspond to the anode electrode of the light emitting element LD disposed in the first sub-pixel SPX1 and may overlap a part of the first pixel circuit PXC1. The second pixel electrode PE2 may correspond to the anode electrode of the light emitting element LD disposed in the second sub-pixel SPX2 and may overlap a part of the second pixel circuit PXC2. The third pixel electrode PE3 may correspond to the anode electrode of the light emitting element LD disposed in the third sub-pixel SPX3 and may overlap a part of the third pixel circuit PXC3.

The pixel area PXA may include a dummy area DMA. For example, the dummy area DMA may be disposed between one area of the pixel area PXA where the second pixel circuit PXC2 is disposed and one area of the pixel area PXA where the third pixel circuit PXC3 is disposed, but is not limited thereto.

A dummy line DML and a dummy pattern DMP may be disposed in the dummy area DMA.

The dummy line DML may extend in the second direction DR2 and may be disposed between the second data line D2 and the third data line D3. The dummy line DML may be spaced apart from each of the second and third data lines D2 and D3. A plurality of dummy lines DML may be provided in the display area DA. The dummy line DML may be electrically connected to the fourth power line (refer to "PL4" in FIG. 4). Accordingly, the second power voltage VSS may be applied to the dummy line DML. The dummy line DML may include the fourth conductive layer CL4. For example, the dummy line DML may be formed of a conductive pattern of a triple layer.

The dummy pattern DMP may be disposed in one area of the dummy line DML. The dummy pattern DMP may include a first dummy pattern DMP1 and a second dummy pattern DMP2. The first dummy pattern DMP1 may be integrally formed with the dummy line DML. In this case, the first dummy pattern DMP1 may be formed of a conductive pattern of a triple layer in which a first layer, a second layer, and a third layer including a conductive material are sequentially stacked. In an embodiment, the first dummy pattern DMP1 may have a larger width than the dummy line DML in the first direction DR1. For example, the dummy line DML may have a first width W1 of about 3 μm in the first direction DR1, and the first dummy pattern DMP1 may have a second width W2 of about 9.5 μm in the first direction DR, but is not limited thereto.

The second dummy pattern DMP2 may overlap the first dummy pattern DMP1. The second dummy pattern DMP2 may include a material different from that of the first dummy pattern DMP1. For example, the second dummy pattern DMP2 may include an organic pattern including an organic material. The second dummy pattern DMP2 may have the same or similar width as the first dummy pattern DMP1 in the first direction DR1, but is not limited thereto. According to embodiments, the second dummy pattern DMP2 may have a width larger or smaller than that of the first dummy pattern DMP1 in the first direction DR1.

The dummy pattern DMP including the first dummy pattern DMP1 and the second dummy pattern DMP2 may be exposed to the outside through the via hole VIH. The dummy pattern DMP may be electrically connected to the common electrode (refer to "CE" in FIGS. 9 and 10) to prevent a voltage drop that may occur at the common electrode CE, thereby improving reliability of each pixel PXL.

A detailed description of the aforementioned dummy pattern DMP will be described later with reference to FIGS. 10 to 17.

Hereinafter, the stacked structure (or cross-sectional structure) of the pixel PXL described above will be mainly described with reference to FIG. 9.

Figure 9:
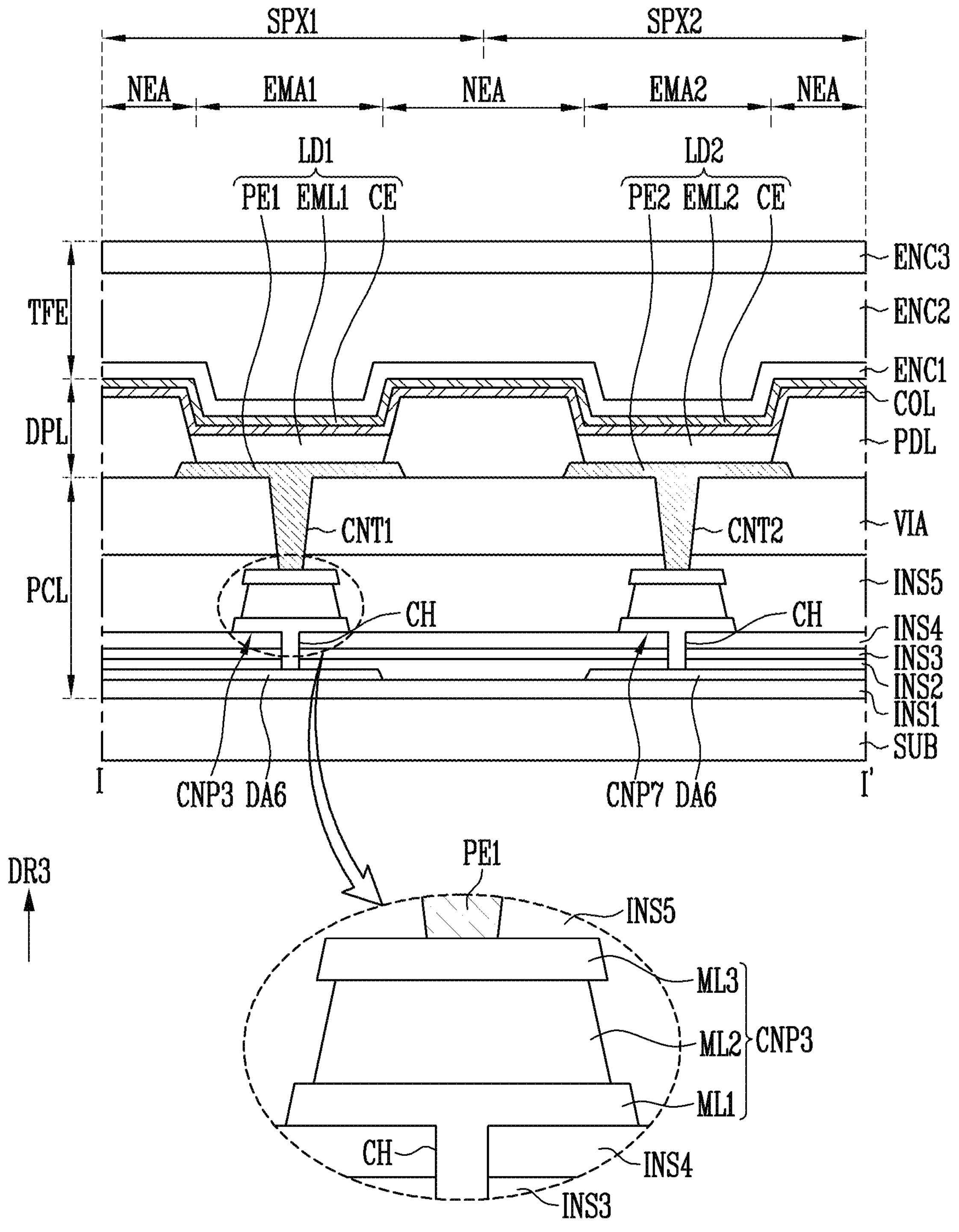
FIG. 9 is a schematic cross-sectional view taken along a line I-I' of FIG. 6.

FIG. 9 is a schematic cross-sectional view taken along a line I-I' of FIG. 6.

In order to avoid overlapping descriptions with respect to the embodiment of FIG. 9, differences from the above-described embodiment will be mainly described.

Referring to FIGS. 1 to 9, a pixel PXL may include a first sub-pixel SPX1, a second sub-pixel SPX2, and a third sub-pixel SPX3 adjacent to each other.

Each of the first to third sub-pixels SPX1, SPX2, and SPX3 may include a substrate SUB, a pixel circuit layer PCL, a display element layer DPL, and an encapsulation layer TFE.

The substrate SUB may include a transparent insulation material and transmit light. The substrate SUB may be a rigid substrate or a flexible substrate.

First to third pixel circuits PXC1, PXC2, and PXC3 and signal lines may be disposed in the pixel circuit layer PCL. A light emitting element electrically connected to each of the first to third pixel circuits PXC1, PXC2, and PXC3 (refer to "LD" in FIG. 4) may be disposed in the display element layer DPL.

At least one insulating layer may be disposed on the substrate SUB. For example, a first insulating layer INS1, a second insulating layer INS2, a third insulating layer INS3, a fourth insulating layer INS4, a fifth insulating layer INS5, and a via layer VIA that are sequentially stacked in the third direction DR3 may be disposed on the substrate SUB. In addition, at least one conductive layer may be disposed on the substrate SUB. For example, the conductive layer may include a first conductive layer CL1, a second conductive layer CL2, a third conductive layer CL3, a fourth conductive layer CL4, and a fifth conductive layer CL5. The first conductive layer CL1 may be disposed between the substrate SUB and the first insulating layer INS1, the second conductive layer CL2 may be disposed on the second insulating layer INS2, the third conductive layer CL3 may be disposed on the third insulating layer INS3, the fourth conductive layer CL4 may be disposed on the fourth insulating layer INS4, and the fifth conductive layer CL5 may be disposed on the via layer VIA.

The first conductive layer CL1 may include first to seventh lower metal patterns BML1, BML2, BML3, BML4, BML5, BML6, and BML7. The second conductive layer CL2 may include a second power line PL2, a first scan line S1*i*, a second scan line S2*i*, a third scan line S3*i*, an emission control line Ei, a third power line PL3, a first gate electrode GE1, a first lower electrode LE1, and an additional conductive pattern ACP. The third conductive layer CL3 may include a first upper electrode UE1 and a second lower electrode LE2. The fourth conductive layer CL4 may include first to twelfth connection patterns CNP1 to CNP12, first to third data lines D1, D2, and D3, a first power line PL1, and a second upper electrode UE2, a dummy line DML, and a first dummy pattern DMP1. The fifth conductive layer CL5 may include a first pixel electrode PE1, a second pixel electrode PE2, and a third pixel electrode (refer to "PE3" in FIG. 6).

In an embodiment, the fourth conductive layer CL4 may be formed of a triple layer including a conductive material. For example, each of the third and seventh connection patterns CNP3 and CNP7 formed of the fourth conductive layer CL4 may include a sequentially stacked first metal layer ML1, second metal layer ML2, and third metal layer ML3. The first metal layer ML1 and the third metal layer ML3 may include the same conductive material, and the second metal layer ML2 may include a conductive material having a material characteristic different from that of the first and third metal layers ML1 and ML3. For example, each of the first and third metal layers ML1 and ML3 may include titanium, and the second metal layer ML2 may include aluminum. The first metal layer ML1 may be disposed on the fourth insulating layer INS4, the second metal layer ML2 may be disposed on the first metal layer ML1, and the third metal layer ML3 may be disposed on the second metal layer ML2.

The first metal layer ML1 of each of the third and seventh connection patterns CNP3 and CNP7 may be electrically connected to the sixth drain region DA6 of the sixth transistor T6 through the contact hole CH formed through the second to fourth insulating layers INS2, INS3, and INS4. The third metal layer ML3 of the third connection pattern CNP3 may be electrically connected to the first pixel electrode PE1 through the first contact portion CNT1 of the via layer VIA, and the third metal layer ML3 of the seventh connection pattern CNP7 may be electrically connected to the second pixel electrode PE2 through the second contact portion CNT2 of the via layer VIA.

In an embodiment, the second metal layer ML2 may be disposed between the first metal layer ML1 and the third metal layer ML3, and may have a side surface recessed from a side surface of each of the first and third metal layers ML1 and ML3. In this case, each of the first and third metal layers ML1 and ML3 may protrude from the side surface of the second metal layer ML2. In case that viewed in cross section, the width of the second metal layer ML2 may be smaller than the width of the first metal layer ML1 and the width of the third metal layer ML3.

The pixel circuit layer PCL may be disposed on the substrate SUB. The above-described first to fifth insulating layers INS1, INS2, INS3, INS4, and INS5 may be disposed in the pixel circuit layer PCL.

The first insulating layer INS1 (or buffer layer) may be entirely disposed on the substrate SUB. The first insulating layer INS1 may prevent impurities from diffusing into the first to seventh transistors T1, T2, T3, T4, T5, T6, and T7 included in the first to third pixel circuits PXC1, PXC2, and PXC3. The first insulating layer INS1 may be an inorganic insulating layer including an inorganic material. For example, the first insulating layer INS1 may include at least one of silicon nitride (SiNx), silicon oxide (SiOx), and silicon oxynitride (SiOxNy), or may include at least one of metal oxides such as aluminum oxide (AlxOy). The first insulating layer INS1 may be provided as a single layer, but may also be provided as a multiple layer of at least a double layer. In case that the first insulating layer INS1 is provided as a multiple layer, each layer may be formed of the same material or different materials. The first insulating layer INS1 may be omitted depending on the material of the substrate SUB and process conditions.

The second insulating layer INS2 (or first gate insulating layer) may be entirely disposed on the first insulating layer INS1. The second insulating layer INS2 may include the same material as the above-described first insulating layer INS1 or may include a material suitable (or selected) from materials exemplified as constituent materials of the first insulating layer INS1. For example, the second insulating layer INS2 may include an inorganic insulating layer including an inorganic material. According to embodiments, the second insulating layer INS2 may be partially disposed on the first insulating layer INS1. For example, the second insulating layer INS2 may be etched together with a base material of the second conductive layer CL2 during the manufacturing process of the second conductive layer CL2 so that the second insulating layer INS2 is disposed only under the second conductive layer CL2. In this case, the second insulating layer INS2 may have the same width as the second conductive layer CL2 disposed thereon, but is not limited thereto.

The third insulating layer INS3 (or second gate insulating layer) may be provided and/or formed entirely on the second insulating layer INS2. The third insulating layer INS3 may include the same material as the first insulating layer INS1 or may include one or more materials suitable (or selected) from materials exemplified as constituent materials of the first insulating layer INS1. For example, the third insulating layer INS3 may be an inorganic insulating layer including an inorganic material.

The fourth insulating layer INS4 (or interlayer insulating layer) may be provided and/or formed entirely on the third insulating layer INS3. The fourth insulating layer INS4 may include the same material as that of the first insulating layer INS1 or may include one or more materials suitable (or selected) from materials exemplified as constituent materials of the first insulating layer INS1.

The fifth insulating layer INS5 (or passivation layer) may be provided and/or formed entirely on the fourth insulating layer INS4. The fifth insulating layer INS5 may be an inorganic insulating layer including an inorganic material. The fifth insulating layer INS5 may include an opening corresponding to each of the contact portions CNT of the via layer VIA and may expose a portion of the fourth conductive layer CL4 disposed thereunder.

The via layer VIA may be provided and/or formed entirely on the fifth insulating layer INS5. The via layer VIA may be formed of a single layer or a multiple layer including an organic layer. According to embodiments, the via layer VIA may be provided in a form including an inorganic layer and an organic layer disposed on the inorganic layer. In case that the via layer VIA is a multiple layer including an organic layer, the inorganic layer may be disposed as an uppermost layer. The via layer VIA may include at least one selected from the group consisting of polyacrylates resin, epoxy resin, phenolic resin, polyamides resin, polyimide resin, unsaturated polyester resin, poly-phenylen ethers resin, poly-phenylene sulfides resin, and benzocyclobutene resin.

In an embodiment, the via layer VIA may include contact portions CNT exposing some of the circuit elements disposed on the pixel circuit layer PCL. For example, the via layer VIA may include a first contact portion CNT1, a second contact portion CNT2, and a third contact portion CNT3. The first contact portion CNT1 may expose a region of the third connection pattern CNP3, the second contact portion CNT2 may expose a region of the seventh connection pattern CNP7, and the third contact portion CNT3 may expose a region of the eleventh connection pattern CNP11. In an embodiment, the via layer VIA may include a via hole VIH exposing the dummy pattern DMP.

The pixel circuit layer PCL of each of the first to third sub-pixels SPX1, SPX2, and SPX3 may include first to seventh transistors T1 to T7 disposed on the first insulating layer INS1, a storage capacitor Cst, and an additional capacitor Cad.

The first transistor T1 may include the first active pattern ACT1, the first source region SA1, and the first drain region DA1 disposed on the first insulating layer INS1, and may include the first gate electrode GE1 disposed on the second insulating layer INS2. The first lower metal pattern BML1 may be disposed under the first gate electrode GE1 and the first active pattern ACT1 with the first insulating layer INS1 interposed therebetween.

The second transistor T2 may include the second active pattern ACT2, the second source region SA2, and the second drain region DA2 disposed on the first insulating layer INS1, and may include the second gate electrode GE2 disposed on the second insulating layer INS2. The second lower metal pattern BML2 may be disposed under the second gate electrode GE2 (or first scan line S1*i*) and the second active pattern ACT2 with the first insulating layer INS1 interposed therebetween.

The 3*a*-th transistor T3*a* may include the 3*a*-th active pattern ACT3*a*, the 3*a*-th source region SA3*a*, and the 3*a*-th drain region DA3*a* disposed on the first insulating layer INS1, and may include the 3*a*-th gate electrode GE3*a* disposed on the second insulating layer INS2. The 3*b*-th transistor T3*b* may include the 3*b*-th active pattern ACT3*b*, the 3*b*-th source region SA3*b*, and the 3*b*-th drain region DA3*b* disposed on the first insulating layer INS1, and may include the 3*b*-th gate electrode GE3*b* disposed on the second insulating layer INS2. The third lower metal pattern BML3 may be disposed under the 3*a*-th and 3*b*-th gate electrodes GE3*a* and GE3*b* (or first scan line S1*i*) and the 3*a*-th and 3*b*-th active patterns ACT3*a* and ACT3*b* with the first insulating layer INS1 interposed therebetween.

The 4*a*-th transistor T4*a* may include the 4*a*-th active pattern ACT3*a*, the 4*a*-th source region SA4*a*, the 4*a*-th drain region DA4*a* disposed on the first insulating layer INS1, and may include the 4*a*-th gate electrode GE4*a* disposed on the second insulating layer INS2. The 4*b*-th transistor T4*b* may include the 4*b*-th active pattern ACT4*b*, the 4*b*-th source region SA4*b*, and the 4*b*-th drain region DA4*b* disposed on the first insulating layer INS1, and may include the 4*b*-th gate electrode GE4*b* disposed on the second insulating layer INS2. The fourth lower metal pattern BML4 may be disposed under the 4*a*-th and 4*b*-th gate electrodes GE4*a* and GE4*b* (or second scan line S2*i*) and the 4*a*-th and 4*b*-th active patterns ACT4*a* and ACT4*b* with the first insulating layer INS1 interposed therebetween.

The fifth transistor T5 may include the fifth active pattern ACT5, the fifth source region SA5, and the fifth drain region DA5 disposed on the first insulating layer INS1, and may include the fifth gate electrode GE5 disposed on the second insulating layer INS2. The fifth lower metal pattern BML5 may be disposed under the fifth gate electrode GE5 (or emission control line Ei) and the fifth active pattern ACT5 with the first insulating layer INS1 interposed therebetween.

The sixth transistor T6 may include the sixth active pattern ACT6, the sixth source region SA6, and the sixth drain region DA6 disposed on the first insulating layer INS1, and may include a sixth gate electrode GE6 disposed on the second insulating layer INS2. The sixth lower metal pattern BML6 may be disposed under the sixth gate electrode GE6 (or emission control line Ei) and the sixth active pattern ACT6 with the first insulating layer INS1 interposed therebetween. In the first sub-pixel SPX1, the sixth drain region DA6 may be electrically connected to the third connection pattern CNP3 through the contact hole CH formed through the second to fourth insulating layers INS2, INS3, and INS4. In the second sub-pixel SPX2, the sixth drain region DA6 may be electrically connected to the seventh connection pattern CNP7 through the contact hole CH formed through the second to fourth insulating layers INS2, INS3, and INS4.

The 7*a*-th transistor T7*a* may include the 7*a*-th active pattern ACT7*a*, the 7*a*-th source region SA7*a*, and the 7*a*-th drain region DA7*a* disposed on the first insulating layer INS1, and may include the 7*a*-th gate electrode GE7*a* disposed on the second insulating layer INS2. The 7*b*-th transistor T7*b* may include the 7*b*-th active pattern ACT7*b*, the 7*b*-th source region SA7*b*, the 7*b*-th drain region DA7*b* disposed on the first insulating layer INS1, and may include the 7*b*-th gate electrode GE7*b* disposed on the second insulating layer INS2. The seventh lower metal pattern BML7 may be disposed under the 7*a*-th and 7*b*-th gate electrodes GE7*a* and GE7*b* (or third scan line S3*i*) and the 7*a*-th and 7*b*-th active patterns ACT7*a* and ACT7*b* with the first insulating layer INS1 interposed therebetween.

The storage capacitor Cst may include a first lower electrode LE1 disposed on the second insulating layer INS2 and may include a first upper electrode UE1 disposed on the third insulating layer INS3 and overlapping the first lower electrode LE1 in a plan view.

The additional capacitor Cad may include a second lower electrode LE2 disposed on the third insulating layer INS3 and may include a second upper electrode UE2 disposed on the fourth insulating layer INS4 and overlapping the second lower electrode LE2 in a plan view.

The display element layer DPL may be disposed on the pixel circuit layer PCL. The display device layer DPL may include a light emitting element LD and a pixel definition layer PDL. For example, the light emitting elements LD may include a first light emitting element LD1 electrically connected to the first pixel circuit PXC1, a second light emitting element LD2 electrically connected to the second pixel circuit PXC2, and a third light emitting element electrically connected to the third pixel circuit PXC3. The first light emitting element LD1 may be disposed on the display element layer DPL of the first sub-pixel SPX1, the second light emitting element LD2 may be disposed on the display element layer DPL of the second sub-pixel SPX2, and the third light emitting element may be disposed on the display element layer DPL of the third sub-pixel SPX3.

The first light emitting element LD1 may include a first pixel electrode PE1 (anode electrode or first electrode), a first light emitting layer EML1, and a common electrode CE (cathode electrode or second electrode). The second light emitting element LD2 may include a second pixel electrode PE2 (anode electrode or first electrode), a second light emitting layer EML2, and a common electrode CE (cathode electrode or second electrode). The third light emitting element may include a third pixel electrode PE3 (anode electrode or first electrode), a third light emitting layer (refer to "EML3" in FIG. 3), and a common electrode CE (cathode electrode or second electrode).

The first pixel electrode PE1 may be electrically connected to the third connection pattern CPN3 through the first contact portion CNT1. The second pixel electrode PE2 may be electrically connected to the seventh connection pattern CNP7 through the second contact portion CNT2.

Each of the first pixel electrode PE1, the second pixel electrode PE2, and the third pixel electrode PE3 may be made of a conductive material (or substance). The conductive material may include an opaque metal. The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. However, the materials of each of the first pixel electrode PE1, the second pixel electrode PE2, and the third pixel electrode PE3 are not limited to the above-described embodiment. According to embodiments, the first pixel electrode PE1, the second pixel electrode PE2, and the third pixel electrode PE3 may include a transparent conductive material (or substance). The transparent conductive material (or substance) may include a conductive oxide such as indium tin oxide (ITO), indium zinc oxide (IZO), zinc oxide (ZnO), indium gallium zinc oxide (IGZO), and indium tin zinc oxide (ITZO), and a conductive polymer such as poly(3,4-ethylenedioxythiophene) (PEDOT). In case that the first pixel electrode PE1, the second pixel electrode PE2, and the third pixel electrode PE3 include a transparent conductive material (or substance), a separate conductive layer made of an opaque metal to reflect light emitted from the first light emitting layer EML1, the second light emitting layer EML2, and the third light emitting layer EML3 in an image display direction of the display device DD (or in an upper direction of the encapsulation layer TFE), may be added. For example, each of the first, second, and third pixel electrodes PE1, PE2, and PE3 may be formed of a triple layer made of ITO/Ti/ITO.

The first pixel electrode PE1 may be disposed in at least the first emission area EMA1, the second pixel electrode PE2 may be disposed in at least the second emission area EMA2, and the third pixel electrode PE3 may be disposed in at least the third emission area (refer to "EMA3" in FIG. 3).

The pixel definition layer PDL may be provided on the pixel circuit layer PCL in the non-emission area NEA, and may be define (or partition) the first emission area EMA1, the second emission area EMA2, and the third emission area EMA3. The pixel definition layer PDL may include an organic insulation layer formed of organic material. The organic material may include acrylic resin, epoxy resin, phenolic resin, polyamide resin, polyimide resin, and the like. According to embodiments, the pixel definition layer PDL may include a light absorbing material or may be coated with a light absorbing material to absorb light introduced from the outside. For example, the pixel definition layer PDL may include a carbon-based black pigment, but is not limited thereto.

The pixel definition layer PDL may include an opening exposing one region of each of the first pixel electrode PE1, the second pixel electrode PE2, and the third pixel electrode PE3, and may protrude from the via layer VIA in the third direction DR3 along a circumference of each of first to third emission areas (EMA1, EMA2, and EMA3).

The first light emitting layer EML1 may be disposed on the first pixel electrode PE1 exposed by one opening of the pixel definition layer PDL, the second light emitting layer EML2 may be disposed on the second pixel electrode PE2 exposed by another opening of the pixel definition layer PDL, and the third light emitting layer EML3 may be disposed on the third pixel electrode PE3 exposed by the other opening of the pixel definition layer PDL.

The first light emitting layer EML1 may be disposed only on the first pixel electrode PE1 within one opening of the pixel definition layer PDL, the second light emitting layer EML2 may be disposed only on the second pixel electrode PE2 within the another opening of the pixel definition layer PDL, and the third light emitting layer EML3 may be disposed only on the third pixel electrode PE3 within the other opening of the pixel definition layer PDL. Each of the first light emitting layer EML1, the second light emitting layer EML2, and the third light emitting layer EML3 may be disposed on a target area (e.g., pixel electrode exposed by the opening of the pixel definition layer PDL) of the corresponding sub-pixel by an inkjet printing method or the like, but is not limited thereto.

Each of the first light emitting layer EML1, the second light emitting layer EML2, and the third light emitting layer EML3 may include a light generation layer that generates light. For example, the first light emitting layer EML1 may include a light generating layer that generates and emits red light, the second light emitting layer EML2 may include a light generating layer that generates and emits green light, and the third light emitting layer EML3 may include a light generating layer that generates and emits blue light, but is not limited thereto. According to embodiments, each of the first light emitting layer EML1, the second light emitting layer EML2, and the third light emitting layer EML3 may include a light generating layer that generates and emits white light or blue light, and in this case, a color conversion layer for converting the white light or the blue light (e.g., first color light) into a specific color light (e.g., second color light) may be provided.

A control layer COL and a common electrode CE may be disposed on the first and second light emitting layers EML1 and EML2 and the pixel definition layer PDL.

The control layer COL may be disposed between each of the first and second pixel electrodes PE1 and PE2 and the common electrode CE. The control layer COL may be disposed above and/or below each of the first and second light emitting layers EML1 and EML2. The control layer COL can improve light emitting efficiency and lifetime of the first and second light emitting elements LD1 and LD2 by controlling a movement of charges. The control layer COL may include at least one of a hole transport material, a hole injection material, an electron transport material, and an electron injection material. In FIG. 9, the control layer COL is illustrated as being disposed between each of the first and second light emitting layers EML1 and EML2 and the common electrode CE, but is not limited thereto. According to embodiments, the control layer COL may further be disposed between the first light emitting layer EML1 and the first pixel electrode PE1 and between the second light emitting layer EML2 and the second pixel electrode PE2. The control layer COL may be provided as a plurality of layers stacked in the third direction DR3 with the first and second light emitting layers EML1 and EML2 interposed therebetween. The control layer COL may be commonly provided to the first to third sub-pixels SPX1, SPX2, and SPX3.

A common electrode CE may be disposed on the first and second light emitting layers EML1 and EML2 on the common electrode CE. The common electrode CE may be provided in common to the first to third sub-pixels SPX1, SPX2, and SPX3. The common electrode CE may be provided in a plate shape over the entire area of the display area DA, but is not limited thereto. The common electrode CE may be a thin metal layer having a thickness sufficient to transmit light emitted from the first and second light emitting layers EML1 and EML2. The common electrode CE may be formed of a metal material or a transparent conductive material to have a relatively thin thickness. For example, the common electrode CE may include at least one of various transparent conductive materials including indium tin oxide, indium zinc oxide, indium tin zinc oxide, aluminum zinc oxide, gallium zinc oxide, zinc tin oxide, or gallium tin oxide, and it may be implemented as substantially transparent or translucent to satisfy a predetermined light transmittance. Accordingly, light emitted from each of the first and second light-emitting layers EML1 and EML2 disposed under the common electrode CE may pass through the common electrode CE and be emitted in the upper direction of the encapsulation layer TFE.

Although not directly shown in the drawing, the common electrode CE may be electrically connected to the fourth power line (refer to "PL4" in FIG. 4). Accordingly, the common electrode CE may receive the same voltage as that of the dummy line DML and the dummy pattern DMP, for example, the second power voltage VSS (or low potential voltage).

The encapsulation layer TFE may include a first encapsulation layer ENC1, a second encapsulation layer ENC2, and a third encapsulation layer ENC3 sequentially disposed on the common electrode CE. The first encapsulation layer ENC1 may be formed on the display element layer DPL (or common electrode CE) and may be disposed over at least a portion of the display area DA and the non-display area NDA. The second encapsulation layer ENC2 may be formed on the first encapsulation layer ENC1 and may be disposed over at least a portion of the display area DA and the non-display area NDA. The third encapsulation layer ENC3 may be formed on the second encapsulation layer ENC2 and may be disposed over at least a portion of the display area DA and the non-display area NDA. According to embodiments, the third encapsulation layer ENC3 may be disposed over the entirety of the display area DA and the non-display area NDA.

Each of the first and third encapsulation layers ENC1 and ENC3 may be formed of an inorganic layer including an inorganic material, and the second encapsulation layer ENC2 may be formed of an organic layer including an organic material. The inorganic layer may include, for example, silicon nitride (SiNx), silicon oxide (SiOx), or silicon oxynitride (SiOxNy). The organic layer may include an organic insulating material such as acrylic resin, epoxy resin, phenolic resin, polyamides resin, polyimides resin, unsaturated polyesters resin, polyphenyleneethers resin, polyphenylenesulfides resin, or benzocyclobutene (BCB).

According to embodiments, a color filter layer and/or a color conversion layer for emitting light emitted from the first and second light emitting elements LD1 and LD2 as light having excellent color reproducibility, may be selectively provided and/or formed on the encapsulation layer TFE.

Hereinafter, the dummy pattern DMP disposed in the dummy area DMA will be described in detail with reference to FIGS. 10 to 17.

FIGS. 10 to 17 are schematic cross-sectional views taken along a line II-II' of FIG. 6.

Figure 10:
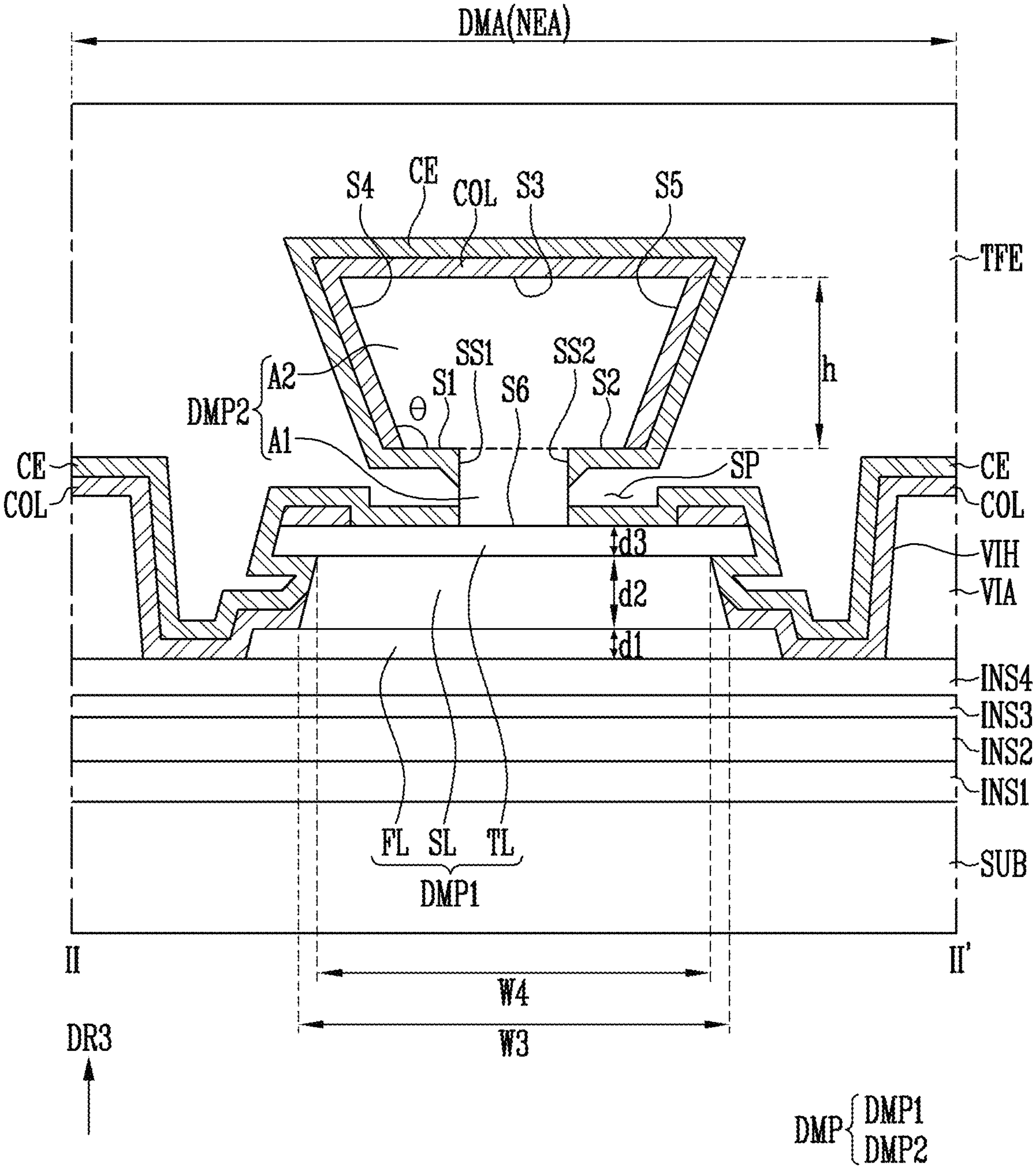
FIGS. 10, 11, 12, 13, 14, 15, 16 and 17 are schematic cross-sectional views taken along a line II-II' of FIG. 6.

FIGS. 11 to 17 show modified examples of FIG. 10 in relation to the shape of the dummy pattern DMP.

In order to avoid overlapping description with respect to the embodiments of FIGS. 10 to 17, differences from the above-described embodiment will be mainly described.

Referring to FIGS. 5 to 17, the dummy pattern DMP may be disposed on the fourth insulating layer INS4 in the dummy area DMA (or non-emission area NEA).

The dummy pattern DMP may include a first dummy pattern DMP1 and a second dummy pattern DMP2 disposed on the first dummy pattern DMP1. The first dummy pattern DMP1 and the second dummy pattern DMP2 may include different materials. For example, the first dummy pattern DMP1 may be a conductive pattern including a conductive material, and the second dummy pattern DMP2 may be an organic pattern including an organic material.

In an embodiment, the first dummy pattern DMP1 may include the fourth conductive layer CL4. The first dummy pattern DMP1 may include a first layer FL, a second layer SL, and a third layer TL sequentially stacked in the third direction DR3. The first layer FL may be disposed on the fourth insulating layer INS4, the second layer SL may be disposed on the first layer FL, and the third layer TL may be disposed on the second layer SL.

The first layer FL and the third layer TL may include the same material as each other. For example, the first layer FL and the third layer TL may include titanium. The first layer FL may include the same material as the first metal layer ML1 of each of the third and seventh connection patterns CNP3 and CNP7 and may be disposed on the same layer. The third layer TL may include the same material as the third metal layer ML3 of each of the third and seventh connection patterns CNP3 and CNP7 and may be disposed on the same layer. The second layer SL may include a conductive material having material characteristics different from those of the first and third layers FL and TL. For example, the second layer SL may include aluminum. The second layer SL may include the same material as the second metal layer ML2 of each of the third and seventh connection patterns CNP3 and CNP7 and may be disposed on the same layer.

The first layer FL may have a first thickness d1 (or first height) in the third direction DR3, the second layer SL may have a second thickness d2 (or second height) in the third direction DR3, and the third layer TL may have a third thickness d3 (or third height) in the third direction DR3.

The first thickness d1, the second thickness d2, and the third thickness d3 may be different from each other. The second thickness d2 may be thicker than the first thickness d1 and the third thickness d3. For example, the first thickness d1 may be about 700 Å, the second thickness d2 may be about 6000 Å, and the third thickness d3 may be about 300 Å, but is not limited thereto.

The second layer SL may include a lower surface directly contacting the first layer FL and an upper surface directly contacting the third layer TL. The second layer SL may have a polygonal shape, for example, a trapezoidal shape, the width of which decreases from the lower surface toward the upper surface. The width W3 of the lower surface of the second layer SL may be about 10 μm to about 13 μm, and the width W4 of the upper surface of the second layer SL may be about 9 μm, but is not limited thereto. A side surface of the second layer SL may be recessed from a side surface of each of the first and third layers FL and TL. In this case, each of the first and third layers FL and TL may protrude from the side surface of the second layer SL. In particular, the second layer SL may have an undercut portion which is recessed from side surfaces of the first layer FL and the third layer TL in a cross-sectional view.

The second dummy pattern DMP2 may be disposed on the first dummy pattern DMP1. For example, the second dummy pattern DMP2 may be disposed on the third layer TL of the first dummy pattern DMP1.

The second dummy pattern DMP2 may include a lower surface S6 and an upper surface S3 facing each other in the third direction DR3. The lower surface S6 may be disposed on the third layer TL of the first dummy pattern DMP1 and may directly contact the third layer TL.

In an embodiment, the second dummy pattern DMP2 may include a first portion A1 and a second portion A2.

The first portion A1 may have a smaller area (or size) than that of the second portion A2 and may have a square shape, but is not limited thereto. The first portion A1 may include a first side surface SS1 and a second side surface SS2 facing each other, and a lower surface S6 connected to the first side surface SS1 and the second side surface SS2 in a cross-sectional view. The lower surface S6 may be the lower surface S6 of the second dummy pattern DMP2.

The second portion A2 may have a larger area (or size) than that of the first portion A1 and may have a polygonal shape. For example, the second portion A2 may have an reverse tapered shape (or inverted trapezoidal shape), the width of which increases toward the top in the third direction DR3. The second portion A2 may have a greater height in the third direction DR3 than that of the first portion A1. Accordingly, the second dummy pattern DMP2 may have an overhang structure. The height h of the second portion A2 in the third direction DR3 may be about 1 μm to about 1.5 μm, but is not limited thereto.

Figure 11:
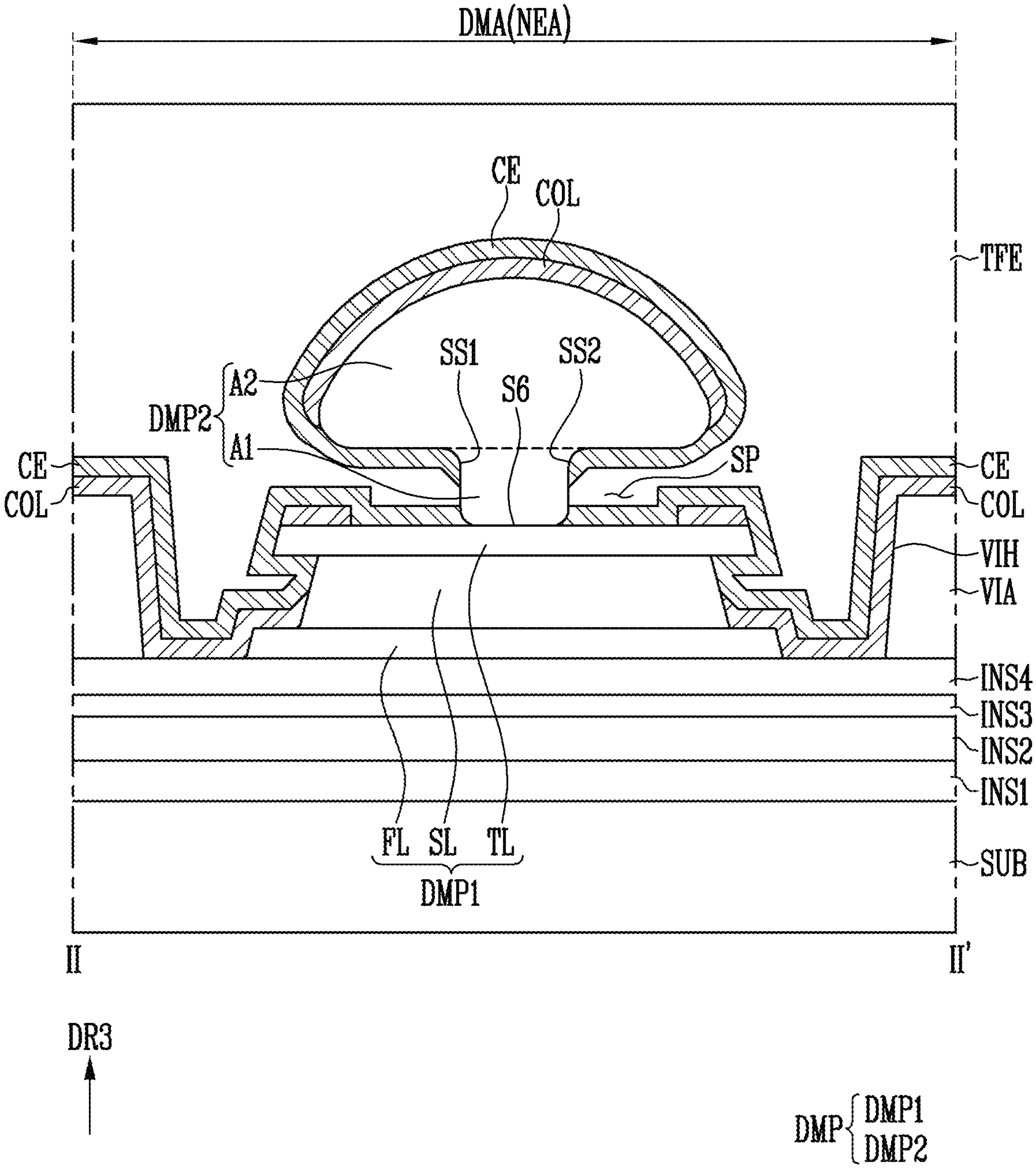

The second portion A2 may include a third side surface S4 and a fourth side surface S5 facing each other, and an upper surface S3 connected to the third side surface S4 and the fourth side surface S5. The upper surface S3 may be the upper surface S3 of the second dummy pattern DMP2. Also, the second portion A2 may include a first lower surface S1 and a second lower surface S2. The first lower surface S1 may face the upper surface S3 and may connect the third side surface S4 and the first side surface SS1 of the first portion A1. The second lower surface S2 may face the upper surface S3 and may connect the fourth side surface S5 and the second side surface SS2 of the first portion A1. The second portion A2 may be provided in a polygonal shape including straight lines, but is not limited thereto. According to embodiments, the second portion A2 may be provided in a shape including at least one curved surface, for example, a mushroom shape, as shown in FIG. 11. Also, as shown in FIG. 11, the first portion A1 disposed under the second portion A2 may have a shape including at least one curved surface.

An inclination angle θ between the third side surface S4 and the first lower surface S1 (hereinafter referred to as "first inclination angle") may be from about 90° to about 130°, but is not limited thereto. For example, the first inclination angle θ may be 120°. An inclination angle between the fourth side surface S5 and the second lower surface S2 may be the same as the first inclination angle θ, but is not limited thereto.

In an embodiment, the first side surface SS1 of the first portion A1 may be disposed inside the third side surface S4 of the second portion A2 in a plan view, and the second side surface SS2 of the first portion A1 may be disposed inside the fourth side surface S5 of the second portion A2 in a plan view. In other words, the second portion A2 may protrude from each of the first and second side surfaces SS1 and SS2 of the first portion A1. For example, in case that viewed from the first and second side surfaces SS1 and SS2 of the first portion A1, the first portion A1 may have an undercut portion or the second portion may have eaves). In this case, as the second portion A2 relatively protrudes from the side surface of the first portion A1, a undercut portion SP (or depression portion) may be formed in the side surface of the second dummy pattern DMP2. The undercut portion SP may be surrounded by the first lower surface S1 of the second portion A2, the first side surface SS1 of the first portion A1, and the third layer TL of the first dummy pattern DMP1. In addition, the undercut portion SP may be surrounded by the second lower surface S2 of the second portion A2, the second side surface SS2 of the first portion A1, and the third layer TL of the first dummy pattern DMP1.

In an embodiment, the second dummy pattern DMP2 may include an organic material. For example, the second dummy pattern DMP2 may include a negative photosensitive material. In this case, in the process of forming the second dummy pattern DMP2 on the first dummy pattern DMP1 made of a conductive material, an adhesion between the first dummy pattern DMP1 and the second dummy patterns DMP2 may be weakened depending on material properties of each of the first and second dummy patterns DMP1 and DMP2, so the second dummy pattern DMP2 may have a reverse tapered shape. Accordingly, the second dummy pattern DMP2 may have an overhang structure in which the second portion A2 having a relatively large area is disposed on the first portion A1 having a relatively small area. That is, the first side surface SS1 of the first portion A1 may be disposed inside the third side surface S4 of the second portion A2, and the second side surface SS2 of the first portion A1 may be disposed inside the fourth side surface S5 of the second portion A2 in a plan view. In this case, the second portion A2 may protrude from the first and second side surfaces SS1 and SS2 of the first portion A1.

The first dummy pattern DMP1 may be exposed to the outside through the via hole VIH of the via layer VIA.

A control layer COL may be disposed on the dummy pattern DMP. The control layer COL may be the control layer COL described with reference to FIG. 9.

A portion of the control layer COL commonly provided to the first to third sub-pixels SPX1, SPX2, and SPX3 may be disconnected in areas corresponding to the undercut portions SP of the dummy pattern DMP, for example, undercut portions of the first dummy pattern DMP1 and undercut portions of the second dummy pattern DMP2. The disconnected portion may be a portion in which the control layer COL is not continuously formed due to the undercut portions SP in the via hole VIH.

The control layer COL may be formed on the dummy pattern DMP by an inkjet printing method. As the second portion A2 protrudes from the first portion A1 and has a reverse tapered shape, the control layer COL may be formed only on the upper surface S3, third and fourth side surfaces S4 and S5 of the second portion A2, and may not be formed on the first portion A1. That is, since the first portion A1 and the undercut portion SP are covered by the second portion A2, the control layer COL may be formed only on the upper surface S3, third and fourth side surfaces S4 and S5 of the second portion A2 that is exposed.

In the first dummy pattern DMP1, as the third layer TL protrudes from the second layer SL, the control layer COL may be formed only on a portion of the upper surface of the third layer TL, on a lower side surface of the second layer SL, and the first layer FL, and may not be formed on a region of the upper surface of the third layer TL contacting the first portion A1 and on an upper side surface of the second layer SL. That is, a portion of the third layer TL may be covered by the second dummy pattern DMP2, and a portion of the second layer SL may be covered by the third layer TL, so that the control layer COL may be formed only on a portion of the upper surface of the third layer TL, on the lower side surface of the second layer SL, and on the first layer FL that are exposed.

Accordingly, the control layer COL may be separated (or disconnected) by the undercut portions of the first and second dummy patterns DMP1 and DMP2 in the via hole VIH.

A common electrode CE may be disposed on the control layer COL. The common electrode CE may be the common electrode CE described with reference to FIG. 9.

The common electrode CE provided in common to the first to third sub-pixels SPX1, SPX2, and SPX3 may be formed on the control layer COL by a sputtering method. In addition, the common electrode CE may be formed on the first and second side surfaces SS1 and SS2 of the first portion A1, on the upper surface of the third layer TL, and on the upper side surface of the second layer SL on which the control layer COL is not formed. In this case, the common electrode CE formed on the second portion A2 and the common electrode CE formed on the first portion A1 may be disconnected (or separated) from each other.

Since the common electrode CE is formed by the sputtering method, a motion direction of particles may be randomized depending on process conditions. Therefore, the common electrode CE may be formed while being relatively less affected by a difference in incident angle and/or a process dispersion depending on a disposition of the pixels PXL (or display panel DP) than the control layer COL formed by the inkjet method or the like. Accordingly, the common electrode CE may also be formed on a region of the first dummy pattern DMP1 exposed to the outside by the disconnected portions of the control layer COL. In this case, a contact area between the conductive first dummy pattern DMP1 and the common electrode CE may increase. As the contact area between the first dummy pattern DMP1 and the common electrode CE increases, a contact resistance of the common electrode CE improves, thereby improving the reliability of the display device (refer to “DD” in FIG. 1).

In addition, in the above-described embodiment, a process such as laser drilling for electrically connecting the cathode electrode and the driving power line may be omitted, and the common electrode CE and the first dummy pattern DMP1 may be electrically connected, thereby increasing manufacturing efficiency of the display device DD.

An encapsulation layer TFE may be disposed on the dummy pattern DMP. The encapsulation layer TFE may be the encapsulation layer TFE described with reference to FIG. 9.

Figure 12:
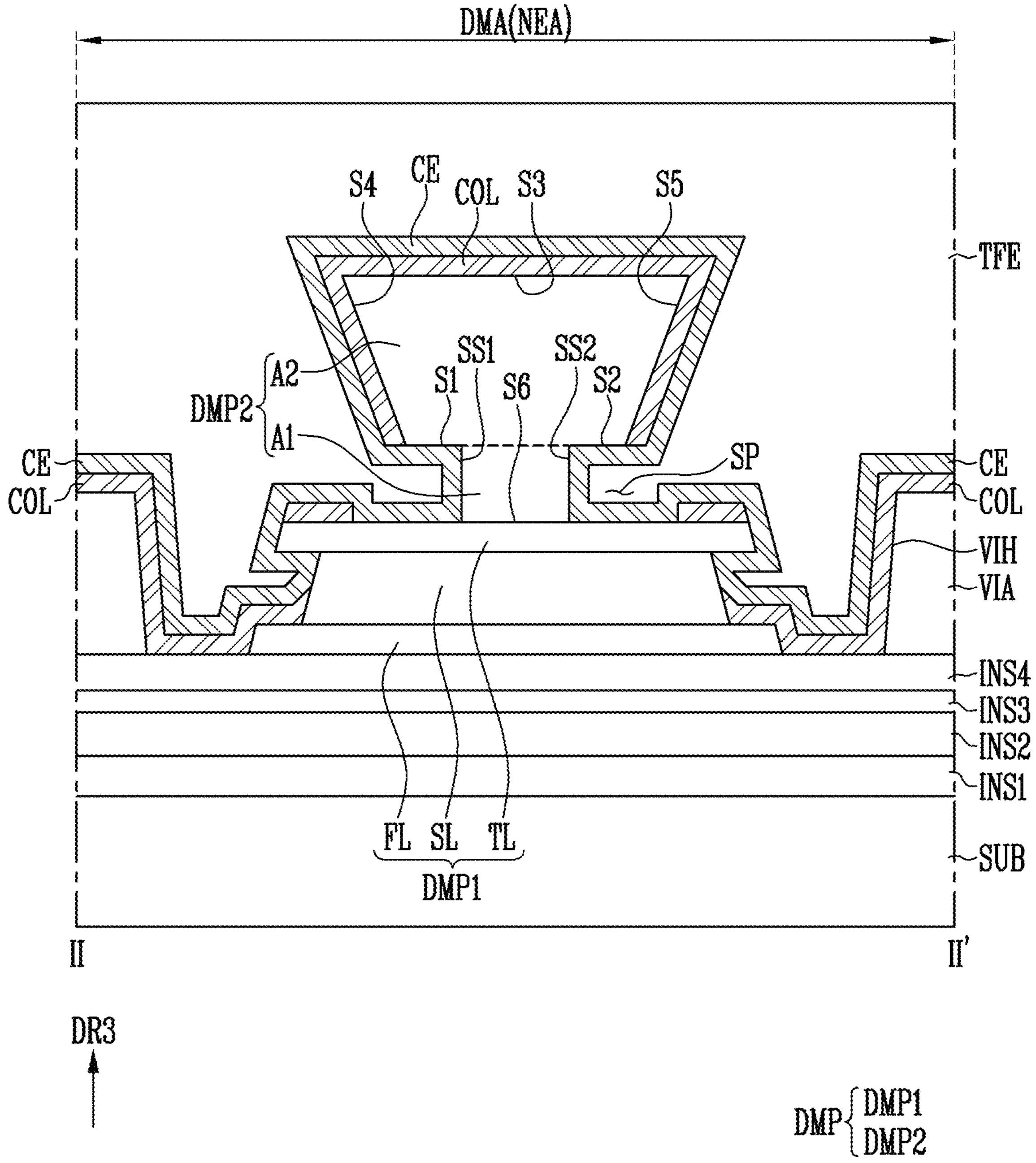

According to embodiments, the common electrode CE may be also formed in the undercut portion SP without being disconnected in the undercut portion SP. For example, as shown in FIG. 12, the common electrode CE may be formed on the first and second side surfaces SS1 and SS2 of the first portion A1 to surround the second dummy pattern DMP2 as a whole. In this case, the common electrode CE formed on the second dummy pattern DMP2 may be connected without being separated (or disconnected) from the common electrode CE disposed on the first dummy pattern DMP1.

Accordingly, the contact resistance of the common electrode CE may be further improved.

Figure 13:
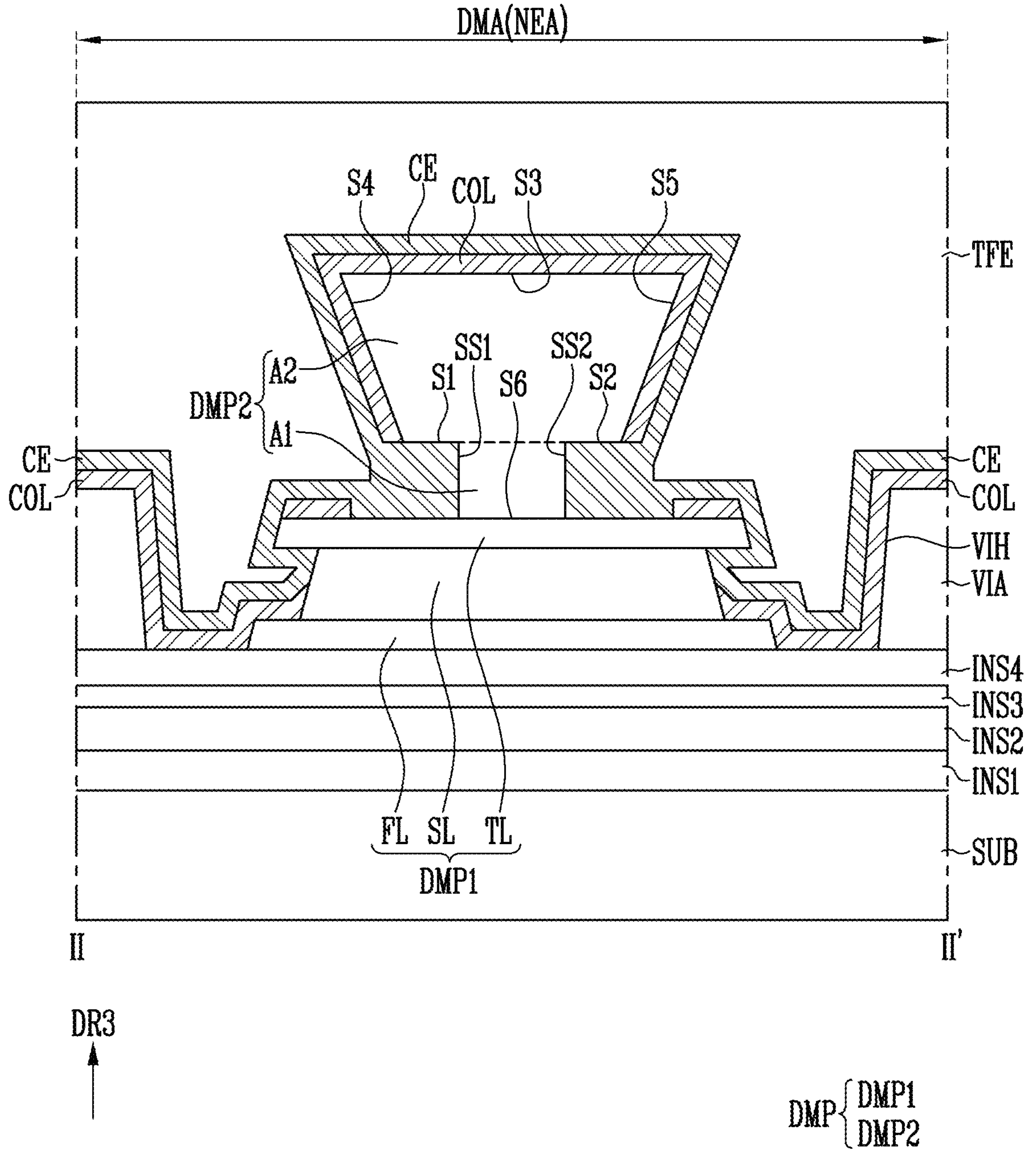

According to embodiments, the common electrode CE may be provided in a form that entirely fills the undercut portion SP. For example, as shown in FIG. 13, the common electrode CE may be provided in a form that entirely fills the undercut portion SP surrounded by the first side surface SS1 of the first portion A1, the first lower surface S1 of the second portion A2, and the upper surface of the third layer TL, and the undercut portion surrounded by the second side surface SS2 of the first portion A1, the second lower surface S2 of the second portion A2, and the upper surface of the third layer TL. In this case, the common electrode CE formed on the second dummy pattern DMP2 may be connected without being separated from the common electrode CE disposed on the first dummy pattern DMP1. In addition, as the common electrode CE is provided in a form that entirely fills the undercut portion SP of the dummy pattern DMP, the area of the common electrode CE contacting the first dummy pattern DMP1 may further increase, so that the contact resistance CE of the common electrode can be further improved.

Figure 14:
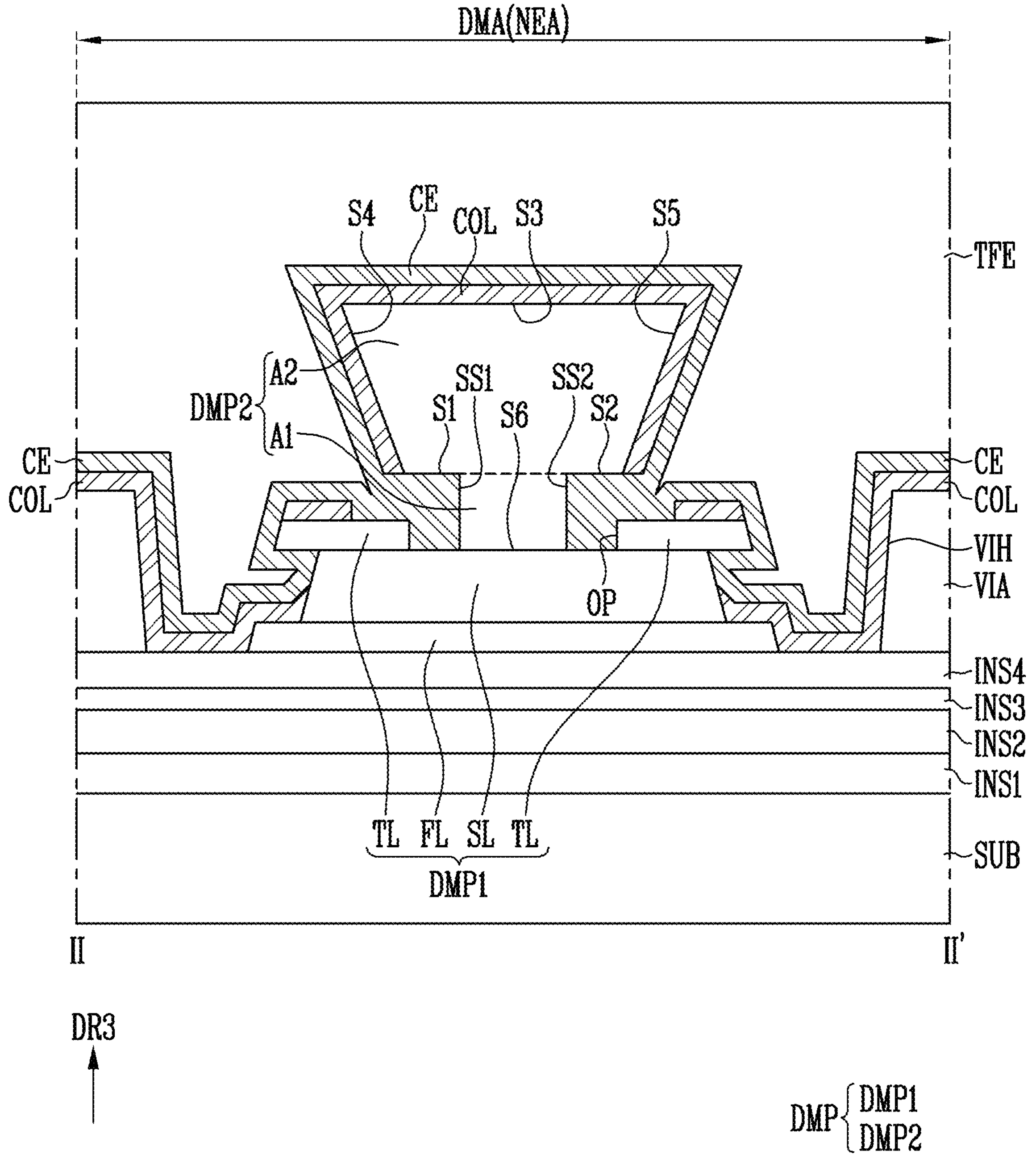

An embodiment in which contact resistance of the common electrode CE is further improved by further securing a contact area between the common electrode CE and the second layer SL of the first dummy pattern DMP1 may be considered. For example, as shown in FIG. 14, since the third layer TL of the first dummy pattern DMP1 includes the opening OP, the third layer TL may expose the upper surface of the second layer SL disposed thereunder to the outside. In this case, in the process of forming the common electrode CE, the common electrode CE may directly contact the second layer SL exposed through the opening OP of the third layer TL. Since the second layer SL made of aluminum has a relatively smaller resistivity than the third layer TL made of titanium, in case that the second layer SL and the common electrode CE come into direct contact, the contact resistance of the common electrode CE can be further improved.

Figure 15:
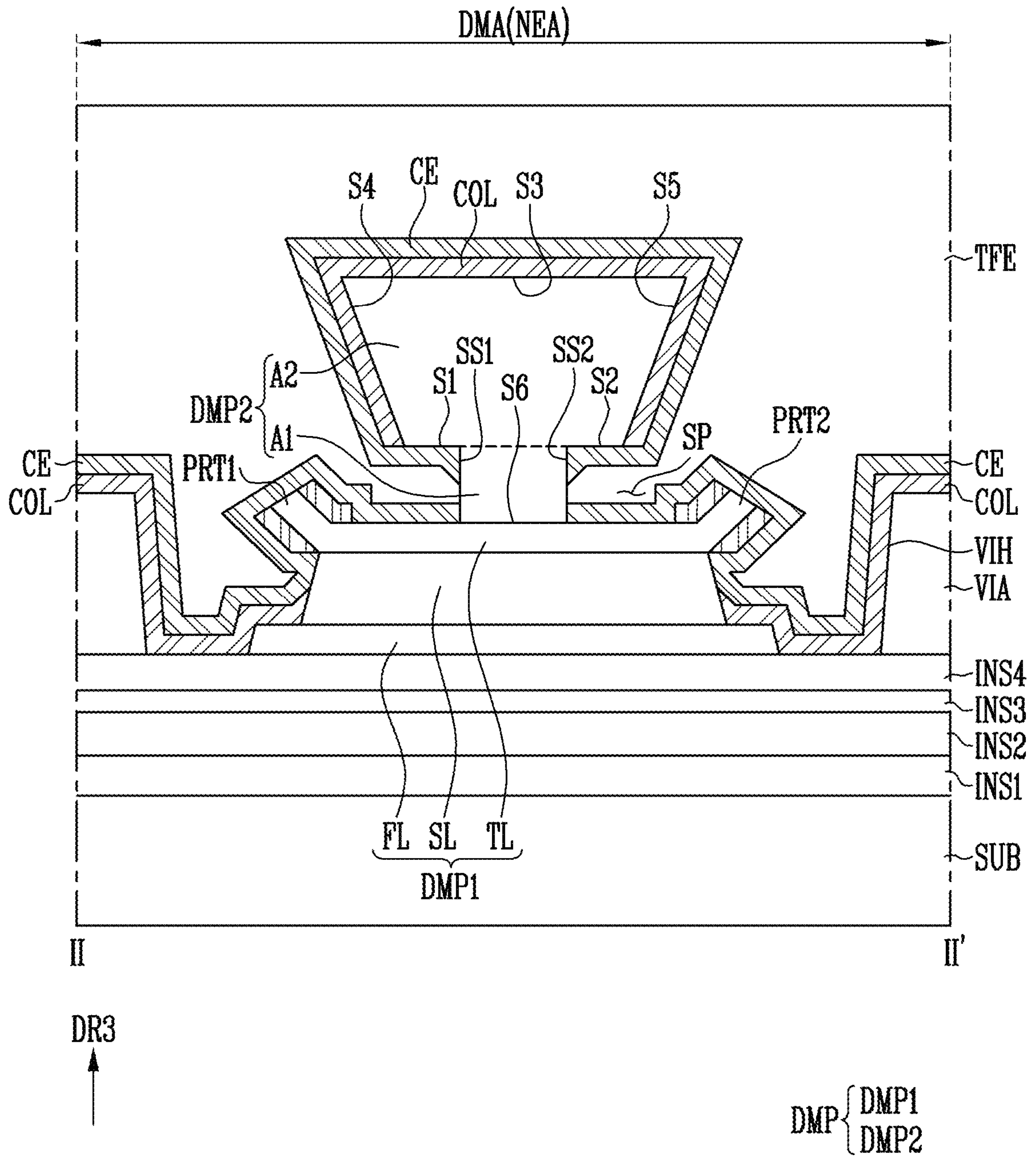

According to an embodiment, the third layer TL of the first dummy pattern DMP1 may include a first protrusion PRT1 and a second protrusion PRT2 as shown in FIG. 15. The first protrusion PRT1 and the second protrusion PRT2 may be formed by wet etching the second layer SL after simultaneously etching the first layer FL, the second layer SL, and the third layer TL. For example, in the wet etching, when over-etching may be performed for more than 100 seconds using a phosphate-based aluminum etchant, the first protrusion PRT1 and the second protrusion PRT2 may be formed. The first protrusion PRT1 and the second protrusion PRT2 may protrude in a direction toward the second dummy pattern DMP2. For example, the first and second protrusions PRT1 and PRT2 may protrude toward the second dummy pattern DMP2 in a direction inclined to the third direction DR3. As the third layer TL includes the first and second protrusions PRT1 and PRT2, the undercut shape of the third layer TL may be further maximized. In this case, the area of the disconnected portions of the control layer COL formed on the first dummy pattern DMP1 may further increase, so that the exposed area of the first dummy pattern DMP1 may increase. Accordingly, a contact area between the common electrode CE and the first dummy pattern DMP1 may be further secured to prevent a voltage drop of the common electrode CE.

Figure 16:
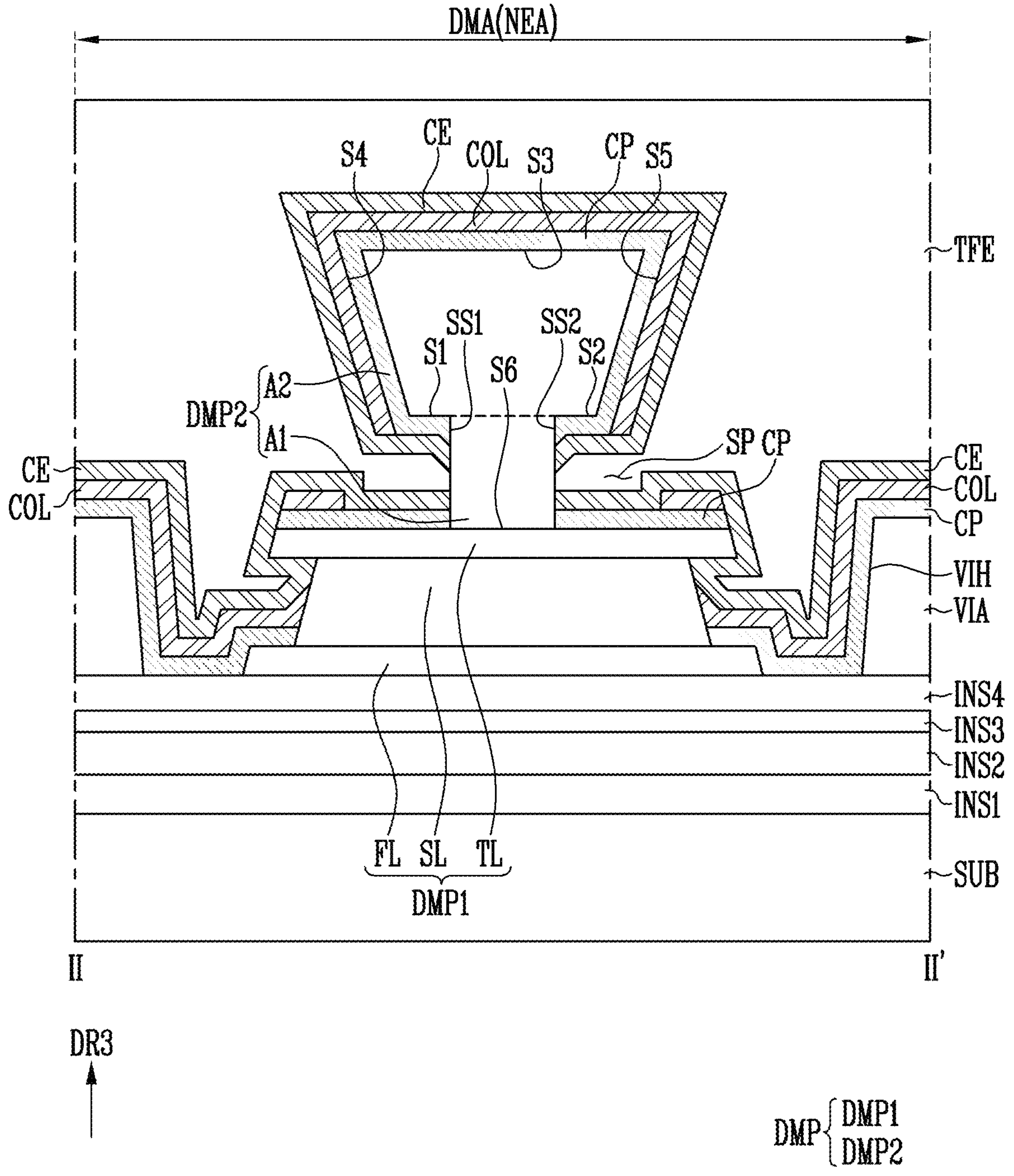

According to embodiments, a separate conductive layer may be disposed on the first dummy pattern DMP1 and the second dummy pattern DMP2. For example, as shown in FIG. 16, a conductive pattern CP may be disposed on the first dummy pattern DMP1 and the second dummy pattern DMP2. The conductive pattern CP may be formed through the same process as the first and second pixel electrodes PE1 and PE2 described with reference to FIG. 9 and may include the same material. For example, the conductive pattern CP may be made of a transparent conductive oxide.

The conductive pattern CP may be formed on the second portion A2 of the second dummy pattern DMP2 to entirely surround the second portion A2, and may be formed on the upper and lower ends of the first and second side surfaces SS1 and SS2 of the first portion A1 of the second dummy pattern DMP2. The conductive pattern CP may not be formed on a middle portion of each of the first and second side surfaces SS1 and SS2 of the first portion A1 covered by the second portion A2, but is limited thereto. According to embodiments, the conductive pattern CP may also be formed on a middle portion of each of the first and second side surfaces SSI and SS2 of the first portion A1.

The conductive pattern CP may be formed on the first dummy pattern DMP1. For example, the first dummy pattern DMP1 may be formed on an upper surface of the third layer TL, a lower side surface of the second layer SL, and a side surface of the first layer FL. The conductive pattern CP made of a transparent conductive oxide may be disposed on the first and third layers FL and TL made of titanium and the second layer SL made of aluminum, so that the first to third layers FL, SL, and TL can be covered to prevent oxidation that may occur due to material characteristics of each layer. In addition, the conductive pattern CP may be disposed between the common electrode CE and the first dummy pattern DMP1 and may be electrically connected to the common electrode CE and the first dummy pattern DMP1. Accordingly, the contact resistance of the common electrode CE may be further improved.

Figure 17:
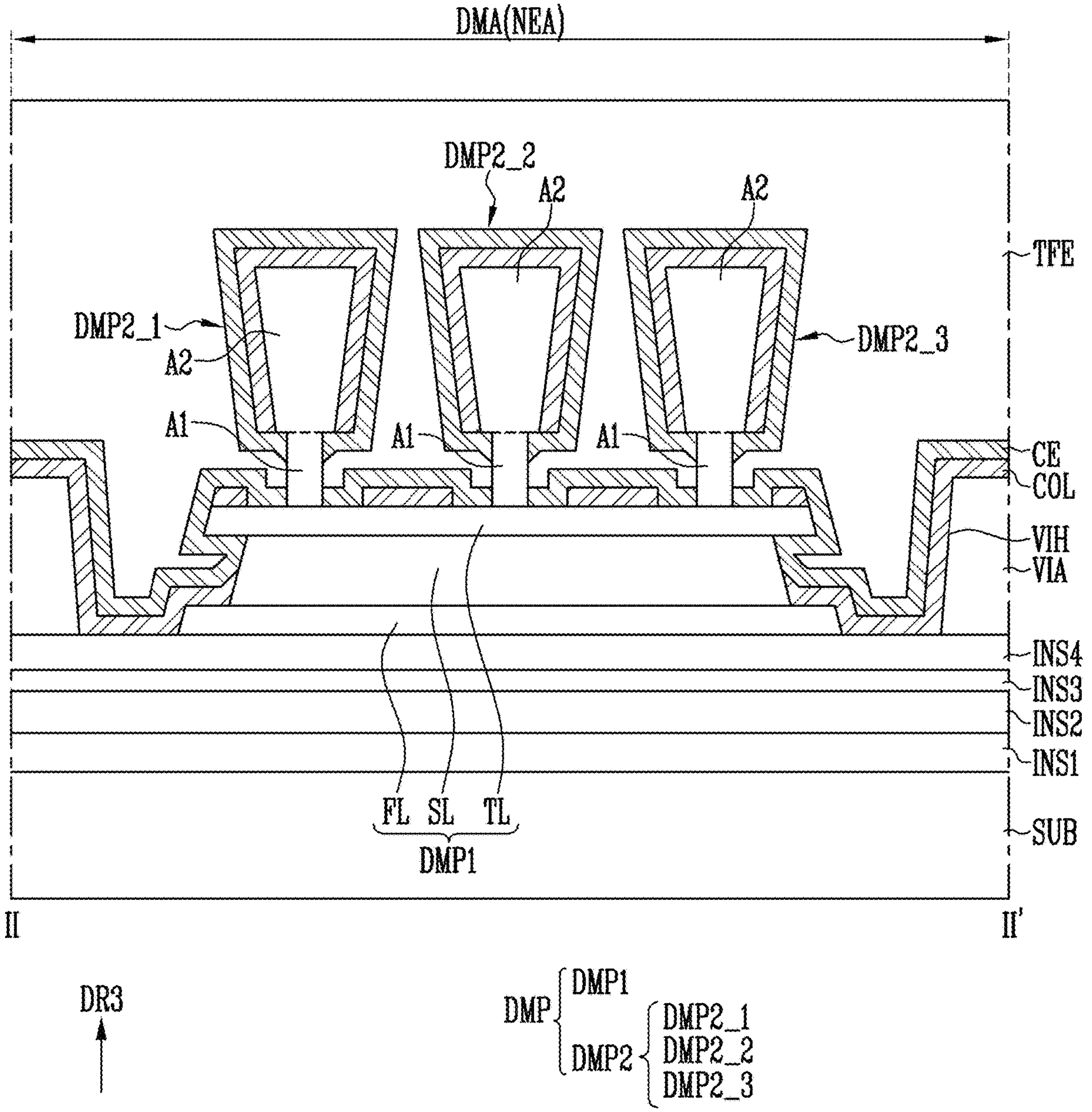

According to embodiments, a plurality of second dummy patterns DMP2 may be provided. For example, as shown in FIG. 17, the second dummy pattern DMP2 may include a 2-1st dummy pattern DMP2_1, a 2-2nd dummy pattern DMP2_2, and a 2-3rd dummy pattern DMP2_3 that are disposed on the third layer TL of the first dummy pattern DMP1. Each of the 2-1st, 2-2nd, and 2-3rd dummy patterns DMP2_1, DMP2_2, and DMP2_3 may include a first portion A1 and a second portion A2.

The 2-1st dummy pattern DMP2_1, the 2-2nd dummy pattern DMP2_2, and the 2-3rd dummy pattern DMP2_3 may be spaced apart from each other on the third layer TL. In this case, the control layer COL may include disconnected portions between the 2-1st dummy pattern DMP2_1 and the 2-2nd dummy pattern DMP2_2 and between the 2-2nd dummy pattern DMP2_2 and the 2-3rd dummy pattern DMP2_3. That is, the control layer COL may be formed on a portion of the upper surface of the third layer TL disposed between the 2-1st dummy pattern DMP2_1 and the 2-2nd dummy pattern DMP2_2, and may be formed on a portion of the upper surface of the third layer TL disposed between the 2-2nd dummy pattern DMP2_2 and the 2-3rd dummy pattern DMP2_3. The common electrode CE may be formed on the control layer COL to cover the control layer COL, and may also be formed on the upper surface of the third layer TL of the first dummy pattern DMP1 exposed to the outside because the control layer COL is not formed. Accordingly, a contact area between the common electrode CE and the first dummy pattern DMP1 may be further secured to prevent a voltage drop of the common electrode CE, thereby further improving reliability of the display device DD.

In the above-described embodiment, it has been described that the second dummy pattern DMP2 is formed on the first dummy pattern DMP1 and disposed only in the dummy area DMA, but is not limited thereto. A description thereof will be described later with reference to FIG. 18.

Figure 18:
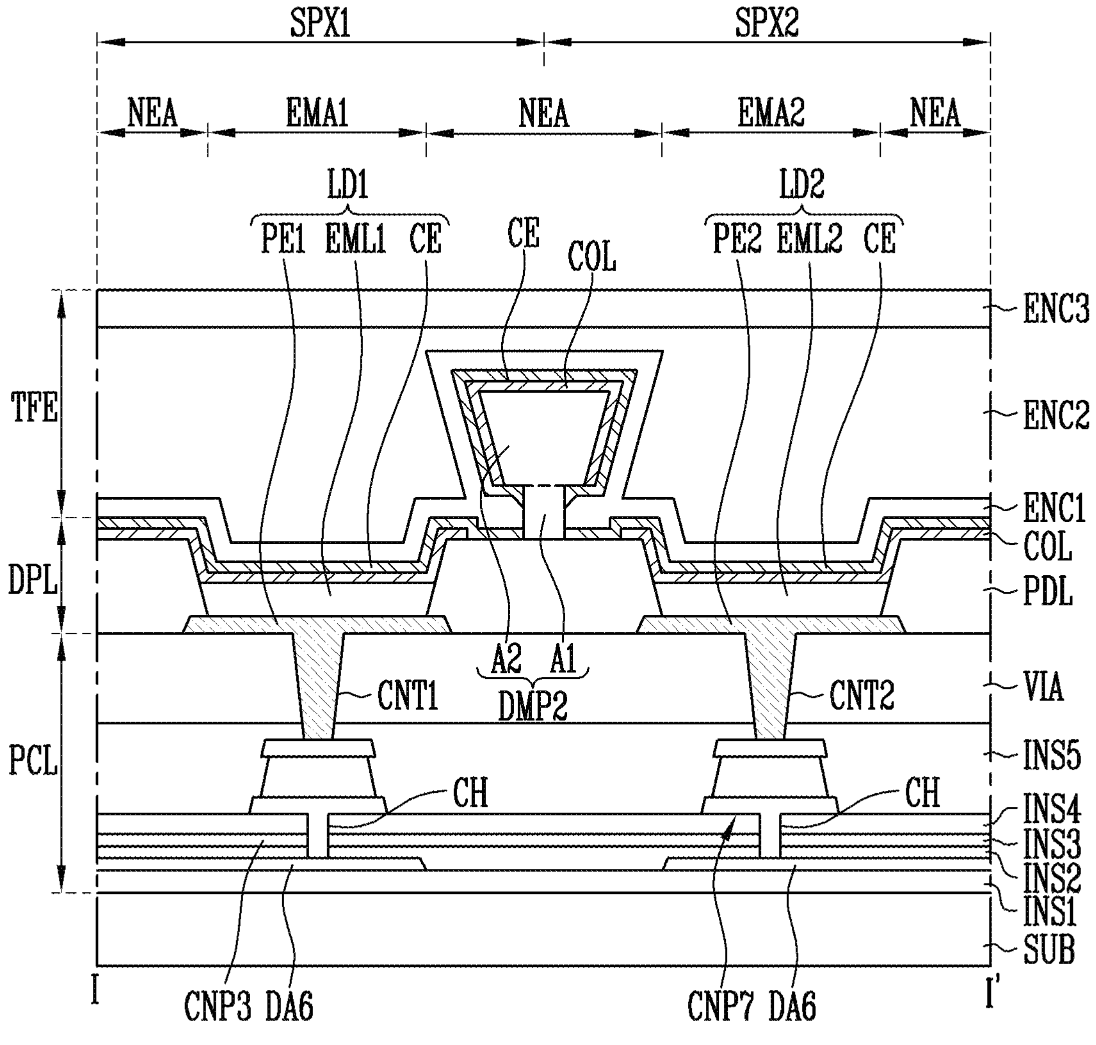
FIG. 18 illustrates a pixel according to an embodiment and is a schematic cross-sectional view corresponding to a line I-I' of FIG. 6.

FIG. 18 illustrates a pixel according to an embodiment and is a schematic cross-sectional view corresponding to a line I-I' of FIG. 6.

In order to avoid overlapping descriptions with respect to the embodiment of FIG. 18, differences from the above-described embodiment will be mainly described.

Referring to FIGS. 1 to 5 and 18, the second dummy pattern DMP2 may be disposed in the non-emission area NEA disposed between the first and second sub-pixels SPX1 and SPX2.

The second dummy pattern DMP2 may be disposed on the pixel definition layer PDL. The second dummy pattern DMP2 may include a first portion A1 and a second portion A2. The second dummy pattern DMP2 may have an overhang structure in which the second portion A2 has a relatively large area than that of the first portion A1. Also, since the second portion A2 protrudes beyond first portion A1, the first portion A1 may have an undercut portion.

A control layer COL and a common electrode CE may be disposed on the second dummy pattern DMP2.

As the first portion A1 has an undercut portion, the control layer COL may not be formed on the side surface of the first portion A1 which is disposed under the second portion A2. Accordingly, the control layer COL may have disconnected portions (or open portions) disposed between the first sub-pixel SPX1 and the second sub-pixel SPX2. As the control layer COL is disconnected between the first sub-pixel SPX1 and the second sub-pixel SPX2, the leakage current through the control layer COL of each sub-pixel may be further reduced or further minimized from being transferred to the adjacent sub-pixel, thereby further improving the reliability of each sub-pixel.

The common electrode CE may be disposed on the control layer COL. The common electrode CE may be formed on the control layer COL and the pixel definition layer PDL exposed by the disconnected portions of the control layer COL.

An encapsulation layer TFE may be formed on the common electrode CE and the second dummy pattern DMP2.

Figure 19A:
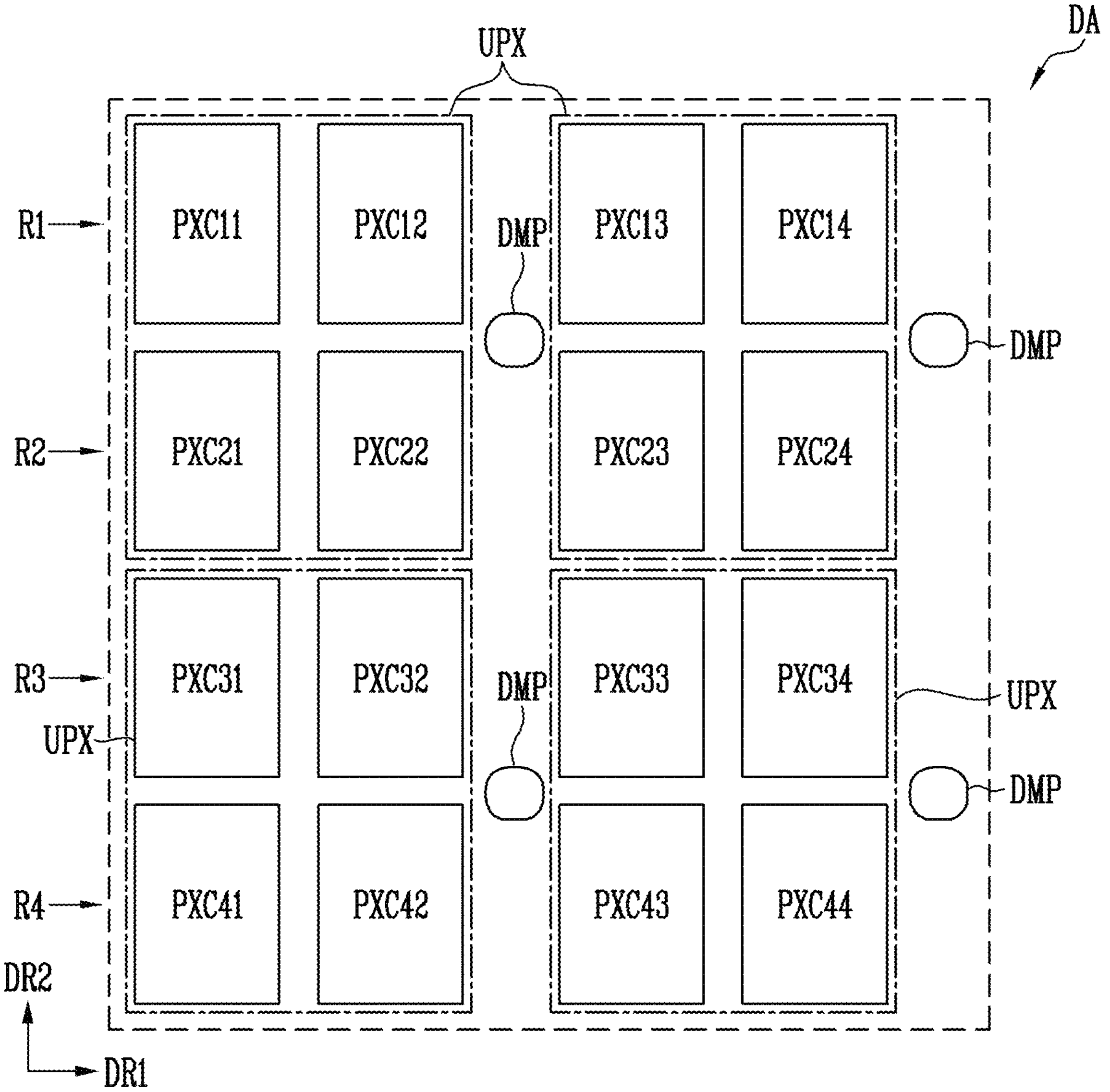
FIGS. 19A and 19B are schematic plan views illustrating one area of a display area included in the display device of FIG. 1.
Figure 19B:
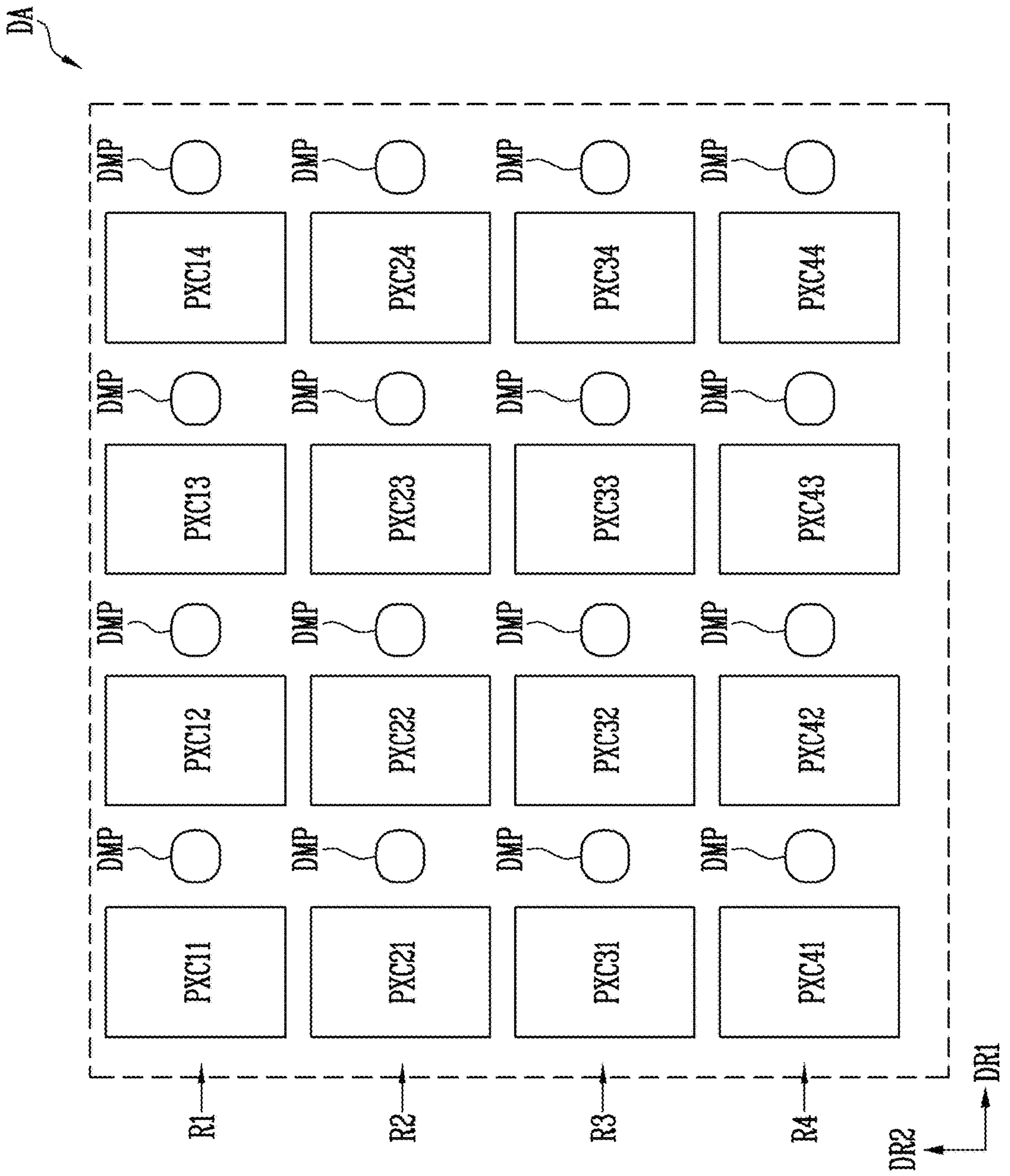
Figure 20:
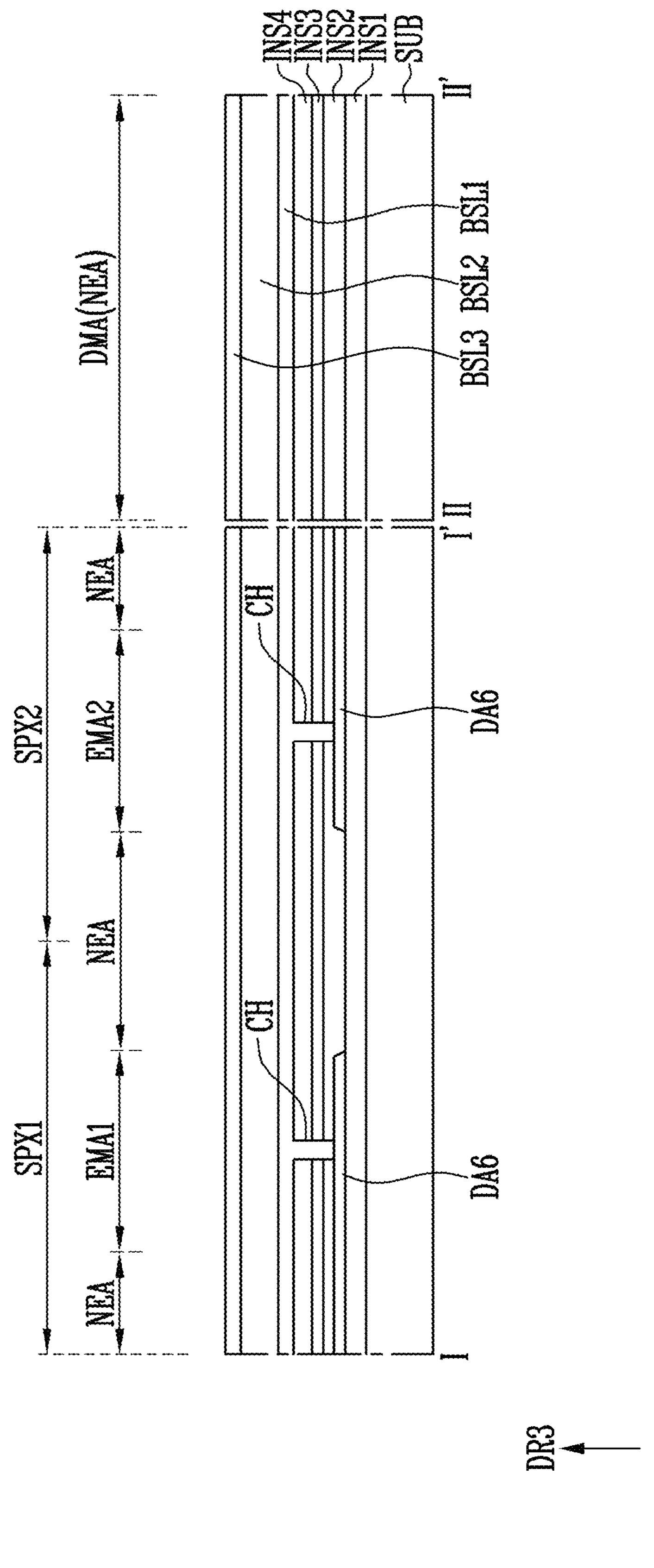
FIGS. 20, 21, 22, 23, 24, 25, 26, 27, 28, 29 and 30 are schematic cross-sectional views illustrating a method of forming first and second sub-pixels of FIG. 9 and a dummy pattern of FIG. 10.
Figure 21:
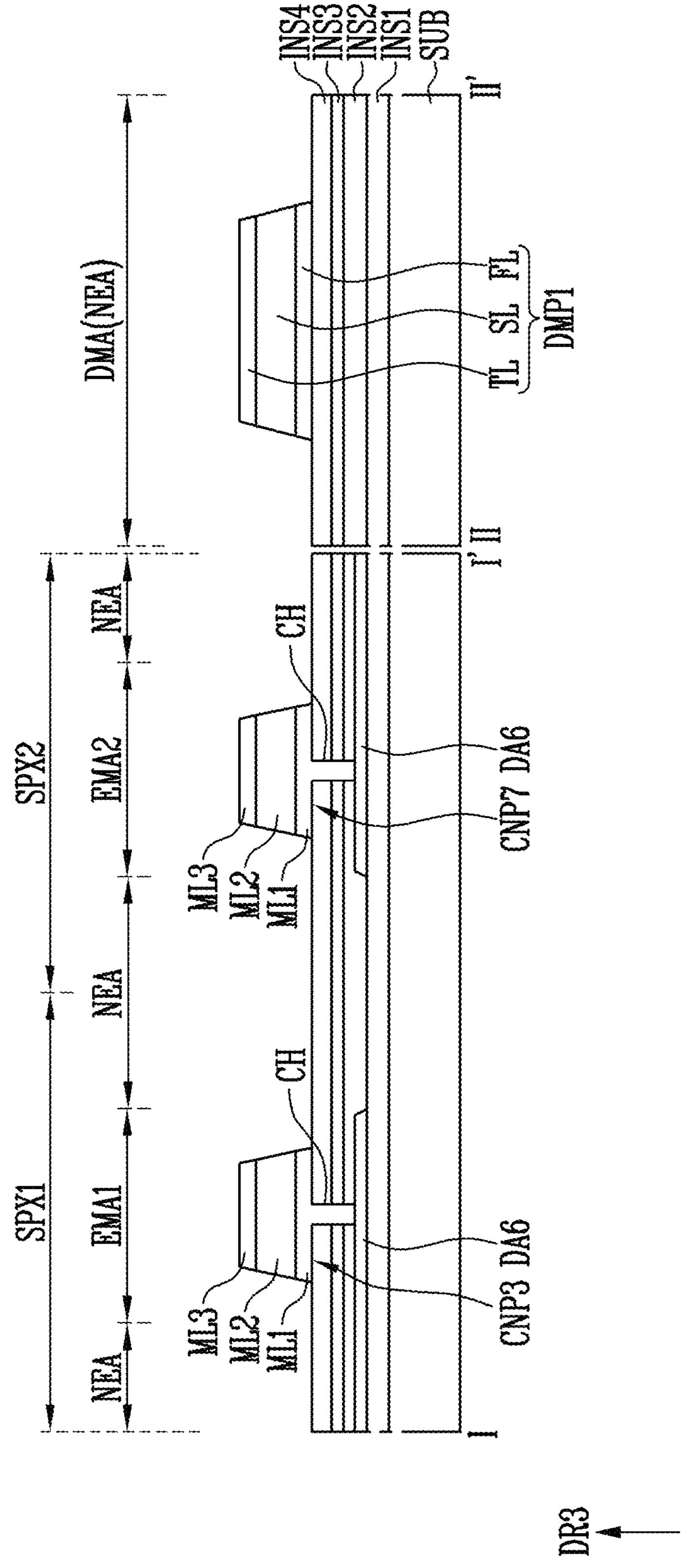
Figure 22:
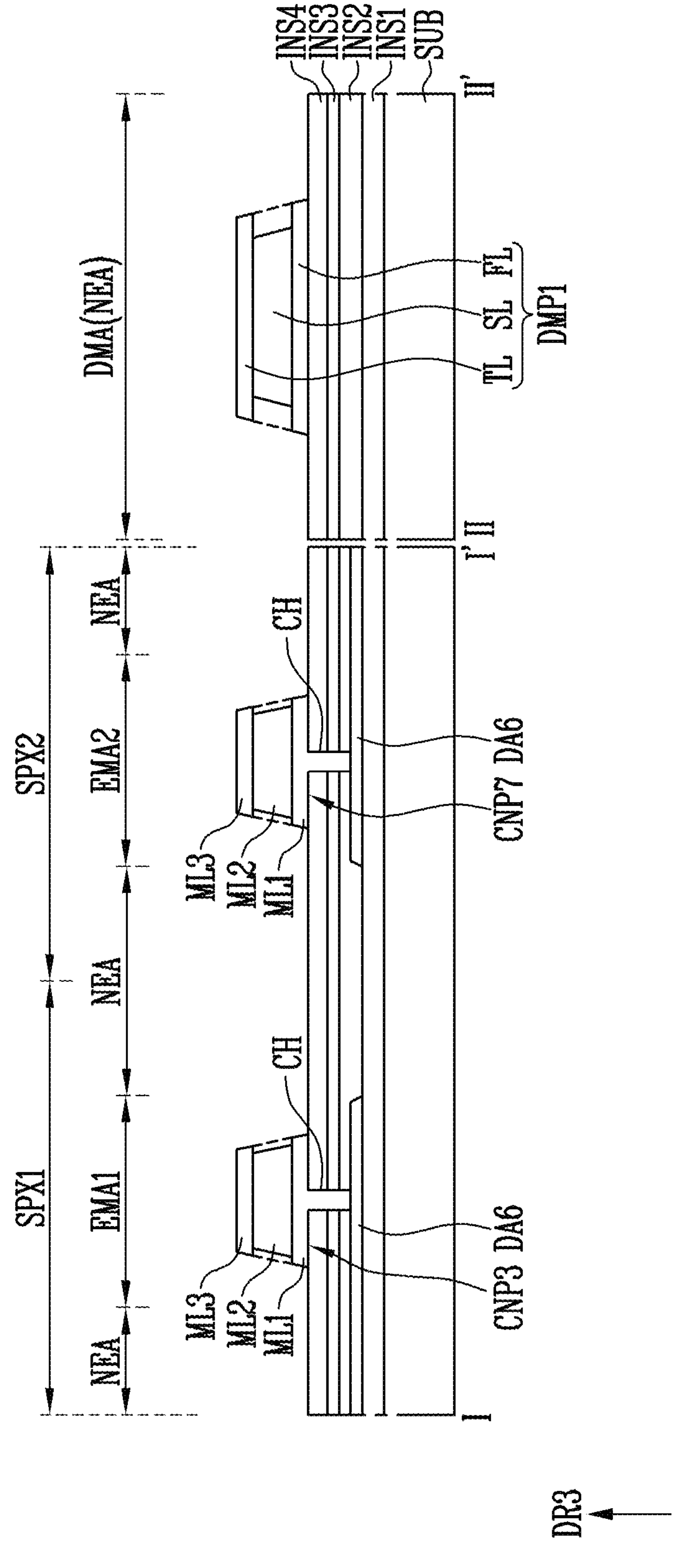
Figure 23:
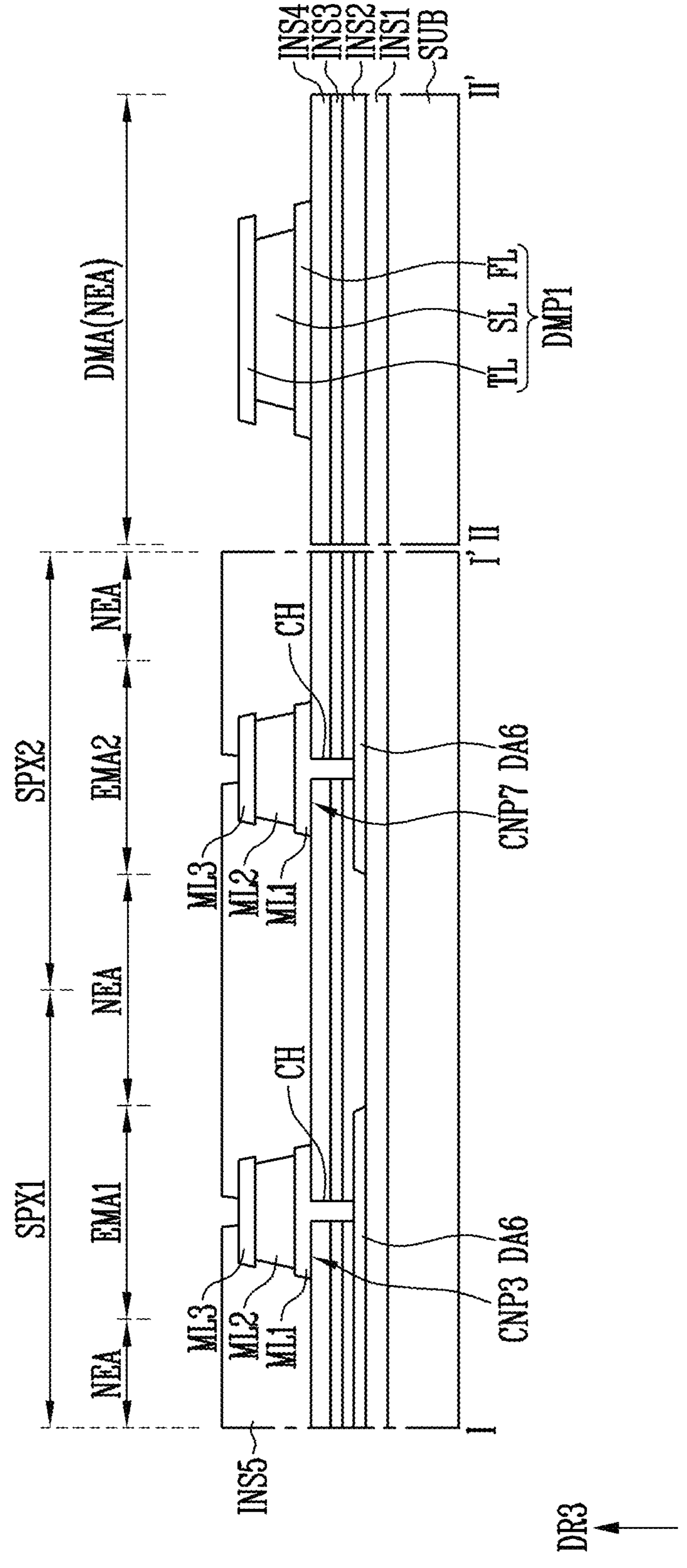
Figure 24:
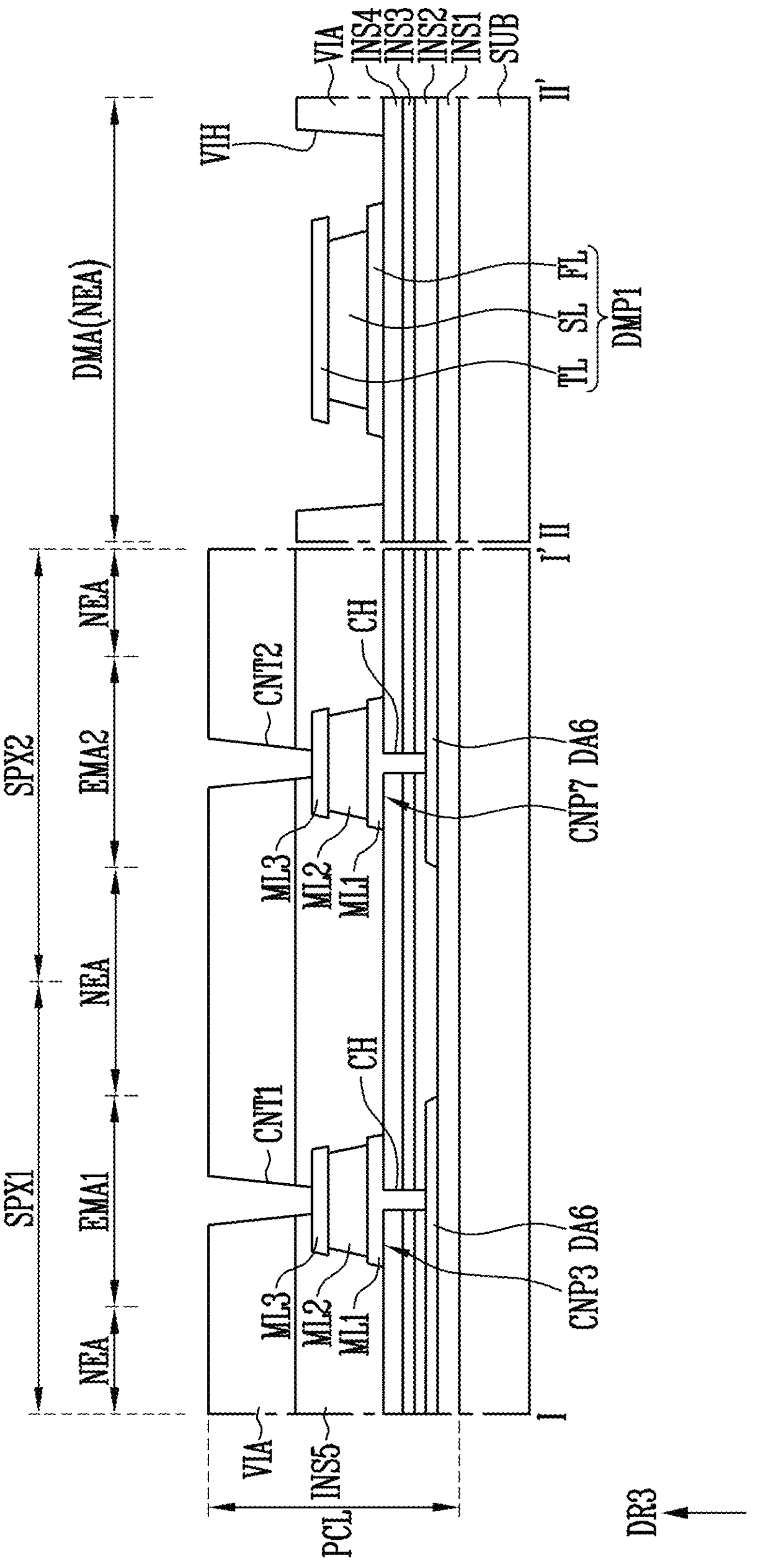
Figure 25:
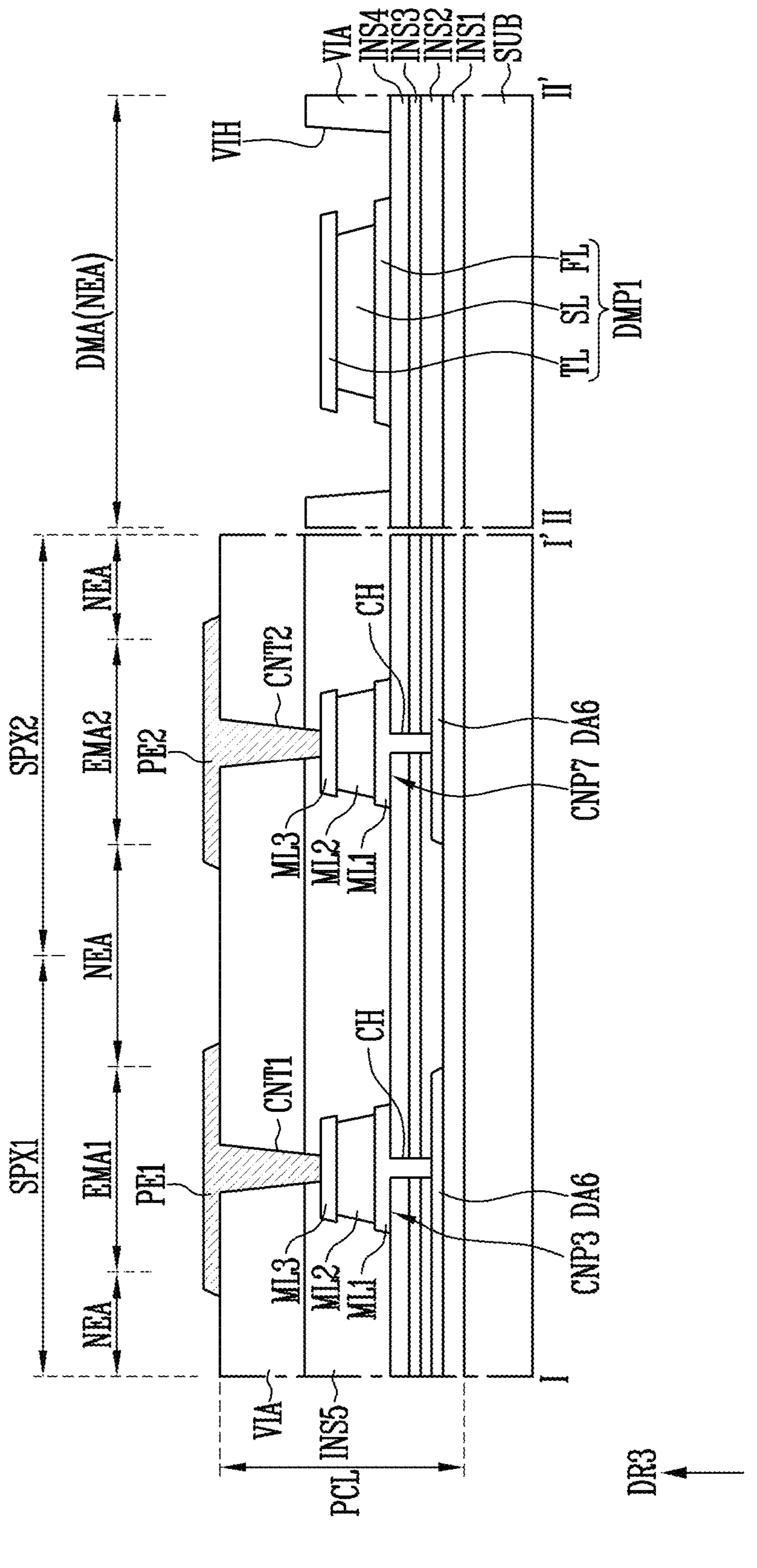
Figure 26:
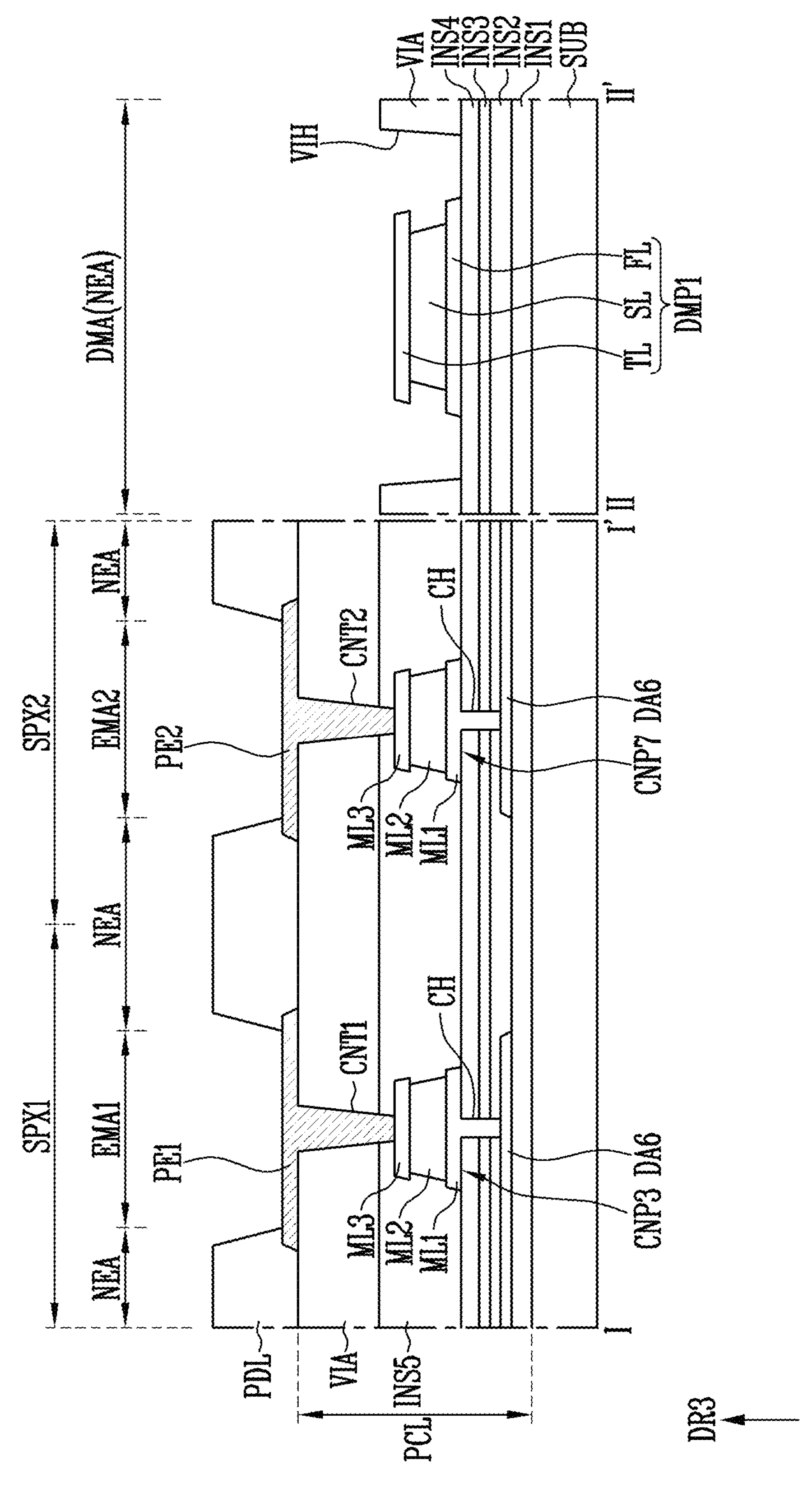
Figure 27:
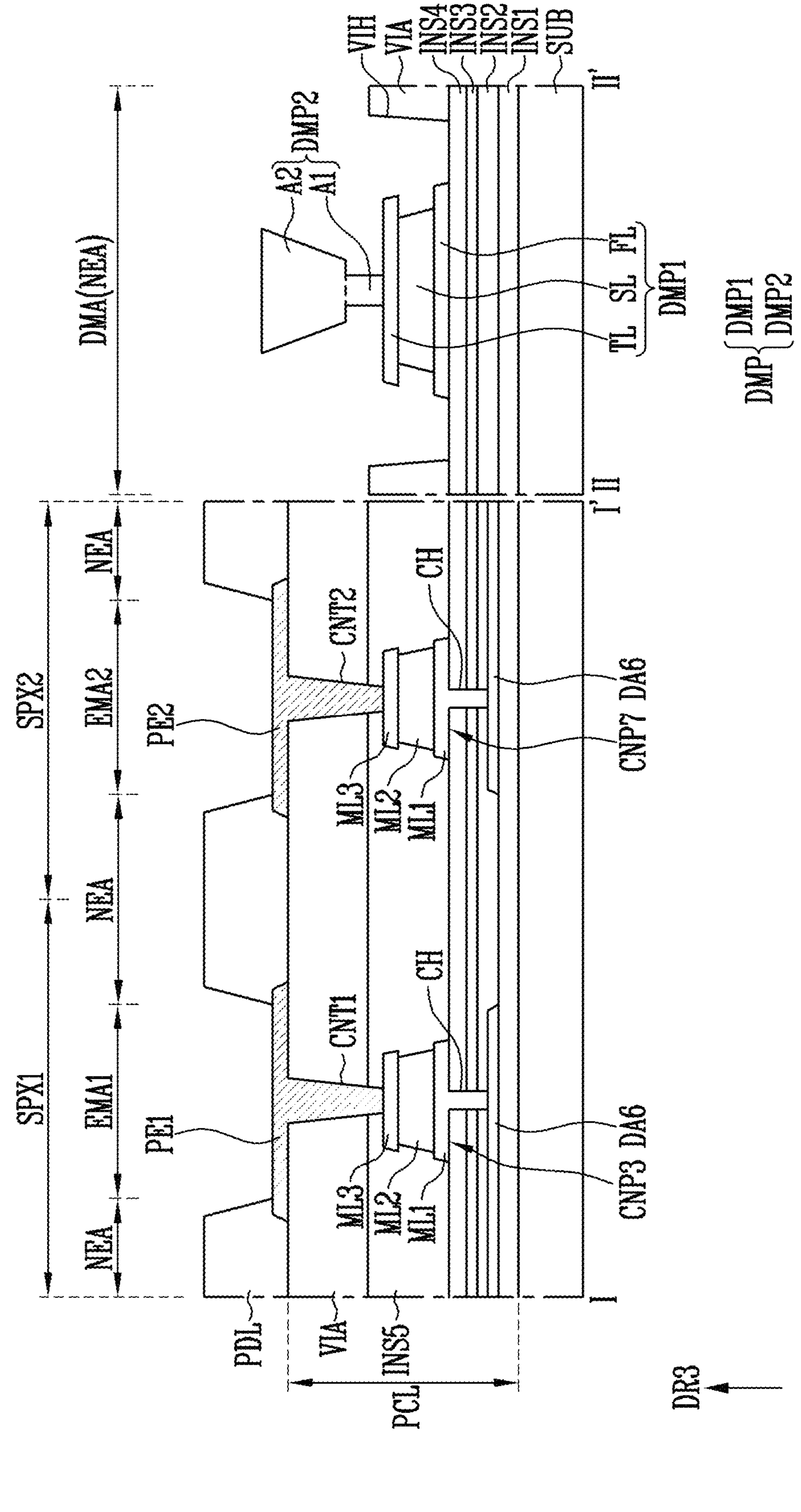
Figure 28:
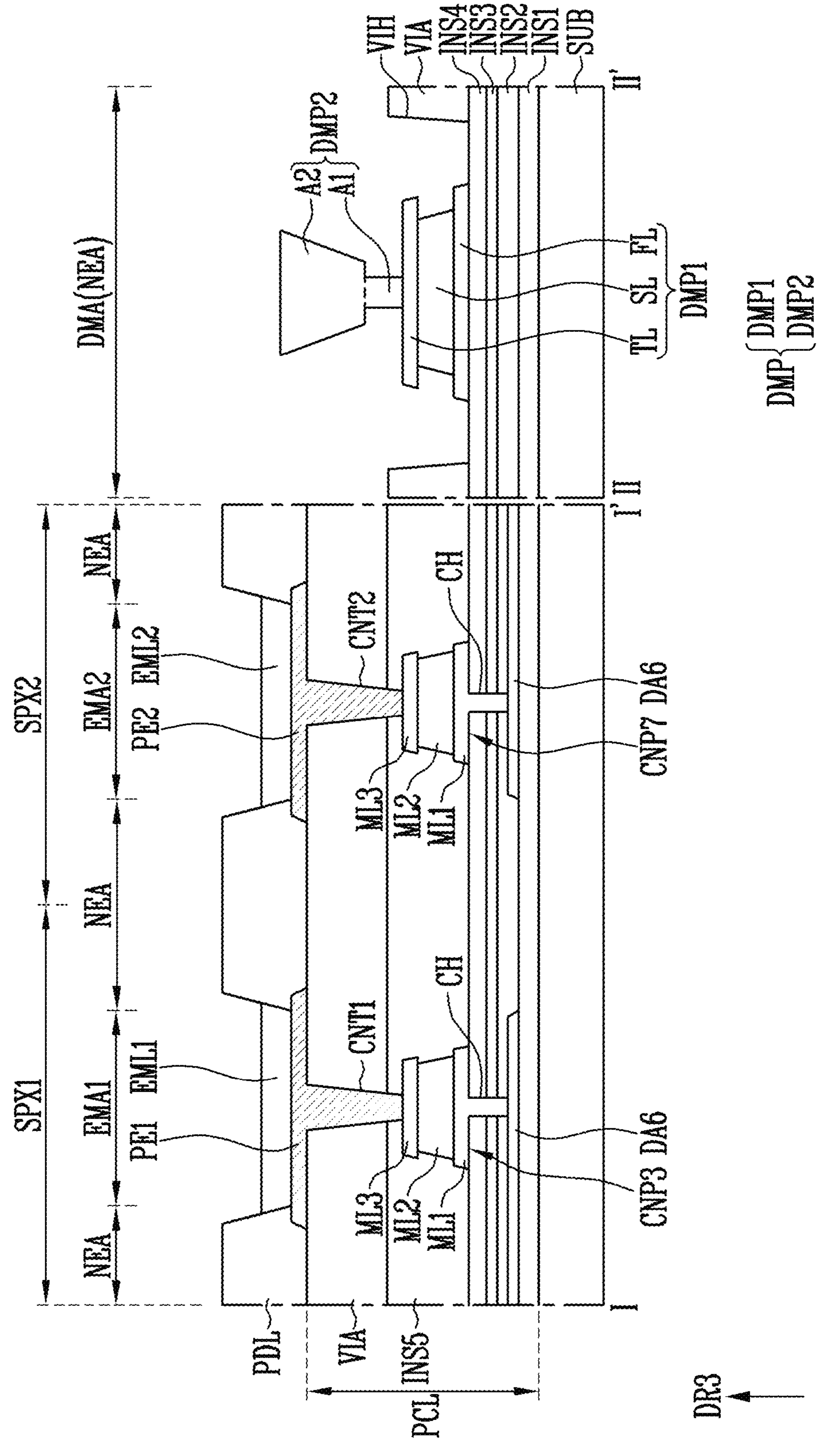
Figure 29:
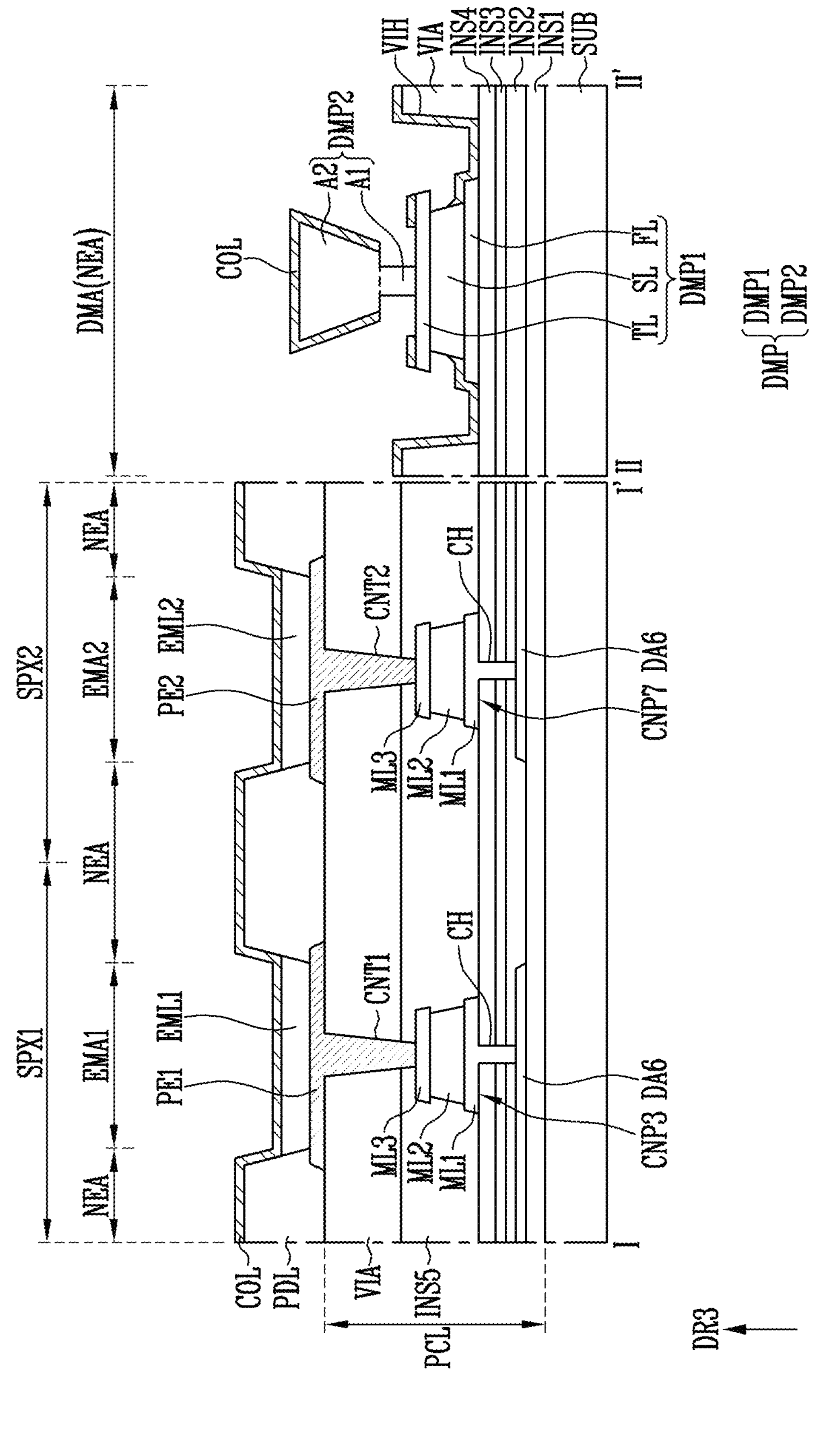
Figure 30:
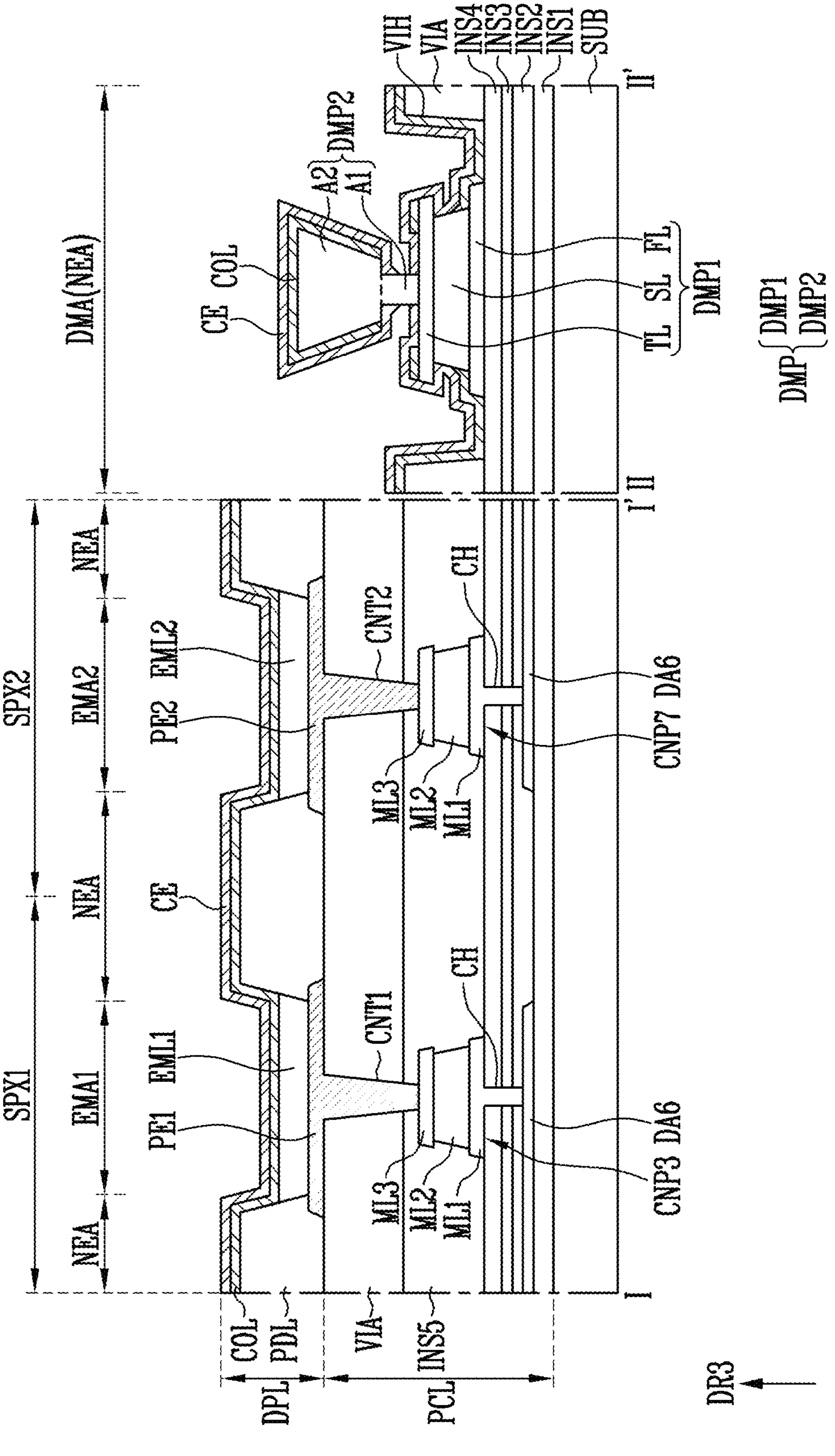

FIGS. 19A and 19B are schematic plan views illustrating one area of a display area DA included in the display device of FIG. 1. In particular, FIGS. 19A and 19B illustrate various embodiments of arrangement structures of pixel circuits and dummy patterns DMP.

Referring to FIGS. 1, 19A and 19B, a plurality of pixel circuits and a dummy pattern DMP may be disposed in the display area DA of the display device DD.

The display area DA may include pixel rows R1 to R4. Each of the pixel rows R1 to R4 may extend in the first direction DR1 and may be arranged in the second direction DR2. Each of the pixel rows R1 to R4 may include pixel circuits.

An eleventh pixel circuit PXC11, a twelfth pixel circuit PXC12, a thirteenth pixel circuit PXC13, and a fourteenth pixel circuit PXC14 may be disposed in the first pixel row R1 (or first horizontal line). The eleventh pixel circuit PXC11 may be a pixel circuit of the first sub-pixel disposed in the first pixel row R1, the twelfth pixel circuit PXC12 may be a pixel circuit of the second sub-pixel disposed in the first pixel row R1, the thirteenth pixel circuit PXC13 may be a pixel circuit of a third sub-pixel disposed in the first pixel row R1, and the fourteenth pixel circuit PXC14 may be a pixel circuit of the fourth sub-pixel disposed in the first pixel row R1.

A twenty-first pixel circuit PXC21, a twenty-second pixel circuit PXC22, a twenty-third pixel circuit PXC23, and a twenty-fourth pixel circuit PXC24 may be disposed in the second pixel row R2 (or second horizontal line). The twenty-first pixel circuit PXC21 may be a pixel circuit of the first sub-pixel disposed in the second pixel row R2, the twenty-second pixel circuit PXC22 may be a pixel circuit of the second sub-pixel disposed in the second pixel row R2, the twenty-third pixel circuit PXC23 may be a pixel circuit of the third sub-pixel disposed in the second pixel row R2, and the twenty-fourth pixel circuit PXC24 may be a pixel circuit of the fourth sub-pixel disposed in the second pixel row R2.

A thirty-first pixel circuit PXC31, a thirty-second pixel circuit PXC32, a thirty-third pixel circuit PXC33, and a thirty-fourth pixel circuit PXC34 may be disposed in the third pixel row R3 (or third horizontal line). The thirty-first pixel circuit PXC31 may be a pixel circuit of the first sub-pixel disposed in the third pixel row R3, the thirty-second pixel circuit PXC32 may be a pixel circuit of the second sub-pixel disposed in the third pixel row R3, a thirty-third pixel circuit PXC33 may be a pixel circuit of the third sub-pixel disposed in the third pixel row R3, and a thirty-fourth pixel circuit PXC34 may be a pixel circuit of the fourth sub-pixel disposed in the third pixel row R3.

A forty-first pixel circuit PXC41, a forty-second pixel circuit PXC42, a forty-third pixel circuit PXC43, and a forty-fourth pixel circuit PXC44 may be disposed in the fourth pixel row R4 (or fourth horizontal line). The forty-first pixel circuit PXC41 may be a pixel circuit of the first sub-pixel disposed in the fourth pixel row R4, the forty-second pixel circuit PXC42 may be a pixel circuit of the second sub-pixel disposed in the fourth pixel row R4, the forty-third pixel circuit PXC43 may be a pixel circuit of the third sub-pixel disposed in the fourth pixel row R4, and the forty-fourth pixel circuit PXC44 may be a pixel circuit of the fourth sub-pixel disposed in the fourth pixel row R4.

In the display area DA, the dummy pattern DMP may be disposed with a density different from that of the pixel circuits. For example, as shown in FIG. 19A, one dummy pattern DMP may be disposed per unit pixel block UPX. The unit pixel block UPX may be a virtual unit block having a predetermined area including two pixel circuits disposed adjacent to each other in the first direction DR1 and two pixel circuits disposed adjacent to the two pixel circuits in the second direction DR2 crossing the first direction DR1. The unit pixel block UPX may include, for example, the eleventh pixel circuit PXC11, the twelfth pixel circuit PXC12, the twenty-first pixel circuit PXC21, and the twenty-second pixel circuit PXC22. One dummy pattern DMP may be disposed per unit pixel block UPX including 2×2 pixel circuits, and may be disposed in a smaller number than the pixel circuits in the display area DA.

In the above-described embodiment, it has been described that the unit pixel block UPX includes 2×2 pixel circuits, but is not limited thereto. According to embodiments, the unit pixel block UPX may include 3×3 pixel circuits or 4×4 pixel circuits.

According to embodiments, the dummy pattern DMP may be disposed with the same density as the pixel circuits in the display area DA. For example, as shown in FIG. 19B, the number of dummy patterns DMP may be the same as the number of the pixel circuits. In this case, the dummy pattern DMP may be disposed to form a one-to-one correspondence with the pixel circuits.

The arrangement structure of the pixel circuits and the dummy pattern DMP is not limited to the above-described embodiment. That is, the density, number, and size of the pixel circuits and dummy patterns DMP in the display area DA may be variously modified within a range consistent with the concept of the present embodiment.

Hereinafter, a manufacturing method of a display device according to an embodiment will be described with reference to FIGS. 20 to 30.

FIGS. 20 to 30 are schematic cross-sectional views illustrating a method of forming the first and second sub-pixels SPX1 and SPX2 of FIG. 9 and the dummy pattern DMP of FIG. 10.

In embodiments of FIGS. 20 to 30, manufacturing steps of the display device are described as sequentially performed according to cross-sectional views, but unless the scope of the present inventive concept is changed, it is obvious that some steps shown as being sequentially performed may be simultaneously performed, the order of the steps may be changed, some steps may be omitted, or other steps may be further included between each step.

In FIGS. 20 to 30, in order to avoid redundant descriptions, different points from the above-described embodiment will be mainly described.

Referring to FIGS. 1 to 10 and 20, a first base conductive layer BSL1, a second base conductive layer BSL2, and a third base conductive layer BSL3 may be formed on a substrate (or fourth insulating layer INS4) of the display area DA.

The first base conductive layer BSL1 may correspond to a base material of the first metal layer ML1 and the first layer FL, and may include a conductive material. For example, the first base conductive layer BSL1 may include titanium.

The first base conductive layer BSL1 may be formed on the fourth insulating layer INS4 and may be connected to the sixth drain region DA6 of the sixth transistor T6 of each of the first and second pixel circuits PXC1 and PXC2 through the contact hole CH formed through the fourth insulating layer INS4 and the third insulating layer INS3 and the second insulating layers INS2 disposed thereunder.

The second base conductive layer BSL2 may be formed on the first base conductive layer BSL1. The second base conductive layer BSL2 may correspond to base materials of the second metal layer ML2 and the second layer SL, and may include a conductive material. For example, the second base conductive layer BSL2 may include aluminum.

The third base conductive layer BSL3 may be formed on the second base conductive layer BSL2. The third base conductive layer BSL3 may correspond to base materials of the third metal layer ML3 and the third layer TL, and may include a conductive material. For example, the third base conductive layer BSL3 may include titanium.

The first, second, and third base conductive layers BSL1, BSL2, and BSL3 may be sequentially formed in the same chamber without vacuum break.

Referring to FIGS. 1 to 10, 20, and 21, the third connection pattern CNP3, a seventh connection pattern CNP7, and the first dummy pattern DMP1 may be formed by performing a photolithography process using a mask to collectively pattern the first, second, and third base conductive layers BSL1, BSL2, and BSL3.

Each of the third and seventh connection patterns CNP3 and CNP7 may include a first metal layer ML1, a second metal layer ML2, and a third metal layer ML3 sequentially stacked in the third direction DR3. The third connection pattern CNP3 may be disposed in an area where the first pixel circuit PXC1 of the first sub-pixel SPX1 is disposed, and the seventh connection pattern CNP7 may be disposed in an area where the second pixel circuit PXC2 of the second sub-pixel SPX2 is disposed.

The first dummy pattern DMP1 may include a first layer FL, a second layer SL, and a third layer TL sequentially stacked in the third direction DR3. The first dummy pattern DMP1 may be disposed in the dummy area DMA.

The first metal layer ML1 and the first layer FL may be formed through the same process, may include the same material, and may be provided on the same layer. The second metal layer ML2 and the second layer SL may be formed through the same process, may include the same material, and may be provided on the same layer. The third metal layer ML3 and the third layer TL may be formed through the same process, may include the same material, and may be provided on the same layer.

Referring to FIGS. 1 to 10 and 20 to 22, a wet etching process may be performed to selectively etch the second metal layer ML2 and the second layer SL.

Due to the wet etching process described above, the side surface of the second metal layer ML2 may be recessed from each of side surfaces of the first and third metal layers ML1 and ML3. Accordingly, the second metal layer ML2 may have an undercut portion disposed under the third layer TL and recessed from the each of side surfaces of the first and third metal layers ML1 and ML3.

In the above-described embodiment, it has been described that selective etching of the second metal layer ML2 is performed together with the second layer SL, but is not limited thereto. According to embodiments, the second metal layer ML2 may be covered by a separate mask (e.g., etching mask), thus only the second layer SL may be etched during the wet etching process.

Referring to FIGS. 1 to 10 and 20 to 23, the fifth insulating layer INS5 may be formed on the third and seventh connection patterns CNP3 and CNP7. The fifth insulating layer INS5 may expose the first dummy pattern DMP1 without being formed on the first dummy pattern DMP1 by removing a portion thereof in the dummy area DMA. In other words, the fifth insulating layer INS5 may not be formed on the first dummy pattern DMP1.

The fifth insulating layer INS5 may expose a portion of each of the third and seventh connection patterns CNP3 and CNP7 by removing a portion thereof on the third and seventh connection patterns CNP3 and CNP7.

Referring to FIGS. 1 to 10 and 20 to 24, a via layer VIA is formed on the fifth insulating layer INS5.

The via layer VIA may include a first contact portion CNT1 exposing a portion of the third connection pattern CNP3 and a second contact portion CNT2 exposing a portion of the seventh connection pattern CNP7.

The via layer VIA may include a via hole VIH exposing the first dummy pattern DMP1 in the dummy area DMA. In the dummy area DMA, the via layer VIA may be formed directly on the fourth insulating layer INS4, but is not limited thereto. For example, in case that the fifth insulating layer INS5 is disposed in the dummy area DMA in the form that includes an opening completely exposing the first dummy pattern DMP1, the via layer VIA may be formed on the fifth insulating layer INS5.

Referring to FIGS. 1 to 10 and 20 to 25, a first pixel electrode PE1 and a second pixel electrode PE2 may be formed on the via layer VIA. The first pixel electrode PE1 may be electrically connected to the third connection pattern CNP3 through the first contact portion CNT1, and the second pixel electrode PE2 may be electrically connected to the seventh the connection pattern CNP7 through the second contact portion CNT2.

According to an embodiment, as described with reference to FIG. 17, a conductive pattern CP may be formed on the first dummy pattern DMP1. In this case, the conductive pattern CP may be formed through the same process as the first and second pixel electrodes PE1 and PE2 and may include the same material.

Referring to FIGS. 1 to 10 and 20 to 26, a pixel definition layer PDL may be formed on the first and second pixel electrodes PE1 and PE2. The pixel definition layer PDL may include an opening exposing a region of each of the first and second pixel electrodes PE1 and PE2.

The pixel definition layer PDL may expose the first dummy pattern DMP1 without being formed on the first dummy pattern DMP1 by removing a portion thereof in the dummy area DMA. In other words, the pixel definition layer PDL may not be formed on the first dummy pattern DMP1.

Referring to FIGS. 1 to 10 and 20 to 27, after coating an organic material layer on the first dummy pattern DMP1, a photolithography process is performed using a mask to form a second dummy pattern DMP2.

The second dummy pattern DMP2 may be formed on the first dummy pattern DMP1 in the dummy area DMA. The second dummy pattern DMP2 may be made of, for example, a negative photosensitive material. Due to material characteristics of the second dummy pattern DMP2 and material characteristics of the first dummy pattern DMP1 (or third layer TL), an adhesion between the first dummy pattern DMP1 and the second dummy pattern DMP2) may be weakened, so that the second dummy pattern DMP2 may have a reverse tapered shape (or overhang structure).

The second dummy pattern DMP2 may include a first portion A1 and a second portion A2. The second portion A2 may have a relatively larger area (or size) than that of the first portion A1.

The first dummy pattern DMP1 and the second dummy pattern DMP2 may constitute the dummy pattern DMP.

Referring to FIGS. 1 to 10 and 20 to 28, a first light emitting layer EML1 may be formed on the first pixel electrode PE1 exposed by the opening of the pixel definition layer PDL, and a second light emitting layer EML2 may be formed on the second pixel electrode PE2 exposed by another opening of the pixel definition layer PDL.

Referring to FIGS. 1 to 10 and 20 to 29, a control layer COL may be formed on the first light emitting layer EML1, the second light emitting layer EML2, and the dummy pattern DMP.

The control layer COL may be provided in common to the first and second sub-pixels SPX1 and SPX2. The control layer COL may be disposed in the dummy area DMA and may be formed on the dummy pattern DMP. In this case, in the dummy area DMA, the control layer COL may have disconnected portions in areas corresponding to the undercut portions formed in the first dummy pattern DMP1 and the second dummy patter DMP2. The control layer COL may be formed on the upper surface S3 and the third and fourth side surfaces S4 and S5 of the second portion A2 of the second dummy pattern DMP2 and may not be formed in the first portion A1 covered by the second portion A2. In addition, the control layer COL may be formed only on a portion of each of the third layer TL, the second layer SL, and the first layer FL of the first dummy pattern DMP1.

Referring to FIGS. 1 to 10 and 20 to 30, a common electrode CE may be formed on the control layer COL.

The common electrode CE may be provided in common to the first and second sub-pixels SPX1 and SPX2. The common electrode CE may be disposed in the dummy area DMA and may be formed on the control layer COL and the first dummy pattern DMP1 exposed by the disconnection portions of the control layer COL. In this case, a contact area between the first dummy pattern DMP1 and the common electrode CE may increase, thereby improving the contact resistance of the common electrode CE.

An encapsulation layer TFE may be formed on the common electrode CE.

While the present inventive concept has been shown and described with reference to certain embodiments thereof, it will be understood by those skilled in the art that various changes in forms and details may be made therein without departing from the scope of the present inventive concept as defined by the appended claims and their equivalents.

Accordingly, the technical scope of the present disclosure may be determined by on the technical scope of the accompanying claims.

What is claimed is:

1. A display device comprising:

a connection pattern and a dummy pattern spaced apart from each other on the substrate;

a via layer disposed on the substrate and including a contact portion exposing the connection pattern and a via hole exposing the dummy pattern;

a pixel electrode disposed on the via layer and electrically connected to the connection pattern through the contact portion;

a light emitting layer disposed on the pixel electrode;

a control layer disposed on the light emitting layer; and a common electrode disposed on the control layer, wherein the dummy pattern includes a first dummy pattern and a second dummy pattern disposed on the first dummy pattern, the first dummy pattern includes a first layer, a second layer, and a third layer each of which is made of a conductive material and is sequentially stacked, and the second dummy pattern includes an organic pattern including a first portion and a second portion having different areas in a plan view.

2. The display device of claim 1, wherein the second dummy pattern includes a negative photosensitive material and the control layer is disconnected on the first portion.

3. The display device of claim 2, wherein the first portion is disposed on the first dummy pattern, the second portion is disposed on the first portion, the first portion has a smaller area than that of the second portion, and the second portion has a reverse tapered shape in which a width become narrower from an upper surface toward a lower surface.

4. The display device of claim 3, wherein an inclination angle of a side surface connected to the lower surface in the second portion is from 90° to 130° and a side surface of the first portion is disposed inside a side surface of the second portion in a plan view.

5. The display device of claim 4, wherein the first portion has an undercut portion which is recessed from the side surface of the second portion.

6. The display device of claim 1, wherein the first layer and the third layer include titanium (Ti) and the second layer includes aluminum (Al) having a greater thickness than the first and third layers.

7. The display device of claim 6, wherein the control layer is disposed on each of an upper surface of the second portion, the side surface of the second portion, a portion of an upper surface of the third layer, a portion of a side surface of the second layer, and a side surface of the first layer, and wherein the common electrode is disposed on each of the control layer, the side surface of the first portion, the upper surface and side surface of the third layer, and the side surface of the second layer.

8. The display device of claim 7, wherein the common electrode is disconnected on the side surface of the first portion.

9. The display device of claim 8, wherein the common electrode disposed on the second dummy pattern and the common electrode disposed on the first dummy pattern are disconnected from each other.

10. The display device of claim 7, wherein the common electrode disposed on the second dummy pattern and the common electrode disposed on the first dummy pattern are connected to each other.

11. The display device of claim 10, wherein the common electrode fills an undercut portion surrounded by a lower surface of the second portion, the side surface of the first portion, and the upper surface of the third layer.

12. The display device of claim 10, wherein the third layer includes an opening exposing a portion of the second layer and the common electrode is disposed on the second layer exposed by the opening.

13. The display device of claim 7, wherein the third layer includes a protrusion protruding in a direction toward the second dummy pattern.

14. The display device of claim 7, further comprising a conductive pattern disposed on the first dummy pattern and the second dummy pattern, and the conductive pattern includes the same material as the pixel electrode.

15. The display device of claim 7, wherein the second dummy pattern includes a plurality of second dummy patterns which are disposed on the first dummy pattern.

16. The display device of claim 1, wherein the connection pattern includes a first metal layer, a second metal layer disposed on the first metal layer, and a third metal layer disposed on the second metal layer, and wherein the first metal layer includes the same material as the first layer and is disposed on the same layer as the first layer, the second metal layer includes the same material as the second layer and is disposed on the same layer as the second layer, and the third metal layer includes the same material as the third layer and is disposed on the same layer as the third layer.

17. The display device of claim 1, further comprising at least one transistor disposed between the substrate and the connection pattern and electrically connected to the pixel electrode through the connection pattern.

18. The display device of claim 1, wherein the first dummy pattern is electrically connected to the common electrode to receive a low potential voltage.

19. The display device of claim 1, further comprising a pixel definition layer exposing one region of the pixel electrode and a third dummy pattern disposed on the pixel definition layer.

20. A manufacturing method of a display device comprising:

forming a connection pattern and a dummy pattern spaced apart from each other on a substrate;

forming a via layer including a contact portion exposing the connection pattern and a via hole exposing the dummy pattern, the via layer being disposed on the connection pattern;

forming a pixel electrode electrically connected to the connection pattern through the contact portion on the via layer;

forming a light emitting layer on the pixel electrode;

forming a control layer on the light emitting layer; and forming a common electrode on the control layer, wherein the dummy pattern includes a first dummy pattern and a second dummy pattern disposed on the first dummy pattern, the first dummy pattern includes a first layer, a second layer, and a third layer each of which is made of a conductive material and is sequentially stacked, and the second dummy pattern includes an organic pattern including a first portion and a second portion having different areas in a plan view.

* * * * *